United States Patent
Moon et al.

(10) Patent No.: US 10,950,583 B2
(45) Date of Patent: Mar. 16, 2021

(54) TRANSFER HEAD AND TRANSFER SYSTEM FOR SEMICONDUCTOR LIGHT-EMITTING DEVICE AND METHOD FOR TRANSFERRING SEMICONDUCTOR LIGHT-EMITTING DEVICE

(71) Applicant: LG ELECTRONICS INC., Seoul (KR)

(72) Inventors: Sunghyun Moon, Seoul (KR); Younghak Chang, Seoul (KR); Jina Jeon, Seoul (KR); Seonhoo Kim, Seoul (KR); Youngjoo Yee, Seoul (KR); Hwankuk Yuh, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 538 days.

(21) Appl. No.: 15/754,900

(22) PCT Filed: Aug. 26, 2016

(86) PCT No.: PCT/KR2016/009547
§ 371 (c)(1),
(2) Date: Feb. 23, 2018

(87) PCT Pub. No.: WO2017/034379
PCT Pub. Date: Mar. 2, 2017

(65) Prior Publication Data
US 2018/0277524 A1  Sep. 27, 2018

(30) Foreign Application Priority Data

Aug. 26, 2015  (KR) .................. 10-2015-0120497
Aug. 26, 2016  (KR) .................. 10-2016-0109161
Aug. 26, 2016  (KR) .................. 10-2016-0109164

(51) Int. Cl.
*H01L 25/075* (2006.01)
*H01L 21/677* (2006.01)
(Continued)

(52) U.S. Cl.
CPC ........ *H01L 25/0753* (2013.01); *H01L 21/677* (2013.01); *H01L 21/6835* (2013.01);
(Continued)

(58) Field of Classification Search
CPC .............. H01L 25/0753; H01L 21/677; H01L 21/6835; H01L 33/22; H01L 2221/68354;
(Continued)

(56) References Cited

U.S. PATENT DOCUMENTS

2015/0228525 A1* 8/2015 Golda ................. H01L 29/0619
361/234
2016/0300745 A1* 10/2016 Chang ................. H01L 21/6833

FOREIGN PATENT DOCUMENTS

JP  2011-102004 A  5/2011
JP  2011-155135 A  8/2011
(Continued)

OTHER PUBLICATIONS fKR-10-2014-0109890; entire specification, drawings (Year: 2014).*
(Continued)

*Primary Examiner* — Dharti H Patel
(74) *Attorney, Agent, or Firm* — Birch, Stewart, Kolasch & Birch, LLP

(57) ABSTRACT

The present invention relates to a display device and, more particularly, to a transfer head for a semiconductor light-emitting device applied to the display device and a method for transferring a semiconductor light-emitting device. The transfer head for a semiconductor light-emitting device, according to the present invention, comprises: a base substrate; and an electrode unit disposed on the base substrate (Continued)

to generate an electrostatic force by charging an un-doped semiconductor layer of the semiconductor light-emitting device with electric charges, wherein the base substrate and the electrode unit are formed of light-transmitting materials so that at least a part of the semiconductor light-emitting device is viewable through the base substrate and the electrode unit in sequence.

21 Claims, 52 Drawing Sheets

(51) Int. Cl.
   *H01L 21/683* (2006.01)
   *H01L 33/22* (2010.01)
   *H01L 33/00* (2010.01)
   *H01L 33/62* (2010.01)

(52) U.S. Cl.
   CPC .......... *H01L 33/22* (2013.01); *H01L 33/0095* (2013.01); *H01L 33/62* (2013.01); *H01L 2221/68354* (2013.01); *H01L 2933/0033* (2013.01); *H01L 2933/0066* (2013.01)

(58) Field of Classification Search
   CPC ................. H01L 33/0095; H01L 33/62; H01L 2933/0033; H01L 2933/0066
   USPC .......................................................... 361/234
   See application file for complete search history.

(56) References Cited

FOREIGN PATENT DOCUMENTS

| KR | 10-2014-0103278 A | 8/2014 |
| KR | 10-2014-0103279 A | 8/2014 |
| KR | 10-2014-0109890 A | 9/2014 |
| KR | 10-2014-0008149 A | 1/2015 |
| KR | 10-2015-0013603 A | 2/2015 |
| KR | 10-2015-0013647 A | 2/2015 |
| KR | 10-1614370 B1 | 4/2016 |
| KR | 10-2016-0127858 A | 11/2016 |

OTHER PUBLICATIONS

KR-10-2015-0008149, entire specification, drawings (Year: 2015).*
KR-10-2015-0013647, entire specification, drawings. (Year: 2015).*

* cited by examiner

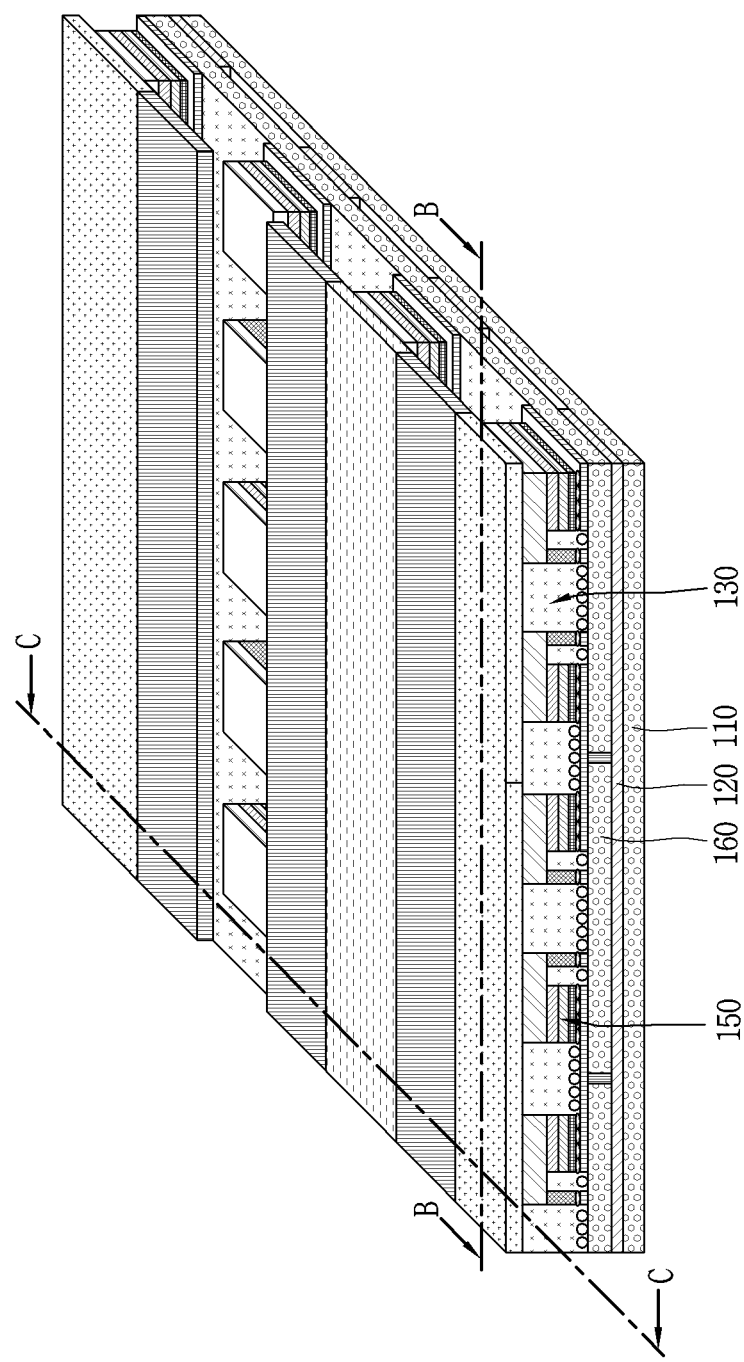

FIG. 26
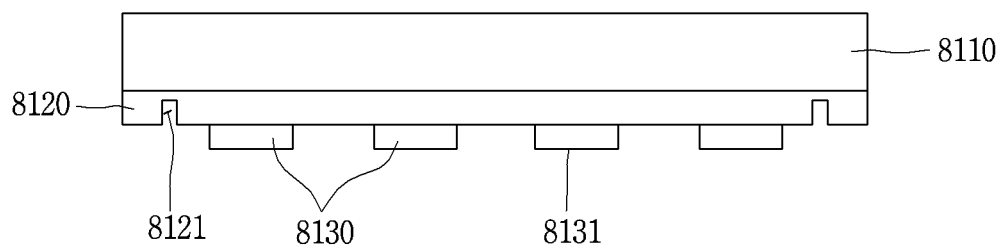
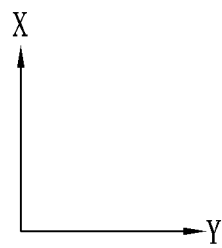

FIG. 28A
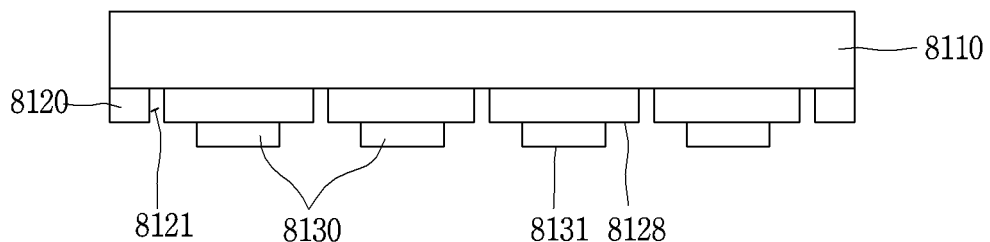
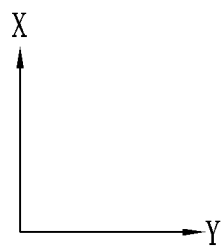

FIG. 28B
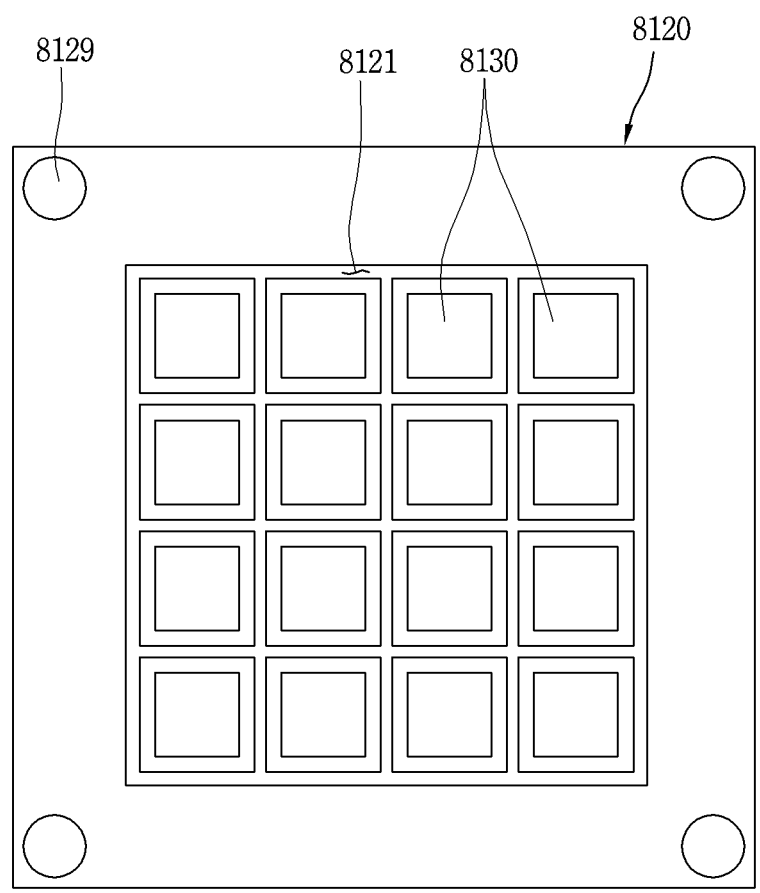
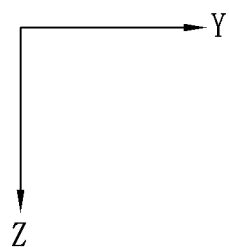

FIG. 29
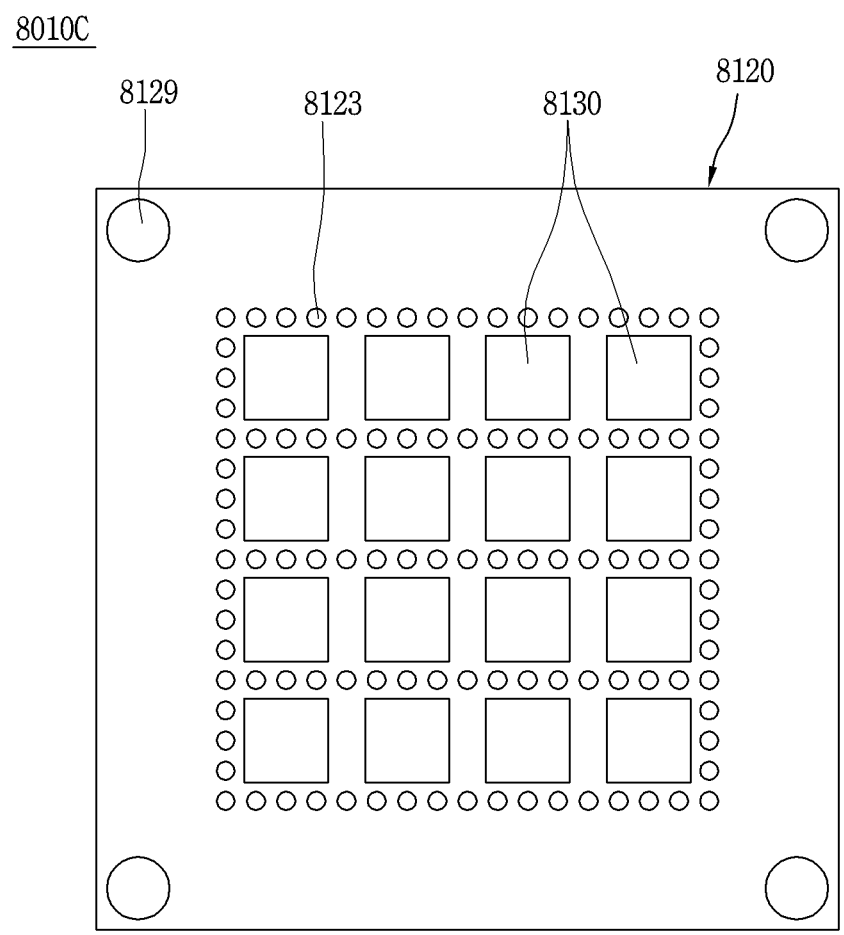
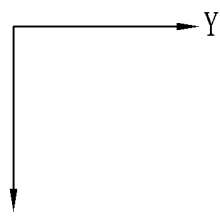

FIG. 32A
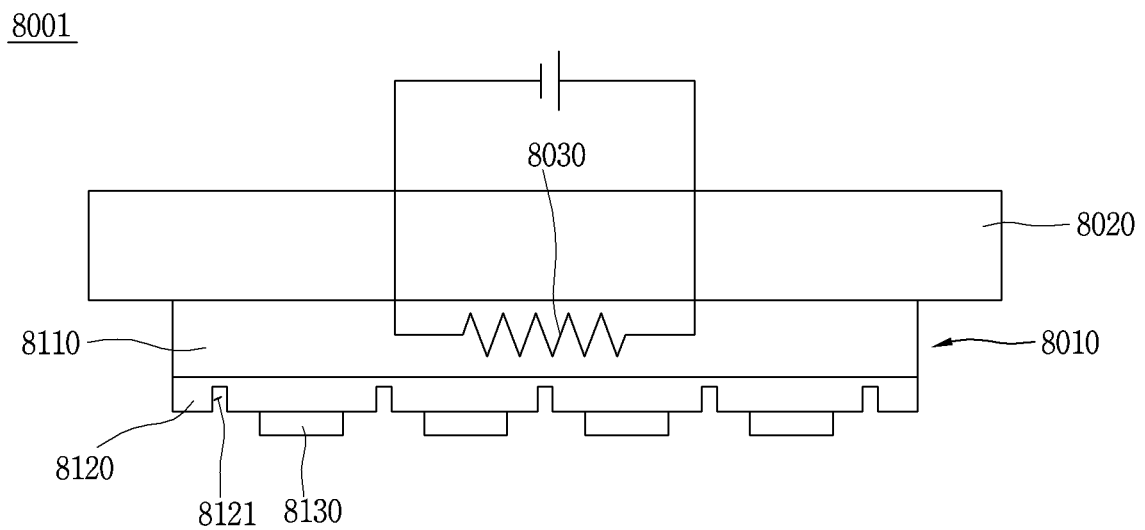
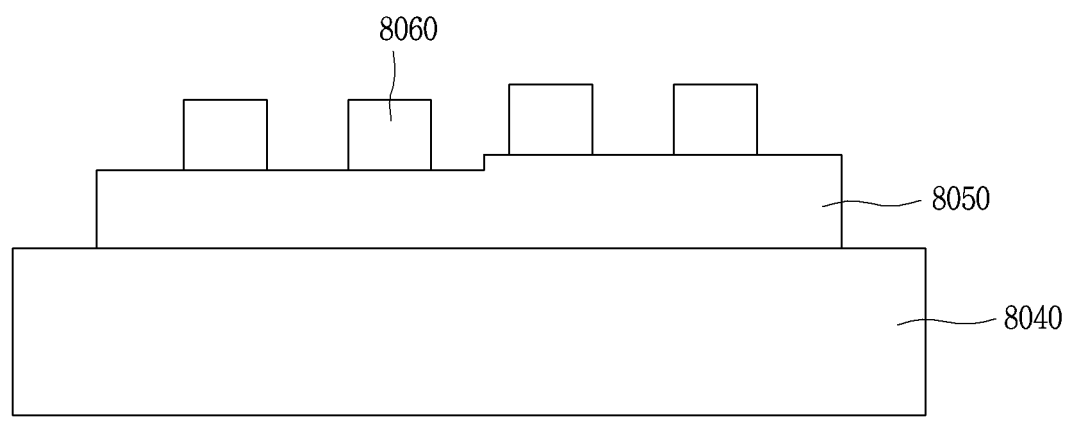

FIG. 32D
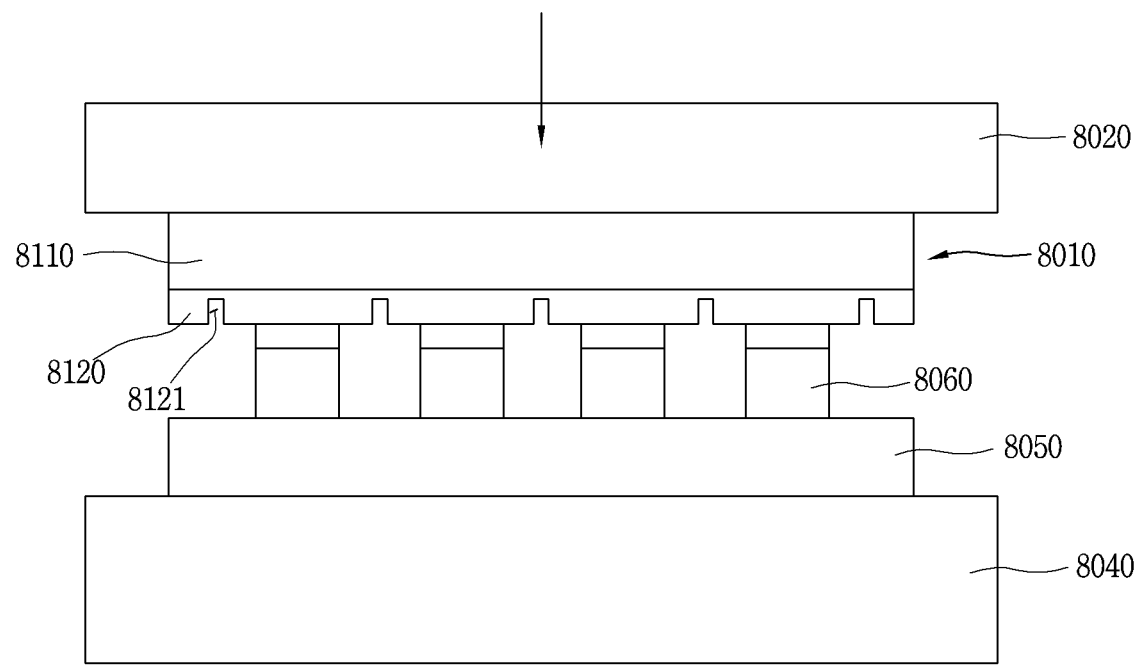
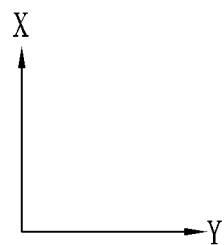

FIG. 33
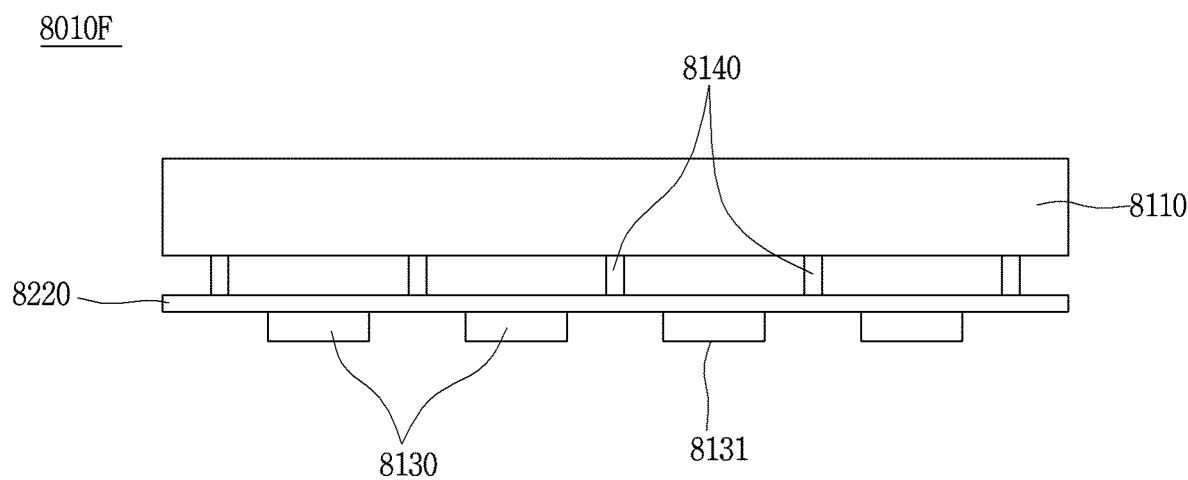
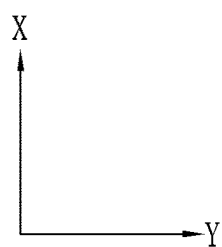

FIG. 35
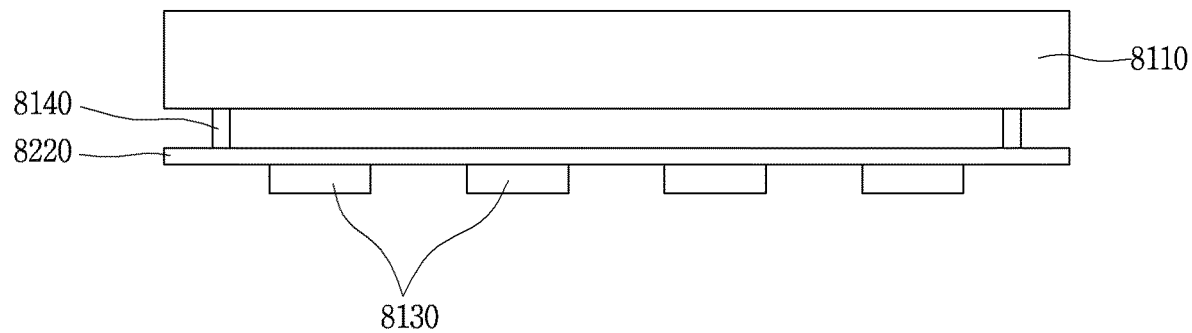
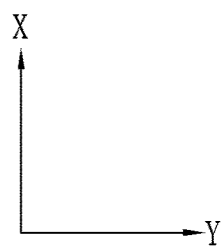

TRANSFER HEAD AND TRANSFER SYSTEM FOR SEMICONDUCTOR LIGHT-EMITTING DEVICE AND METHOD FOR TRANSFERRING SEMICONDUCTOR LIGHT-EMITTING DEVICE

CROSS REFERENCE TO RELATED APPLICATIONS

This application is the National Phase of PCT international Application No. PCT/KR2016/009547 filed on Aug. 26, 2016, which claims priority under 35 U.S.C. 119(a) to Patent Application Nos. 10-2015-0120497, filed in Republic of Korea on Aug. 26, 2015, 10-2016-0109161, filed in Republic of Korea on Aug. 26, 2016 and 10-2016-0109164, filed in Republic of Korea on Aug. 26, 2016, all of which are hereby expressly incorporated by reference into the present application.

TECHNICAL FIELD

The present invention relates to a display device using a semiconductor light-emitting device, and more particularly, to a transfer head and a transfer system for semiconductor light-emitting devices and a method for transferring semiconductor light-emitting devices.

BACKGROUND ART

Recently, in display technology field, display devices having good characteristics such as thinness and flexibility are being developed. On the other hand, examples of currently commercialized main display devices include liquid crystal display (LCD) devices and active matrix organic light-emitting diodes (AMOLEDs).

However, in LCD devices, a response time is not fast, and it is difficult to implement flexibility. In AMOLEDs, lifetime is short, a yield rate is not good, and a flexible degree is weak.

Light-emitting diodes (LEDs) are well known semiconductor light-emitting devices which convert a current into light, and red LEDs using a GaAsP compound semiconductor have been commercialized in 1962, whereafter the red LEDs are used as a light source for image display of information communication devices and electronic devices along with GaP:N-based red LEDs. Therefore, by implementing flexible display devices with the semiconductor light-emitting devices, a method for solving the problem may be proposed.

However, in flexible display devices using semiconductor light-emitting devices, it is needed that a number of semiconductor light-emitting devices grow on a wafer, and then, are transferred to a position corresponding to a pixel of a display device. Examples of such a transfer method include a method using a PDMS stamp type transfer head or an electrostatic gripper, etc., but all of such methods have a problem which alignment is difficult. Therefore, the present invention proposes a transfer head where efficient alignment is possible in comparison with the related art.

Moreover, the methods have a problem where the manufacturing cost is high, and a yield rate is low. Therefore, the present invention proposes a transfer method having a high yield rate and control precision.

At present, a method of adjusting horizontality by using an actuator which moves and rotates along a multi-axis for horizontality and alignment between a transfer wafer and a receiver wafer and between the transfer wafer and a donor wafer is much used in a transfer process. However, the actuator which rotates and is transferred along the multi-axis are based on input values of various sensors (sensors recognizing an image, a distance, etc.), but have a problem where the input values are inaccurate and a problem where it is unable to adjust accurate horizontality. Also, horizontal alignment is made between the transfer wafer and the receiver wafer, but in a case where there is a slope locally or there is a height difference locally, it is difficult to pick up a micro-device. Therefore, the present invention proposes a transfer method for solving the problem.

DISCLOSURE

Technical Problem

An object of the present invention is to provide a method of transferring a semiconductor light-emitting device in a new manner, which can transfer a semiconductor light-emitting device with higher reliability. In more detail, the present invention is for providing a method and apparatus for more precisely transferring a semiconductor light-emitting device.

An object of the present invention is to provide a transfer head which has a simple structure and is easy to align.

An object of the present invention is to provide a method and apparatus of transferring a semiconductor light-emitting device having a high yield rate and control precision.

An object of the present invention is to provide a transfer head which has a simple structure and is low in manufacturing cost.

An object of the present invention is to provide a transfer head for micro-devices, in which a degree of freedom is added to the transfer head having a simple structure, and thus, self-leveling is possible.

Technical Solution

A transfer head of a semiconductor light-emitting device according to the present invention has a structure where precise alignment is implemented with only a field of upper view by using a transparent substrate and a transparent electrode. In more detail, the transfer head of the semiconductor light-emitting device includes a base substrate and an electrode unit disposed on the base substrate to generate an electrostatic force by electrifying an undoped semiconductor layer of the semiconductor light-emitting device. The base substrate and the electrode unit are each provided to have light transmissivity so that at least a portion of the semiconductor light-emitting device is visible is visible by sequentially passing through the base substrate and the electrode unit.

Moreover, the present invention discloses a method of transferring a semiconductor light-emitting device including an undoped semiconductor layer disposed on a carrier substrate, the method including bringing a transfer head, including a base substrate and an electrode unit disposed on the base substrate, in adjacency to an undoped semiconductor layer of the semiconductor light-emitting device, applying a voltage to the electrode unit in order for an adhesive force to be applied to the undoped semiconductor layer with an electrostatic force, and picking up, by the transfer head, the semiconductor light-emitting device to transfer the semiconductor light-emitting device, wherein in the bringing of the transfer head in adjacency to the undoped semiconductor layer, the base substrate and the electrode unit are each provided to have light transmissivity so that the transfer head and the semiconductor light-emitting device are aligned.

A transfer head of a semiconductor light-emitting device according to the present invention has a structure where a semiconductor light-emitting device is selectively picked up in a simple structure by using an electrode formed on a flat substrate. In more detail, the transfer head of the semiconductor light-emitting device includes a base substrate including a plane and an electrode unit disposed on the plane of the base substrate to generate an electrostatic force by electrifying an undoped semiconductor layer of the semiconductor light-emitting device, the electrode unit including a first electrode lead and a second electrode lead disposed in parallel. A plurality of protrusion electrodes are provided in each of the first electrode lead and the second electrode lead to selectively pick up a plurality of semiconductor light-emitting devices with the electrostatic force.

Moreover, the present invention discloses a transfer system for transferring a semiconductor light-emitting device disposed on a carrier substrate by using the transfer head.

Moreover, the present invention discloses a method of transferring a semiconductor light-emitting device, the method including bringing a transfer head, including a base substrate and an electrode unit disposed on the base substrate, in adjacency to an undoped semiconductor layer of the semiconductor light-emitting device, applying a voltage to the electrode unit in order for an adhesive force to be applied to the undoped semiconductor layer with an electrostatic force, and picking up, by the transfer head, the semiconductor light-emitting device to transfer the semiconductor light-emitting device, wherein the electrode unit is disposed on a plane of the base substrate and includes a first electrode lead and a second electrode lead disposed in parallel, and a plurality of protrusion electrodes are provided in each of the first electrode lead and the second electrode lead to selectively pick up a plurality of semiconductor light-emitting devices with the electrostatic force.

Moreover, a transfer head of a micro-device according to the present invention includes a plurality of pickup heads picking up micro-devices, a head holder supporting the plurality of pickup heads, and a substrate supporting the head holder, wherein the head holder is disposed between the plurality of pickup heads and the substrate, and a shape of the head holder is deformed by a movement of each of the plurality of pickup heads, thereby providing a degree of freedom to the plurality of pickup heads.

Advantageous Effects

In the present invention, a Johnsen rahbek type electrostatic gripper may be applied to a method of transferring a semiconductor light-emitting device by using an electrode of a transfer head and an undoped semiconductor layer of a semiconductor light-emitting device. Therefore, a method and apparatus of transferring a semiconductor light-emitting device with a higher grip force may be implemented. Also, in this case, each of a base substrate and an electrode unit is provided to have light transmissivity, and thus, precise control for alignment is possible with a field of upper view.

Moreover, by transferring a plurality of semiconductor light-emitting devices with a multi-head having light transmissivity, the present invention can have an advantage in large area and a plurality of transfer. Also, by using low-cost glass for the base substrate having light transmissivity, the manufacturing cost of a transfer head can be reduced.

Moreover, according to the present invention, it is easy that a number of semiconductor light-emitting devices are pixelized on a wafer, and then, are selectively transferred to a substrate with precision.

Moreover, by using an electrostatic plate having a simple structure without a complicated mesa structure, the present invention realizes the low manufacturing cost and a high yield rate. Furthermore, due to the simple structure, the present invention has control precision, and large-area transfer is possible.

Moreover, the present invention transfers a plurality of semiconductor light-emitting devices by using a transfer head having light transmissivity, and thus, can have an advantage in large area and a plurality of transfer.

Moreover, according to the present invention, horizontality and step heights of pickup heads and a donor substrate may be aligned without using a sensor and a transfer mechanism.

Moreover, according to the present invention, there is an advantage where a large degree of freedom is individually provided to a plurality of pickup heads.

DESCRIPTION OF DRAWINGS

FIG. 2 is a partially enlarged view of a portion A of FIG. 1, and FIGS. 3A and 3B are cross-sectional views taken along lines B-B and C-C of FIG. 2.

FIGS. 26 and 27 are a cross-sectional view and a plan view of a transfer head of a micro-device according to another embodiment of the present invention.

FIGS. 28A and 28B are a conceptual view of a transfer head of a micro-device according to another embodiment of the present invention.

FIG. 29 is a cross-sectional view of a transfer head of a micro-device according to another embodiment of the present invention.

FIGS. 32A to 32E are flowcharts illustrating a state where a micro-device transfer apparatus of the present invention operates.

FIGS. 33 and 34 are a cross-sectional view and a plan view of a transfer head of a micro-device according to another embodiment of the present invention.

FIGS. 35 and 36 are a cross-sectional view and a plan view of a transfer head of a micro-device according to another embodiment of the present invention.

MODE FOR INVENTION

Hereinafter, embodiments disclosed in the specification will be described in detail with reference to the accompanying drawings. The suffixes "module" and "unit" to elements used herein is assigned or used in consideration of easiness of description of the specification, and do not have a meaning or a role differentiated from each other. In describing the present invention, when it is determined that detailed descriptions of known techniques associated with the present invention unnecessarily obscure the gist of the present invention, the detailed descriptions thereof will be omitted. Moreover, the accompanying drawings merely enable embodiments disclosed in the specification to easily understand, and it should not be construed that technical spirit disclosed in the specification is limited by the accompanying drawings.

Moreover, it can be understood that when an element such as a layer, a region, or a substrate is referred to as being "on" another element, the element may be directly on the other element, or an intermediate element may be located therebetween.

Examples of a display device described in the specification may include portable phones, smartphones, laptop computers, digital broadcast terminals, personal digital assistants (PDAs), portable multimedia players (PMPs), navigation devices, slate personal computers (PCs), tablet PCs, ultrabook, digital televisions (TVs), desktop computers, etc. However, it can be easily understood by those skilled in the art that elements according to an embodiment described in the specification may be applied to display-enabled apparatuses despite new type products developed later.

Figure 1:
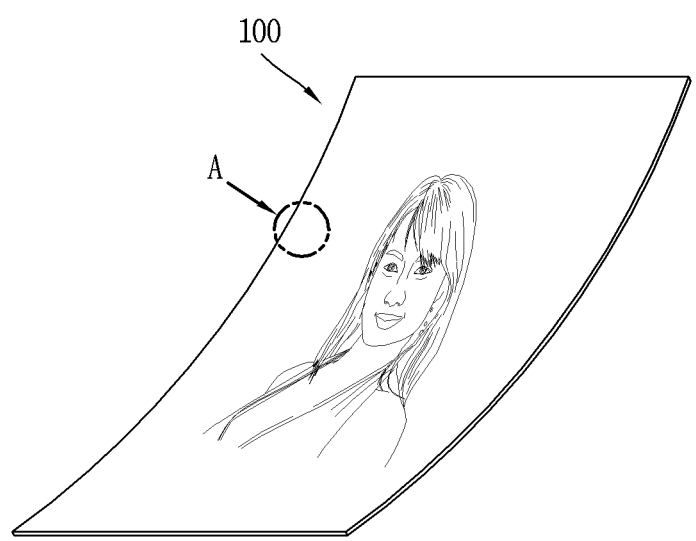
FIG. 1 is a conceptual view illustrating an embodiment of a display device using a semiconductor light-emitting device of the present invention.

FIG. 1 is a conceptual view illustrating an embodiment of a display device using a semiconductor light-emitting device of the present invention.

According to illustration, information processed by a controller of a display device 100 may be displayed by using a flexible display.

Examples of the flexible display include a display capable of being bent, curved, twisted, folded, and rolled by an external force. For example, the flexible display may be a display manufactured on a thin and flexible substrate which is capable of being bent, curved, folded, and rolled like paper while maintaining a display characteristic of a conventional flat panel display.

In a state (for example, a state having an infinite curvature radius) (hereinafter referred to as a first state) where the flexible display is not bent, a display region of the flexible display becomes a plane. In a state (for example, a state having a finite curvature radius) (hereinafter referred to as a second state) where the flexible display is bent by an external force in the first state, the display region may become a curve surface. As illustrated, information displayed in the second state may be visual information output on a curve surface. The visual information is realized according to emission of light from a subpixel disposed in a matrix type being independently controlled. The subpixel denotes a minimum unit for realizing one color.

A subpixel of the flexible display may be implemented by a semiconductor light-emitting device. In the present invention, as a type of semiconductor light-emitting device which converts a current into light, a light-emitting diode (LED) is described. The LED is provided to have a small size, and thus, may act as a subpixel even in the second state.

Hereinafter, a flexible display implemented with the LED will be described in more detail with reference to the accompanying drawings.

Figure 3A:
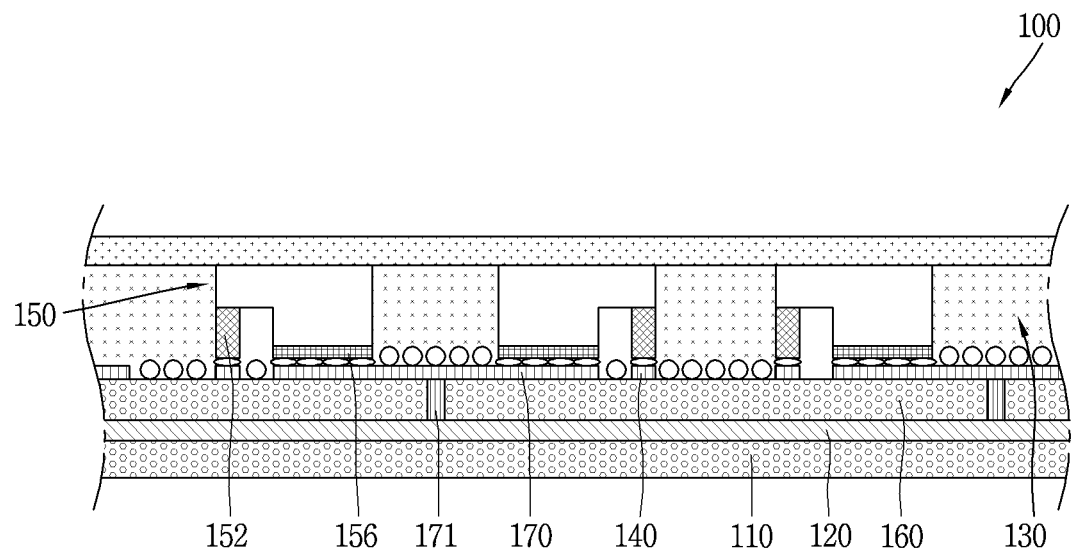
Figure 3B:
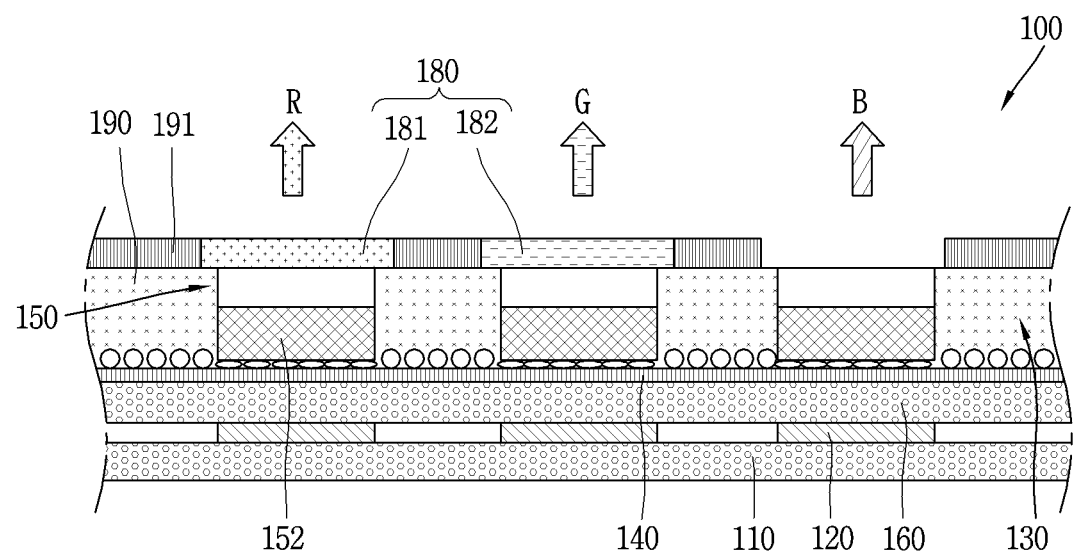
Figure 4:
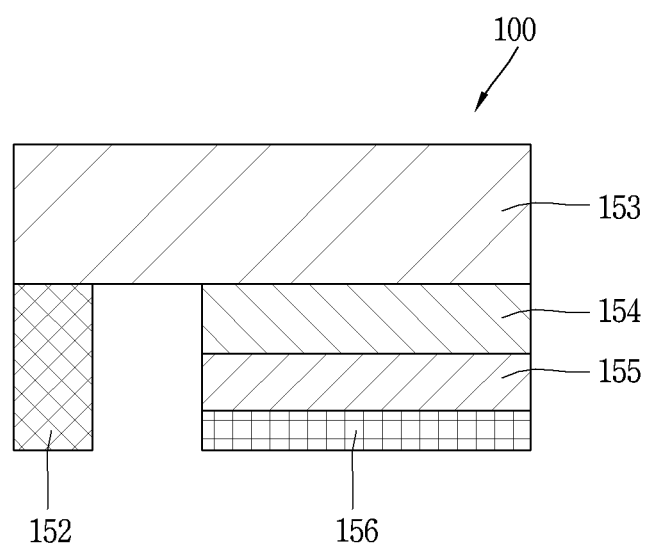
FIG. 4 is a conceptual view illustrating a flip chip type semiconductor light-emitting device of FIG. 3.

FIG. 2 is a partially enlarged view of a portion A of FIG. 1, and FIGS. 3A and 3B are cross-sectional views taken along lines B-B and C-C of FIG. 2, FIG. 4 is a conceptual view illustrating a flip chip type semiconductor light-emitting device of FIG. 3, and FIGS. 5A to 5C are conceptual views illustrating various forms for realizing a color in association with a flip chip type semiconductor light-emitting device.

According to illustrations of FIGS. 2, 3A, and 3B, a display device 100 using a passive matrix (PM) semiconductor light-emitting device is described as a display device 100 using a semiconductor light-emitting device. However, an embodiment described below may be applied to an active matrix (AM) semiconductor light-emitting device.

The display device 100 includes a substrate 110, a first electrode 120, a conductive adhesive layer 130, a second electrode 140, and a plurality of semiconductor light-emitting devices 150.

The substrate 110 may be a flexible substrate. For example, in order to implement a flexible display device, the substrate 110 may include polyimide (PI). In addition, the substrate 110 may use a material (for example, polyethylene naphthalate (PEN), polyethylene terephthalate (PET), or the like) having flexibility and insulating properties. Also, the substrate 110 may use a transparent material or an opaque material.

The substrate 110 may be a wiring substrate on which the first electrode 120 is disposed, and thus, the first electrode 120 may be disposed on the substrate 110.

According to illustration, an insulation layer 160 may be disposed on the substrate 110 on which the first electrode 120 is disposed, and a secondary electrode 170 may be disposed on the insulation layer 160. In this case, a state where the insulation layer 160 is stacked on the substrate 110 may be one wiring substrate. In more detail, the insulation layer 160 may include a material having flexibility and insulating properties like PI, PET, PEN, etc. and may be provided as one body with the substrate 110 to configure one substrate.

The secondary electrode 170 is an electrode which electrically connects the first electrode 120 to the semiconductor light-emitting device 150, and is disposed on the insulation layer 160 in correspondence with a position of the first electrode 120. For example, the secondary electrode 170 may have a dot form and may be electrically connected to the first electrode 120 by an electrode hole 171 passing through the insulation layer 160. The electrode hole 171 may be formed by filling a conductive material into a via hole.

Referring to the drawings, the conductive adhesive layer 130 is formed on one surface of the insulation layer 160, but the present invention is not limited thereto. For example, a layer performing a specific function is formed between the insulation layer 160 and the conductive adhesive layer 130, but a structure where the conductive adhesive layer 130 is disposed on the substrate 110 without the insulation layer 160 is possible. In the structure where the conductive adhesive layer 130 is disposed on the substrate 110, the conductive adhesive layer 130 may act as an insulation layer.

The conductive adhesive layer 130 may be a layer having adhesiveness and conductivity, and to this end, in the conductive adhesive layer 130, a material having conductivity may be mixed with a material having adhesiveness. Also, the conductive adhesive layer 130 has ductility, and thus, may perform a flexible function in a display device.

For example, the conductive adhesive layer 130 may be an anisotropic conductive film (ACF), an anisotropic conductive paste, a solution containing a conductive particle, or the like. The conductive adhesive layer 130 may allow an electrical connection in a Z direction passing through a thickness, but may be configured as a layer having electrical insulating properties in a horizontal X-Y direction. Therefore, the conductive adhesive layer 130 may be referred to as a Z-axis conductive layer (hereinafter referred to as a 'conductive adhesive layer').

The anisotropic conductive film is a film where an anisotropic conductive medium is mixed with an insulation base member, and when heat and pressure are applied, only a specific portion of the anisotropic conductive film has conductivity due to the anisotropic conductive medium. Hereinafter, it is described that the heat and the pressure is applied to the anisotropic conductive film, but in order for the anisotropic conductive film to partially have conductivity, another method is possible. Such a method may be, for example, a process where only one of the heat and the pressure is applied, or an ultraviolet (UV) curing process.

Moreover, the anisotropic conductive medium may be, for example, a conductive ball or a conductive particle. According to illustration, in the present embodiment, the anisotropic conductive film is a film where a conductive ball is mixed with an insulation base member, and when heat and pressure are applied, only a specific portion of the anisotropic conductive film has conductivity due to the conductive ball. The anisotropic conductive film may be a state containing a plurality of particles where a core of a conductive material is covered by an insulation layer including a polymer material, and in this case, as a portion to which heat and pressure are applied is broken down by the insulation layer, the anisotropic conductive film has conductivity due to the core. In this case, a shape of the core may be deformed, and thus, may configure layers which contact each other in a thickness direction of the film. As a more detailed example, heat and pressure are overall applied to the anisotropic conductive film, and an electrical connection in a Z-axis direction is partially formed by a height difference of relative materials adhered to each other by the anisotropic conductive film.

As another example, the anisotropic conductive film may be a state containing a plurality of particles where a conductive material is covered on an insulation core. In this case, a conductive material of a portion to which heat and pressure are applied is deformed (attached), and thus, the anisotropic conductive film has conductivity in a thickness direction of the film. As another example, it is possible that a conductive material passes through an insulation base member in the Z-axis direction and has conductivity in a thickness direction of the film. In this case, the conductive material may have a sharp end.

According to illustration, the anisotropic conductive film may be a fixed array ACF where a conductive ball is inserted into one surface of an insulation base member. In more detail, the insulation base member is formed of a material having adhesiveness, and the conductive ball is intensively disposed in a floor portion of the insulation base member. When heat and pressure are applied to the insulation base member, the insulation base member is deformed along with the conductive ball, and thus, has conductivity in a vertical direction.

However, the present invention is not limited thereto, and the anisotropic conductive film may have a state, where a conductive ball is randomly inserted into an insulation base member, or a state where the anisotropic conductive film is configured with a plurality of layers and a conductive ball is disposed on one layer.

The anisotropic conductive paste may have a state where a paste is bonded to a conductive ball, and may be a paste where a conductive ball is mixed with a base material having adhesiveness and insulating properties. Also, the solution containing the conductive particle may be a solution containing a conductive particle or a nano particle.

Referring again to the drawing, the second electrode 140 is spaced apart from the secondary electrode 170 and is disposed on the insulation layer 160. That is, the conductive adhesive layer 130 is disposed on the insulation layer 160 on which the secondary electrode 170 and the second electrode 140 are located.

The conductive adhesive layer 130 is formed in a state where the secondary electrode 170 and the second electrode 140 are located on the insulation layer 160, and then, when the semiconductor light-emitting device 150 is connected in a flip chip type by applying heat and pressure, the semiconductor light-emitting device 150 is electrically connected to the first electrode 120 and the second electrode 140.

Referring to FIG. 4, the semiconductor light-emitting device may be a flip chip type light-emitting device.

For example, the semiconductor light-emitting device includes a p-type electrode 156, a p-type semiconductor layer 155 on which the p-type electrode 156 is formed, an active layer 154 formed on the p-type semiconductor layer 155, an n-type semiconductor layer 153 formed on the active layer 154, and an n-type electrode 152 which is disposed on the n-type semiconductor layer 153 and is spaced apart from the p-type electrode 156 in a horizontal direction. In this case, the p-type electrode 156 may be electrically connected to the secondary electrode 170 by the conductive adhesive layer 130, and the n-type electrode 152 may be electrically connected to the second electrode 140.

Referring again to FIGS. 2, 3A, and 3B, the secondary electrode 170 may be long formed in one direction, and one secondary electrode may be electrically connected to a plurality of semiconductor light-emitting devices 150. For example, p-type electrodes of semiconductor light-emitting devices on the left and the right with respect to the secondary electrode may be electrically connected to one secondary electrode.

In more detail, the semiconductor light-emitting device 150 is press-fitted to the inside of the conductive adhesive layer 130 by heat and pressure, and thus, has conductivity in only a portion between the p-type electrode 156 of the semiconductor light-emitting device 150 and the secondary electrode 170 and only a portion between the n-type electrode 152 of the semiconductor light-emitting device 150 and the second electrode 140 and does not have conductivity in the other portion because press-fitting of the semiconductor light-emitting device is not performed. In this manner, the conductive adhesive layer 130 couples and electrically connects the semiconductor light-emitting device 150 and the secondary electrode 170 and couples and electrically connects the semiconductor light-emitting device 150 and the second electrode 140.

Moreover, the plurality of the semiconductor light-emitting devices 150 configure a light-emitting device array, and a phosphor layer 180 is formed in the light-emitting device array.

The light-emitting device array may include a plurality of semiconductor light-emitting devices having different luminance values. Each of the semiconductor light-emitting devices 150 configures a subpixel and is electrically connected to the first electrode 120. For example, the first electrode 120 may be provided in plurality, and the semiconductor light-emitting devices may be disposed in several rows. The semiconductor light-emitting devices of each of the several rows may be electrically connected to one of the plurality of first electrodes.

Moreover, since semiconductor light-emitting devices are connected in a flip chip type, semiconductor light-emitting devices which have grown on a transparent dielectric substrate may be used. Also, the semiconductor light-emitting devices may be, for example, nitride semiconductor light-emitting devices. The semiconductor light-emitting device 150 is good in luminance, and thus, may configure an individual subpixel with a small size.

According to illustration, a partition wall 190 may be formed between the semiconductor light-emitting devices 150. In this case, the partition wall 190 may separate individual subpixels and may be provided as one body with the conductive adhesive layer 130. For example, an anisotropic conductive film may be inserted into the semiconductor light-emitting device 150, and thus, a base member of the anisotropic conductive film may form the partition wall.

Moreover, when the base member of the anisotropic conductive film is black, the partition wall 190 may have a reflective characteristic, and contrast may increase, even without a separate black insulator.

As another example, a reflective partition wall may be separately provided as the partition wall 190. In this case, the partition wall 190 may include a black or white insulator depending on an object of the display device. In a case where a partition wall of the white insulator is used, there can be an effect where reflectivity increases, and in a case where a partition wall of the black insulator is used, the partition wall has a reflective characteristic, and contrast may increase.

The phosphor layer 180 may be disposed on an outer surface of the semiconductor light-emitting device 150. For example, the semiconductor light-emitting device 150 is a blue semiconductor light-emitting device which emits blue (B) light, and the phosphor layer 180 performs a function of converting the blue (B) light into a color of a subpixel. The phosphor layer 180 may be a red phosphor 181 or a green phosphor 182, which configures an individual pixel.

That is, the red phosphor 181 for converting blue light into red (R) light may be stacked on a blue semiconductor light-emitting device 151 at a position at which a red subpixel is provided, and the green phosphor 182 for converting blue light into green (G) light may be stacked on the blue semiconductor light-emitting device 151 at a position at which a green subpixel is provided. Also, only the blue semiconductor light-emitting device 151 may be used in a portion where a blue subpixel is provided. In this case, red (R), green (G), and blue (B) subpixels may configure one pixel. In more detail, a phosphor having one color may be stacked along each line of the first electrode 120. Therefore, in the first electrode 120, one line may be an electrode which controls one color. That is, red (R), green (G), and blue (B) may be sequentially disposed along the second electrode 140, and thus, one subpixel may be implemented.

However, the present invention is not limited thereto, and instead of a phosphor, the semiconductor light-emitting device 150 and a quantum dot QD may be combined to implement red (R), green (G), and blue (B) subpixels.

Moreover, in order to enhance contrast, a black matrix 191 may be disposed between phosphor layers. That is, the black matrix 191 can enhance contrast.

However, the present invention is not limited thereto, and another structure for implementing blue, red, and green may be applied.

Figure 5A:
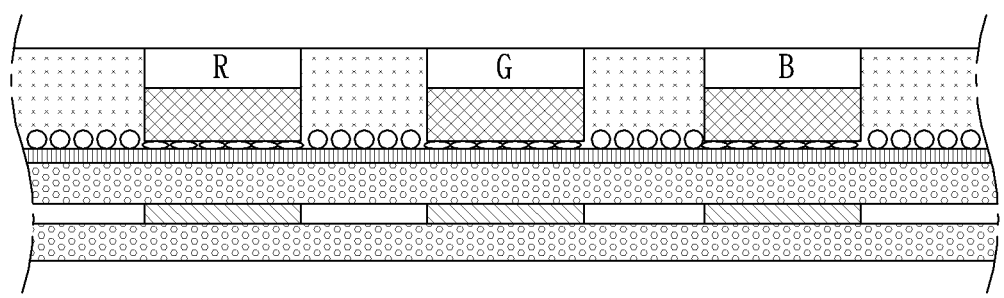
FIGS. 5A to 5C are conceptual views illustrating various forms for realizing a color in association with a flip chip type semiconductor light-emitting device.

Referring to FIG. 5A, each of the semiconductor light-emitting devices 150 may include nitride gallium (GaN) and include indium (In) and/or aluminum (Al), and thus, may be implemented as a high-output light-emitting device emitting various lights as well as blue.

In this case, the semiconductor light-emitting devices 150 may be red, green, and blue semiconductor light-emitting devices for configuring a subpixel. For example, red, green, and blue semiconductor light-emitting devices R, and B may be alternately disposed, and due to the red, green, and blue semiconductor light-emitting devices, red, green, and blue subpixels may configure one pixel, and thus, a full color display may be implemented.

Figure 5B:
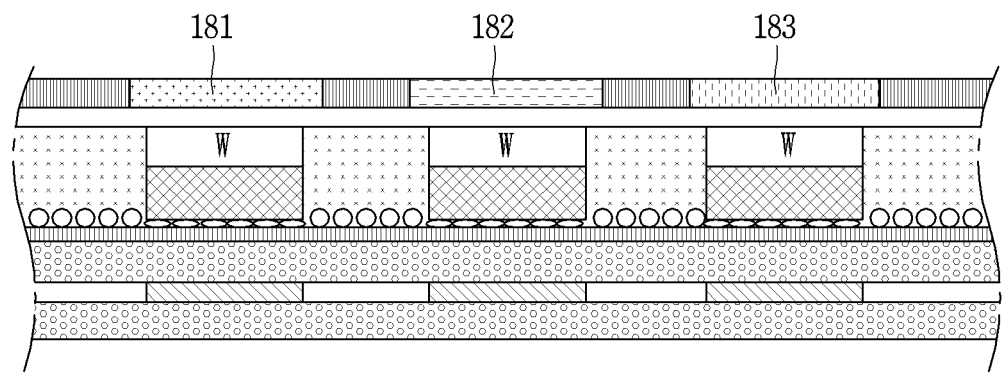

Referring to FIG. 5B, a semiconductor light-emitting device may include a white light-emitting device W where a yellow phosphor layer is provided in each individual device. In this case, in order to configure a subpixel, a red phosphor layer 181, a green phosphor layer 182, and a blue phosphor layer 183 may be provided on the white light-emitting device W. Also, a subpixel may be provided in the white light-emitting device W by using a color filter where red, green, and blue are repeated.

Figure 5C:
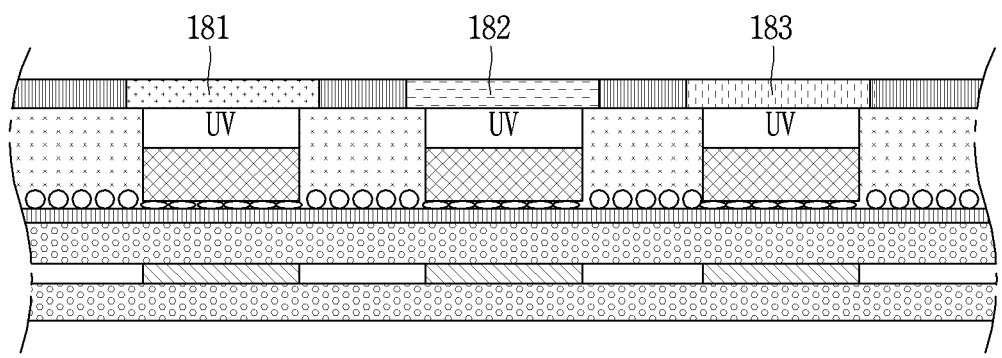

Referring to FIG. 5C, a structure where a red phosphor layer 181, a green phosphor layer 182, and a blue phosphor layer 183 are provided in an UV light-emitting device UV may be implemented. In this manner, a semiconductor light-emitting device is available in a whole range including UV as well as visible light and may be implemented a form of a semiconductor light-emitting device where UV is available as an excitation source for an upper phosphor.

To again describe the present embodiment, the semiconductor light-emitting device 150 is disposed on the conductive adhesive layer 130 to configure a subpixel in the display device. The semiconductor light-emitting device 150 is good in luminance, and thus, may configure an individual subpixel with a small size. In a size of the individual semiconductor light-emitting device 150, a length of one side may be 80 μm or less, and the semiconductor light-emitting device 150 may be a rectangular or square device. In a case where the semiconductor light-emitting device 150 is a rectangular device, the semiconductor light-emitting device 150 may have a size of 20×80 μm or less.

Moreover, even when a square semiconductor light-emitting device 150 where a length of one side is 10 μm is used as a subpixel, brightness sufficient to implement the display device is obtained. Therefore, for example, in a rectangular pixel where one side of a subpixel is 600 μm and the other one side is 300 μm, a distance between semiconductor light-emitting devices is relatively sufficiently large. Accordingly, in this case, a flexible display device having HD image quality may be implemented.

A display device using the above-described semiconductor light-emitting device may be manufactured by a new manufacturing method. Hereinafter, the manufacturing method will be described with reference to FIG. 6.

Figure 6:
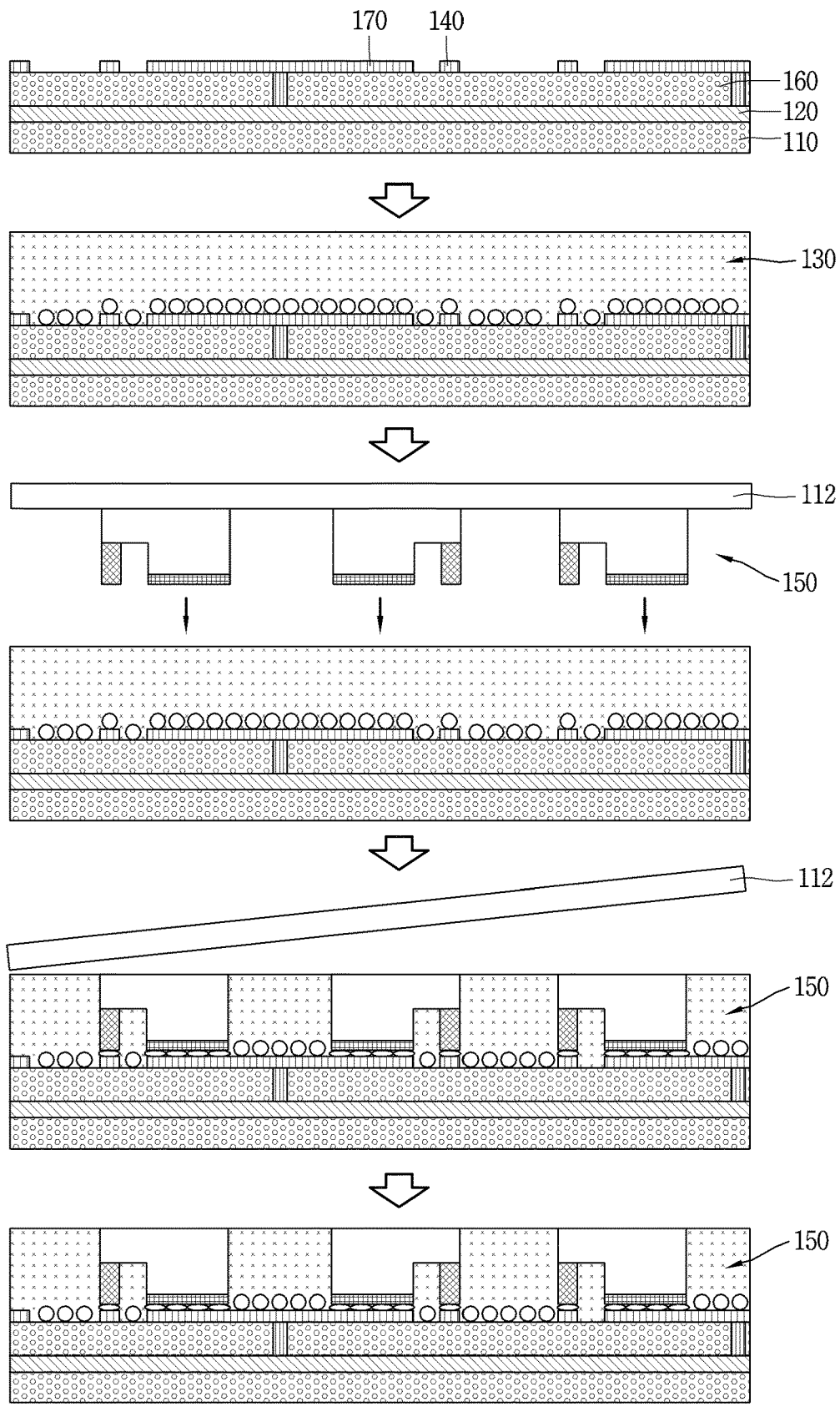
FIG. 6 is cross-sectional views illustrating a method of manufacturing a display device using a semiconductor light-emitting device of the present invention.

FIG. 6 is cross-sectional views illustrating a method of manufacturing a display device using a semiconductor light-emitting device of the present invention.

Referring to the drawing, first, a conductive adhesive layer 130 is formed on an insulation layer 160 on which a secondary electrode 170 and a second electrode 140 are disposed. An insulation layer 160 is stacked on a first substrate 110 to configure one substrate (or a wiring substrate), and a first electrode 120, the secondary electrode 170, and the second electrode 140 are disposed on the wiring substrate. In this case, the first electrode 120 and the second electrode 140 may be disposed in a direction in which the first electrode 120 intersects the second electrode 140. Also, in order to implement a flexible display device, the first substrate 110 and the insulation layer 160 may each include glass or PI.

The conductive adhesive layer 130 may be implemented by, for example, an anisotropic conductive film, and to this end, the anisotropic conductive film may be coated on a substrate on which the insulation layer 160 is disposed.

Subsequently, a second substrate 112, on which a plurality of semiconductor light-emitting devices 150 which correspond to positions of the secondary electrode 170 and the second electrode 140 and configure an individual pixel, is disposed in order for the semiconductor light-emitting device 150 to be opposite to the secondary electrode 170 and the second electrode 140.

In this case, the second substrate 112 is a growth substrate on which the semiconductor light-emitting device 150 has grown, and may be a sapphire substrate or a silicon substrate.

The semiconductor light-emitting device has an interval and a size for configuring a display device when the semiconductor light-emitting device is formed in units of one wafer, and thus, may be effectively used for the display device.

Subsequently, a wiring substrate and the second substrate 112 are thermally compressed. For example, the wiring substrate and the second substrate 112 may be thermally compressed by applying an ACF press head. The wiring substrate and the second substrate 112 are bonded to each other by the thermal compression. Due to a characteristic of an anisotropic conductive film having conductivity based on thermal compression, only a portion between the semiconductor light-emitting device 150 and the secondary electrode 170 and second electrode 140 has conductivity, and thus, the electrodes may be electrically connected to the semiconductor light-emitting device 150. At this time, the semiconductor light-emitting device 150 may be inserted into the anisotropic conductive film, and thus, a partition wall may be formed between the semiconductor light-emitting devices 150.

Subsequently, the second substrate 112 is removed. For example, the second substrate 112 may be removed by using a laser lift-off (LLO) process or a chemical lift-off (CLO) process.

Finally, the semiconductor light-emitting devices 150 are exposed to the outside by removing the second substrate 112. Depending on the case, silicon oxide (SiOx) and/or the like is coated on the wiring substrate coupled to the semiconductor light-emitting device 150, thereby forming a transparent insulation layer (not shown).

Moreover, the method may further include an operation of forming a phosphor layer on one surface of the semiconductor light-emitting device 150. For example, the semiconductor light-emitting device 150 is a blue semiconductor light-emitting device which emits blue (B) light, and a red phosphor or a green phosphor for converting the blue (B) light into a color of a subpixel may form a layer on one surface of the semiconductor light-emitting device.

Hereinabove, a method of manufacturing a display device using the above-described semiconductor light-emitting device or a structure of the display device may be modified into various forms. For example, a vertical semiconductor light-emitting device may be applied to the above-described display device. Hereinafter, a vertical structure will be described with reference to FIGS. 5 and 6.

Moreover, in a below-described modification example or embodiment, like reference numerals refer to like elements, and the above descriptions are applied to descriptions of the elements.

Figure 7:
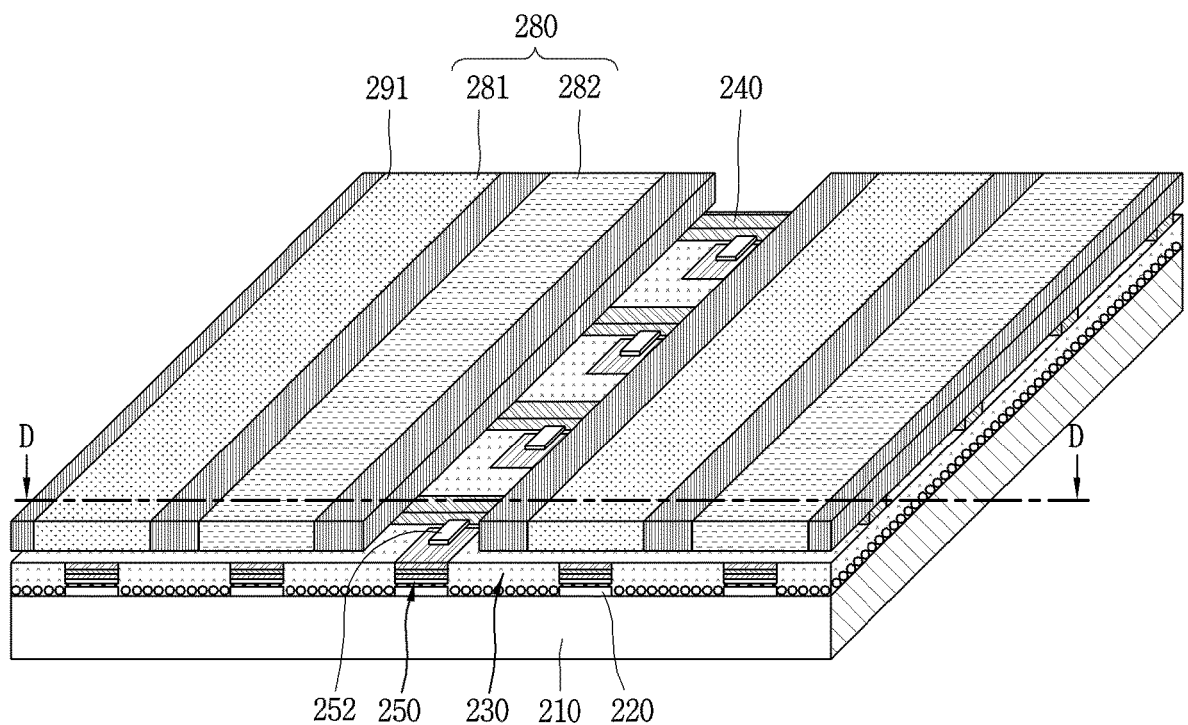
FIG. 7 is a perspective view illustrating another embodiment of a display device using a semiconductor light-emitting device of the present invention.
Figure 8:
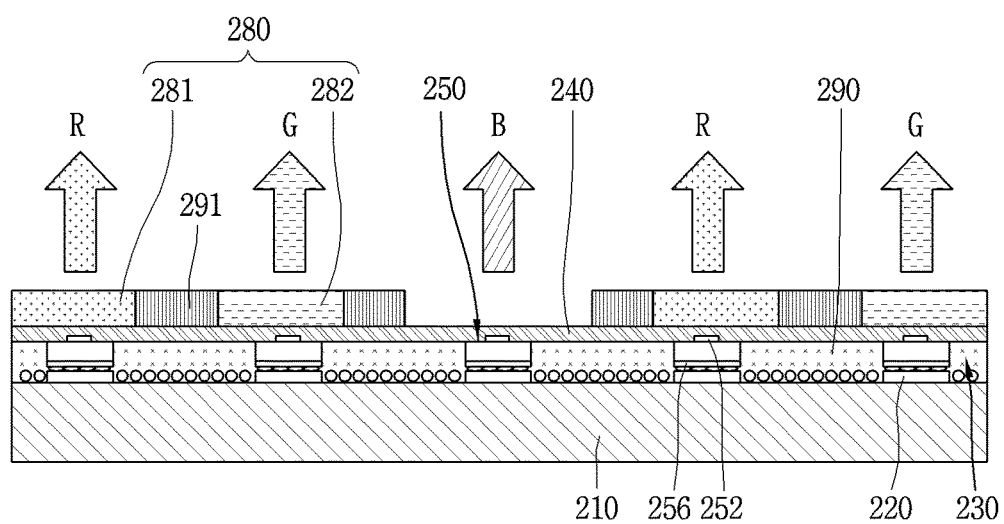
FIG. 8 is a cross-sectional view taken along line D-D of FIG. 7.
Figure 9:
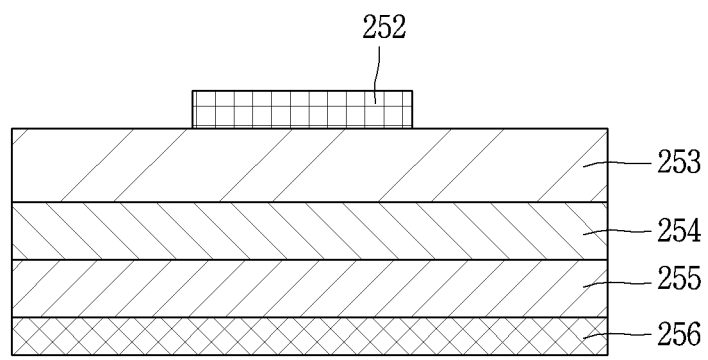
FIG. 9 is a conceptual view illustrating a vertical semiconductor light-emitting device of FIG. 8.

FIG. 7 is a perspective view illustrating another embodiment of a display device using a semiconductor light-emitting device of the present invention, FIG. 8 is a cross-sectional view taken along line D-D of FIG. 7, and FIG. 9 is a conceptual view illustrating a vertical semiconductor light-emitting device of FIG. 8.

Referring to the drawings, a display device may be a display device using a PM vertical semiconductor light-emitting device.

The display device includes a substrate 210, a first electrode 220, a conductive adhesive layer 230, a second electrode 240, and a plurality of semiconductor light-emitting devices 250.

The substrate 210 is a wiring substrate on which the first electrode 220 is disposed, and may include PI for implementing a flexible display device. In addition, the substrate 210 may use a material having flexibility and insulating properties.

The first electrode 220 is disposed on the substrate 210 and may be formed as a bar type electrode which is long in one direction. The first electrode 220 may act as a data electrode.

The conductive adhesive layer 230 is formed on the substrate 210 on which the first electrode 220 is disposed. Like a display device to which a flip chip type light-emitting device is applied, the conductive adhesive layer 230 may be an ACF, an anisotropic conductive paste, a solution containing a conductive particle, or the like. Furthermore, even in the present embodiment, a case where the conductive adhesive layer 230 is implemented by an anisotropic conductive film is described.

The anisotropic conductive film is located in a state where the first electrode 220 is located on the substrate 210, and then, when the semiconductor light-emitting device 250 is connected by applying heat and pressure, the semiconductor light-emitting device 250 is electrically connected to the first electrode 220. In this case, it is preferable that the semiconductor light-emitting device 250 is disposed on the first electrode 220.

The electrical connection, as described above, is formed because the anisotropic conductive film partially has conductivity in a thickness direction when heat and pressure are applied thereto. Accordingly, the anisotropic conductive film is divided into a portion 231 having conductivity in the thickness direction and a portion 232 having no conductivity.

Moreover, since the anisotropic conductive film contains an adhesive component, the conductive adhesive layer 230 implements an electrical connection and mechanical coupling between the semiconductor light-emitting device 250 and the first electrode 220.

In this manner, the semiconductor light-emitting device 250 is disposed on the conductive adhesive layer 230, and thus, configures an individual pixel in a display device. The semiconductor light-emitting device 250 is good in luminance, and thus, may configure an individual subpixel with a small size. In a size of the individual semiconductor light-emitting device 250, a length of one side may be 80 μm or less, and the semiconductor light-emitting device 250 may be a rectangular or square device. In a case where the semiconductor light-emitting device 250 is a rectangular device, the semiconductor light-emitting device 250 may have a size of 20×80 μm or less.

The semiconductor light-emitting device 250 may have a vertical structure.

A plurality of second electrodes 240 electrically connected to the vertical semiconductor light-emitting device 250 are disposed between vertical semiconductor light-emitting devices in a direction intersecting a lengthwise direction of the first electrode 220.

Referring to FIG. 9, the vertical semiconductor light-emitting device includes a p-type electrode 256, a p-type semiconductor layer 255 on which the p-type electrode 256 is formed, an active layer 254 formed on the p-type semiconductor layer 255, an n-type semiconductor layer 253 formed on the active layer 254, and an n-type electrode 252 formed on the n-type semiconductor layer 253. In this case, the p-type electrode 256 disposed in a lower portion may be electrically connected to the first electrode 220 by the conductive adhesive layer 230, and the n-type electrode 252 disposed in an upper portion may be electrically connected to the below-described second electrode 240. In such a vertical semiconductor light-emitting device 250, electrodes may be disposed in an upper portion and a lower portion, and a chip size can be reduced.

Referring again to FIG. 8, a phosphor layer 280 may be disposed on one surface of the semiconductor light-emitting device 250. For example, the semiconductor light-emitting device 250 is a blue semiconductor light-emitting device 251 which emits blue (B) light, and may include the phosphor layer 280 for converting the blue (B) light into a color of a subpixel. In this case, the phosphor layer 280 may be a red phosphor 281 and a green phosphor 282, which each configure an individual pixel.

That is, the red phosphor 281 for converting blue light into red (R) light may be stacked on the blue semiconductor light-emitting device 251 at a position at which a red subpixel is provided, and the green phosphor 282 for converting blue light into green (G) light may be stacked on the blue semiconductor light-emitting device 251 at a position at which a green subpixel is provided. Also, only the blue semiconductor light-emitting device 251 may be used in a portion where a blue subpixel is provided. In this case, red (R), green (G), and blue (B) subpixels may configure one pixel.

However, the present invention is not limited thereto, and as described above in the display device to which a flip chip type light-emitting device is applied, another structure for implementing blue, red, and green may be applied.

To again describe the present embodiment, the second electrode 240 is disposed between the semiconductor light-emitting devices 250 and is electrically connected to the semiconductor light-emitting devices 250. For example, the semiconductor light-emitting devices 250 may be disposed in a plurality of rows, and the second electrode 240 may be disposed between rows of the semiconductor light-emitting devices 250.

Since a distance between semiconductor light-emitting devices is relatively sufficiently large, the second electrode 240 may be disposed between the semiconductor light-emitting devices 250.

The second electrode 240 may be formed as a bar type electrode which is long in one direction, and may be disposed in a direction vertical to the first electrode.

Moreover, the second electrode 240 and the semiconductor light-emitting device 250 may be electrically connected to each other by a connection electrode protruding from the second electrode 240. In more detail, the connection electrode may be an n-type electrode of the semiconductor light-emitting device 250. For example, the n-type electrode is formed as an ohmic electrode for an ohmic contact, and the second electrode covers at least a portion of the ohmic electrode for printing or deposition. Therefore, the second electrode 240 may be electrically connected to the n-type electrode of the semiconductor light-emitting device 250.

According to illustration, the second electrode 240 may be disposed on the conductive adhesive layer 230. Depending on the case, a transparent insulation layer (not shown) including silicon oxide (SiOx) and/or the like may be formed on the substrate 210 on which the semiconductor light-emitting device 250 is formed. In a case where the second electrode 240 is disposed after the transparent insulation layer is formed, the second electrode 240 is disposed on the transparent insulation layer. Also, the second electrode 240 may be formed and spaced apart from the conductive adhesive layer 230 or the transparent insulation layer.

For example, if a transparent electrode such as indium tin oxide (ITO) is used for locating the second electrode 240 on the semiconductor light-emitting device 250, there is a problem where a contact between ITO and an n-type semiconductor layer is not good. Therefore, in the present invention, since the second electrode 240 is located between the semiconductor light-emitting devices 250, there is an advantage where a transparent electrode such as ITO is not used. Accordingly, a selection of a transparent material is not constrained, and a conductive material where adhesiveness to the n-type semiconductor layer is good is used as a horizontal electrode, thereby enhancing light extraction efficiency.

According to illustration, a partition wall 290 may be located between the semiconductor light-emitting devices 250. That is, in order to insulate the semiconductor light-emitting device 250 configuring an individual pixel, the partition wall 290 may be disposed between the vertical semiconductor light-emitting devices 250. In this case, the partition wall 290 may separate individual subpixels and may be provided as one body with the conductive adhesive layer 230. For example, the semiconductor light-emitting device 250 may be inserted into an anisotropic conductive film, and thus, a base member of the anisotropic conductive film may form the partition wall.

Moreover, when the base member of the anisotropic conductive film is black, the partition wall 190 may have a reflective characteristic, and contrast may increase, even without a separate black insulator.

As another example, a reflective partition wall may be separately provided as the partition wall 290. The partition wall 290 may include a black or white insulator depending on an object of the display device.

For example, in a case where the second electrode 240 is disposed directly on the conductive adhesive layer 230 between the semiconductor light-emitting devices 250, the partition wall 290 may be disposed between the vertical semiconductor light-emitting device 250 and the second electrode 240. Therefore, an individual subpixel may be configured by using the semiconductor light-emitting device 250 with a small size, and since a distance between the semiconductor light-emitting devices 250 is relatively sufficiently large, the second electrode 240 may be disposed between the semiconductor light-emitting devices 250, thereby implementing a flexible display device having HD image quality.

Moreover, according to illustration, in order to enhance contrast, a black matrix 291 may be disposed between phosphor layers. That is, the black matrix 291 can enhance contrast.

As described above, the semiconductor light-emitting device 250 is disposed on the conductive adhesive layer 230, and thus, an individual pixel is configured in a display device. The semiconductor light-emitting device 250 is good in luminance, and thus, may configure an individual subpixel with a small size. Accordingly, a full color display where red (R), green (G), and blue (B) subpixels configure one pixel may be implemented by a semiconductor light-emitting device.

In a display device using the above-described semiconductor light-emitting device of the present invention, in a case where a flip chip type is applied, first and second electrodes are disposed on the same plane, and for this reason, there is a problem where it is difficult to implement high definition (a fine pitch). Hereinafter, a display device to which a flip chip type light-emitting device according to another embodiment of the present invention is applied will be described.

Figure 10:
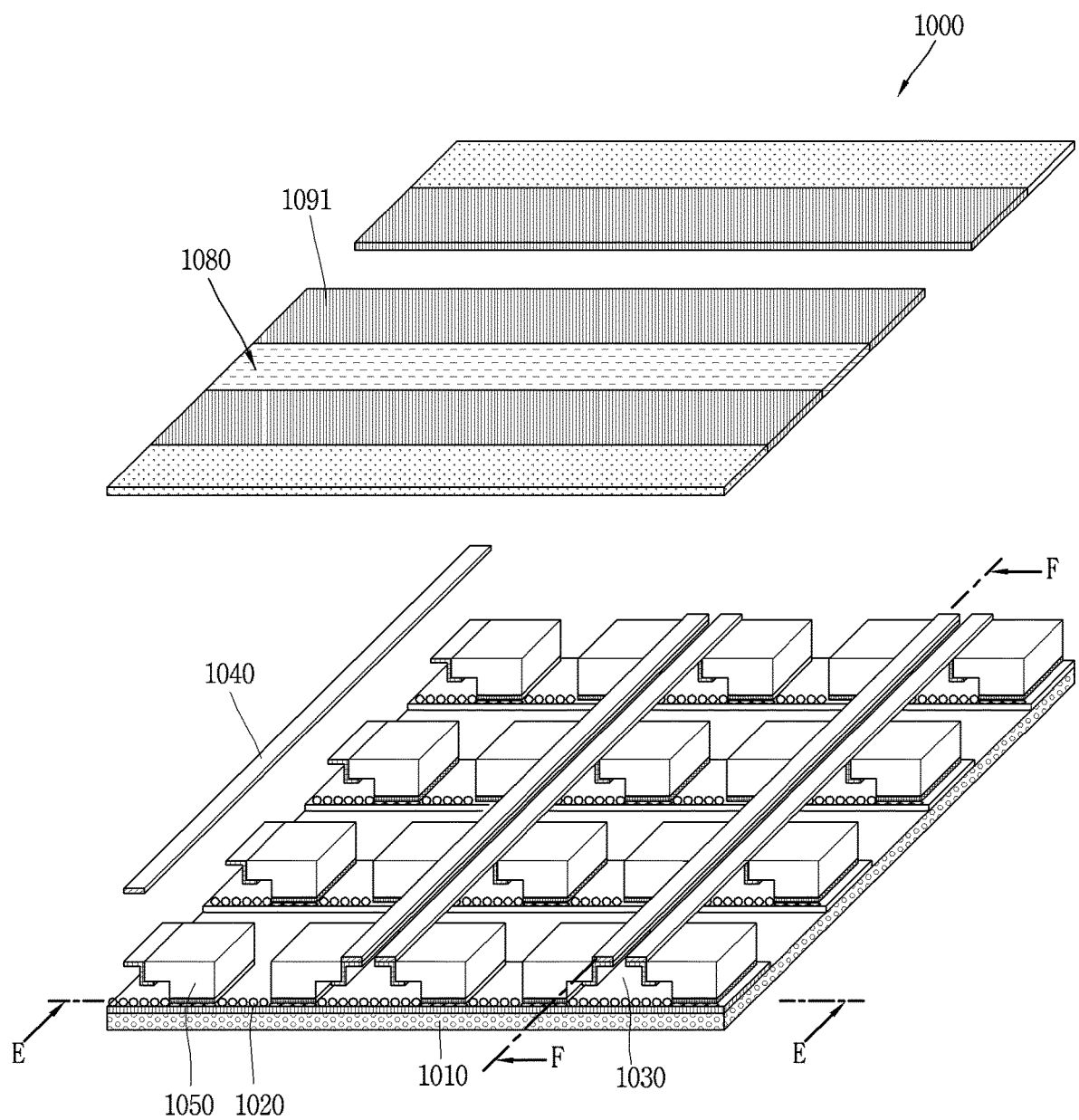
FIG. 10 is an enlarged view of the portion A of FIG. 1, for describing another embodiment of the present invention to which a semiconductor light-emitting device having a new structure is applied.
Figure 11A:
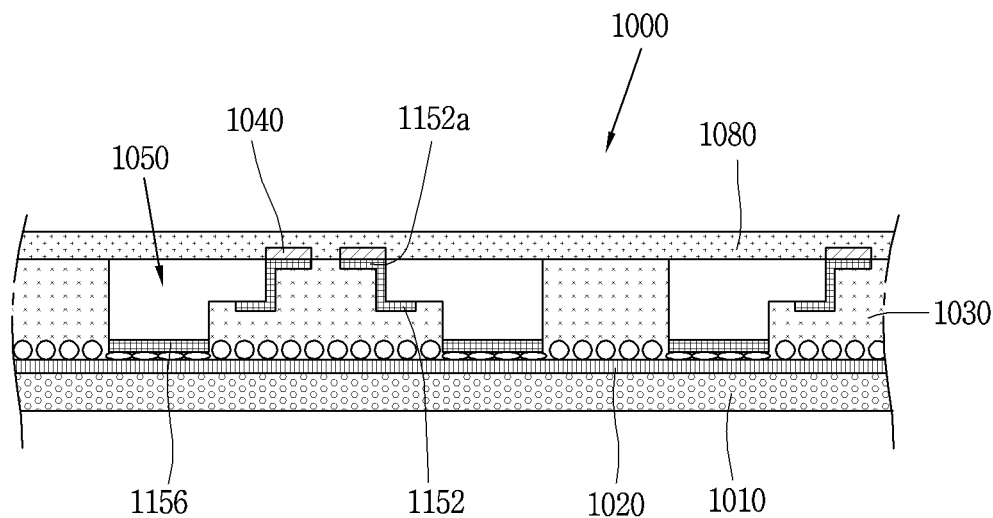
FIG. 11A is a cross-sectional view taken along line E-E of FIG. 10.
Figure 11B:
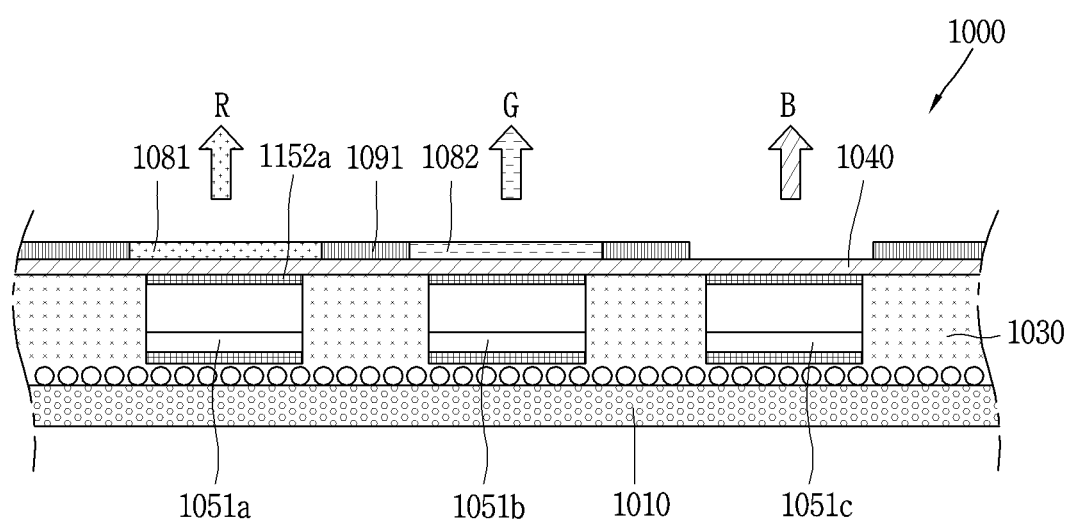
FIG. 11B is a cross-sectional view taken along line F-F of FIG. 11.
Figure 12:
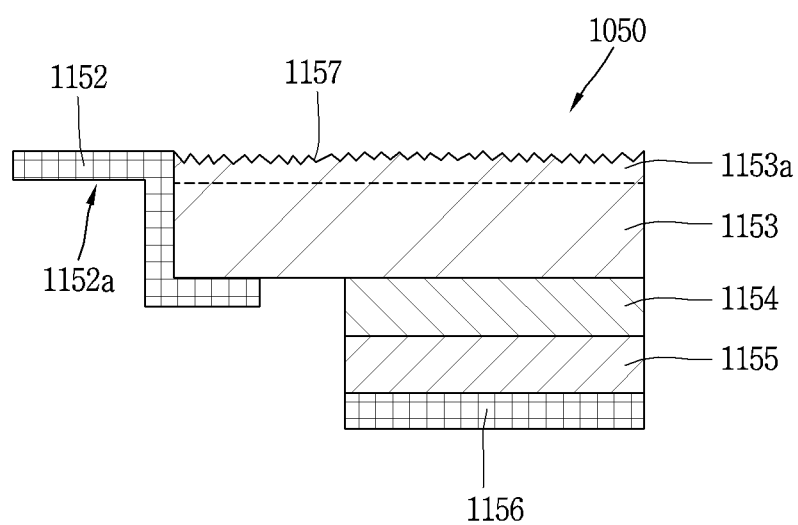
FIG. 12 is a conceptual view illustrating a flip chip type semiconductor light-emitting device of FIG. 11A.

FIG. 10 is an enlarged view of the portion A of FIG. 1, for describing another embodiment of the present invention to which a semiconductor light-emitting device having a new structure is applied. FIG. 11A is a cross-sectional view taken along line E-E of FIG. 10. FIG. 11B is a cross-sectional view taken along line F-F of FIG. 11. FIG. 12 is a conceptual view illustrating a flip chip type semiconductor light-emitting device of FIG. 11A.

According to illustrations of FIGS. 10, 11A, and 11B, a display device 1000 using a PM semiconductor light-emitting device is described as a display device 1000 using a semiconductor light-emitting device. However, an embodiment described below may be applied to an AM semiconductor light-emitting device.

The display device 1000 includes a substrate 1010, a first electrode 1020, a conductive adhesive layer 1030, a second electrode 1040, and a plurality of semiconductor light-emitting devices 1050. Here, the first electrode 1020 and the second electrode 1040 may each include a plurality of electrode lines.

The substrate 1010 is a wiring substrate on which the first electrode 1020 is disposed, and may include PI for implementing a flexible display device. In addition, the substrate 1010 may use a material having flexibility and insulating properties.

The first electrode 1020 is disposed on the substrate 1010 and may be formed as a bar type electrode which is long in one direction. The first electrode 1020 may act as a data electrode.

The conductive adhesive layer 1030 is formed on the substrate 1010 on which the first electrode 1020 is disposed. Like a display device to which a flip chip type light-emitting device is applied, the conductive adhesive layer 2030 may be an ACF, an anisotropic conductive paste, a solution containing a conductive particle, or the like. In the present embodiment, the conductive adhesive layer 1030 may be replaced by an adhesive layer. For example, if the first electrode 1020 is not disposed on the substrate 1010 and is provided as one body with a conductive electrode of the semiconductor light-emitting device, the adhesive layer cannot need conductivity.

A plurality of second electrodes 1040 electrically connected to the semiconductor light-emitting device 1050 are disposed between the semiconductor light-emitting devices in a direction intersecting a lengthwise direction of the first electrode 1020.

According to illustration, the second electrode 1040 may be disposed on the conductive adhesive layer 1030. That is, the conductive adhesive layer 1030 is disposed between a wiring substrate and the second electrode 1040. The second electrode 1040 may be electrically connected to the semiconductor light-emitting device 1050 by a contact with the semiconductor light-emitting device 1050.

Due to the above-described structure, the plurality of semiconductor light-emitting devices 1050 are coupled to the conductive adhesive layer 1030 and are electrically connected to the first electrode 1020 and the second electrode 1040.

Depending on the case, a transparent insulation layer (not shown) including silicon oxide (SiOx) and/or the like may be formed on the substrate 1010 on which the semiconductor light-emitting device 1050 is formed. In a case where the second electrode 1040 is disposed after the transparent insulation layer is formed, the second electrode 1040 is disposed on the transparent insulation layer. Also, the second electrode 1040 may be formed and spaced apart from the conductive adhesive layer 1030 or the transparent insulation layer.

As illustrated, the plurality of semiconductor light-emitting devices 1050 may form a plurality of rows in a direction parallel to a plurality of electrode lines included in the first electrode 1020. However, the present invention is not limited thereto. For example, the plurality of semiconductor light-emitting devices 1050 may form the plurality of rows along the second electrode 1040.

Furthermore, the display device 1000 may further include a phosphor layer 1080 provided on one surface of each of the plurality of semiconductor light-emitting devices 1050. For example, the semiconductor light-emitting device 1050 is a blue semiconductor light-emitting device which emits blue (B) light, and the phosphor layer 1080 performs a function of converting the blue (B) light into a color of a subpixel. The phosphor layer 1080 may be a red phosphor 1081 or a green phosphor 1082, which configures an individual pixel. That is, the red phosphor 1081 for converting blue light into red (R) light may be stacked on a blue semiconductor light-emitting device 1051a at a position at which a red subpixel is provided, and the green phosphor 1082 for converting blue light into green (G) light may be stacked on a blue semiconductor light-emitting device 1051b at a position at which a green subpixel is provided. Also, only a blue semiconductor light-emitting device 1051c may be used in a portion where a blue subpixel is provided. In this case, red (R), green (G), and blue (B) subpixels may configure one pixel. In more detail, a phosphor having one color may be stacked along each line of the first electrode 1020. Therefore, in the first electrode 1020, one line may be an electrode which controls one color. However, the present invention is not limited thereto, and instead of a phosphor, the semiconductor light-emitting device 1050 and a quantum dot QD may be combined to implement a subpixel which emits each of red (R), green (G), and blue (B) lights.

In order to enhance a contrast of the phosphor layer 1080, the display device may further include a black matrix 1091 disposed between phosphors. A gap may be provided between phosphor dots, and the black matrix 1091 may be formed by filling a black material into the gap. Therefore, the black matrix 1091 absorbs reflected external light and can enhance contrast. The black matrix 1091 is disposed between phosphor layers along the first electrode 1020 corresponding to a direction in which the phosphor layer 1080 is stacked. In this case, a phosphor layer is not formed at a position corresponding to the blue semiconductor light-emitting device 1051c, but the black matrix 1091 may be formed on each of both sides with a space (or the blue semiconductor light-emitting device 1051c therebetween), where the phosphor layer is not provided, therebetween.

To again describe the semiconductor light-emitting device 1050 of the present embodiment, in the semiconductor light-emitting device 1050, electrodes may be disposed in an upper portion and a lower portion, and thus, a chip size can be reduced. However, the electrodes are disposed in the upper portion and the lower portion, but the semiconductor light-emitting device of the present invention may be a flip chip type light-emitting device.

Referring to FIG. 12, for example, the semiconductor light-emitting device 1050 includes a first conductive electrode 1156, a first conductive semiconductor layer 1155 on which the first conductive electrode 1156 is formed, an active layer 1154 formed on the first conductive semiconductor layer 1155, a second conductive semiconductor layer 1153 formed on the active layer 1154, and a second conductive electrode 1152 formed on the second conductive semiconductor layer 1153.

In more detail, the first conductive electrode 1156 and the first conductive semiconductor layer 1155 may respectively be a p-type electrode and a p-type semiconductor layer, and the second conductive electrode 1152 and the second conductive semiconductor layer 1153 may respectively be an n-type electrode and an n-type semiconductor layer. However, the present invention is not limited thereto, and a first conductive type may be an n-type and a second conductive type may be a p-type.

In more detail, the first conductive electrode 1156 is formed on one surface of the first conductive semiconductor layer 1155, the active layer 1154 is formed between the other surface of the first conductive semiconductor layer 1155 and one surface of the second conductive semiconductor layer 1153, and the second conductive electrode 1152 is formed on one surface of the second conductive semiconductor layer 1153.

In this case, the second conductive electrode may be disposed on one surface of the second conductive semiconductor layer 1153, and an undoped semiconductor layer 1153a may be formed on the other surface of the second conductive semiconductor layer 1153.

Referring to FIG. 12 along with FIGS. 10 to 11B, the one surface of the second conductive semiconductor layer may be a surface closest to the wiring substrate, and the other surface of the second conductive semiconductor layer may be a surface farthest away from the wiring substrate.

Moreover, the first conductive electrode 1156 and the second conductive electrode 1152 are provided to have a height difference therebetween in a direction (or a thickness direction) vertical to a widthwise direction at a position which is spaced apart from each other along the widthwise direction of the semiconductor light-emitting device.

By using the height difference, the second conductive electrode 1152 is formed on the second conductive semiconductor layer 1153, but is disposed adjacent to the second electrode 1040 located on an upper side of the semiconductor light-emitting device.

In this case, at least a portion of the second conductive electrode 152 may extend from one surface of the second conductive semiconductor layer 1153 to a side surface of the undoped semiconductor layer 1153a and may protrude from the side surface of the undoped semiconductor layer 1153a.

In this manner, since the second conductive electrode 1152 protrudes from the side surface of the undoped semiconductor layer 1153a, the second conductive electrode 1152 may be exposed to an upper side of the semiconductor light-emitting device. Therefore, the second conductive electrode 1152 is disposed at a position overlapping the second electrode 1040 disposed on an upper side of the conductive adhesive layer 1030.

In more detail, the semiconductor light-emitting device includes a protrusion 1152a which extends from the second conductive electrode 1152 and protrudes from a side surface of each of the plurality of semiconductor light-emitting device. In this case, with respect to the protrusion 1152a, the first conductive electrode 1156 and the second conductive electrode 1152 may be disposed at positions spaced apart therefrom along a protrusion direction in which the protrusion 1152a protrudes, and may be expressed as being formed to have a height difference therebetween in a direction vertical to the protrusion direction.

The protrusion 1152a extends from one surface to a side surface of the second conductive semiconductor layer 1153 and extends to a top (in more detail, the undoped semiconductor layer 1153a) of the second conductive semiconductor layer 1153. The protrusion 1152a protrudes from a side surface of the undoped semiconductor layer 1153a along the widthwise direction. Therefore, the protrusion 1152a may be electrically connected to the second electrode 1040 on the reverse of the first conductive electrode with respect to the second conductive semiconductor layer.

A structure including the protrusion 1152a may be a structure capable of using the above-described vertical semiconductor light-emitting device and an advantage of the vertical semiconductor light-emitting device.

The undoped semiconductor layer 1153a may include grooves 1157 which are formed in one surface farthest away from the first conductive electrode 1156. The grooves 1157 may be etched in order for a text to be textured in the one surface farthest away from the first conductive electrode 1156. As a groove is etched in the undoped semiconductor layer 1153a, according to the present invention, texturing may be performed on a surface of the semiconductor light-emitting device.

The above-described semiconductor light-emitting device may be transferred to a transfer head when manufacturing a display device. Therefore, the present invention proposes a transfer head having a new structure for transferring the semiconductor light-emitting device. The transfer head having the new structure has a high electrostatic force by directly electrifying an undoped semiconductor layer based on a Johnsen rahbek type, and precise control of alignment is implemented with only a field of upper view.

Figure 13A:
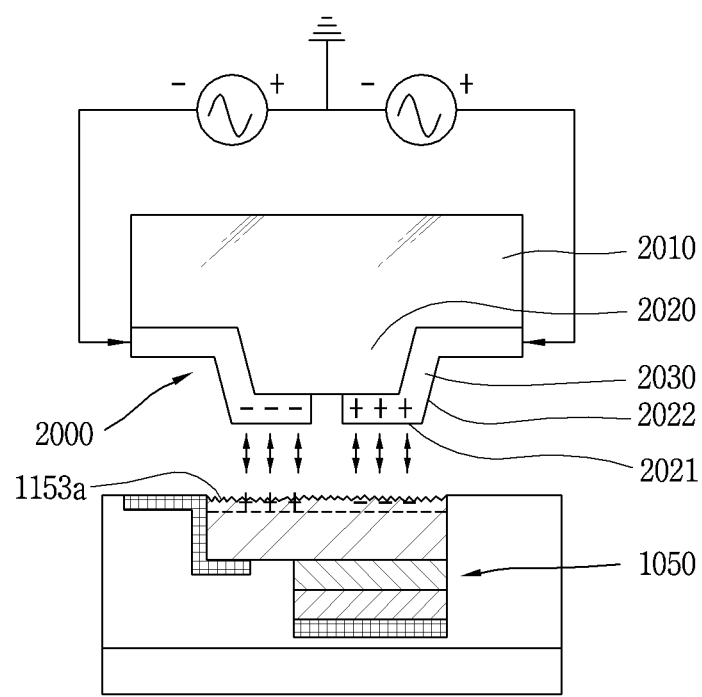
FIGS. 13A and 13B are a cross-sectional view and a perspective view illustrating a transfer head transferring a semiconductor light-emitting device of the present invention.
Figure 13B:
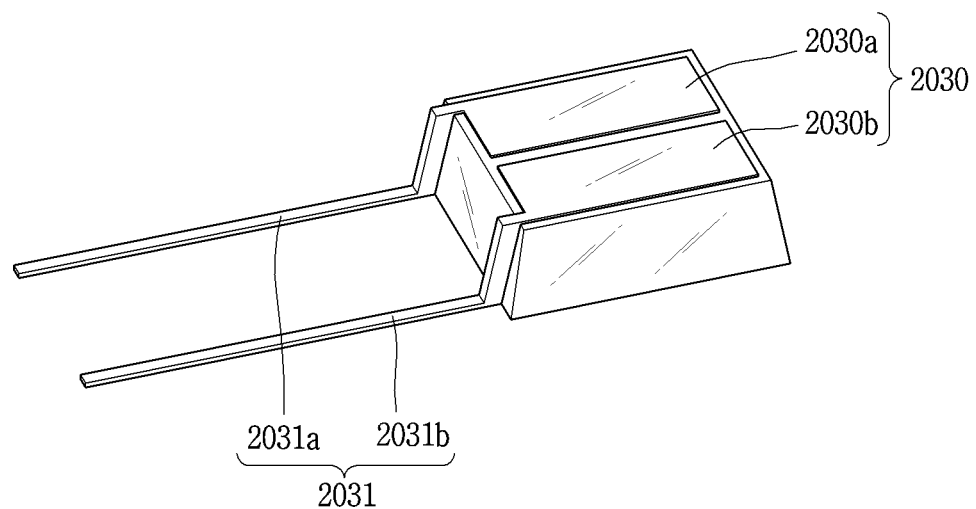
Figure 14:
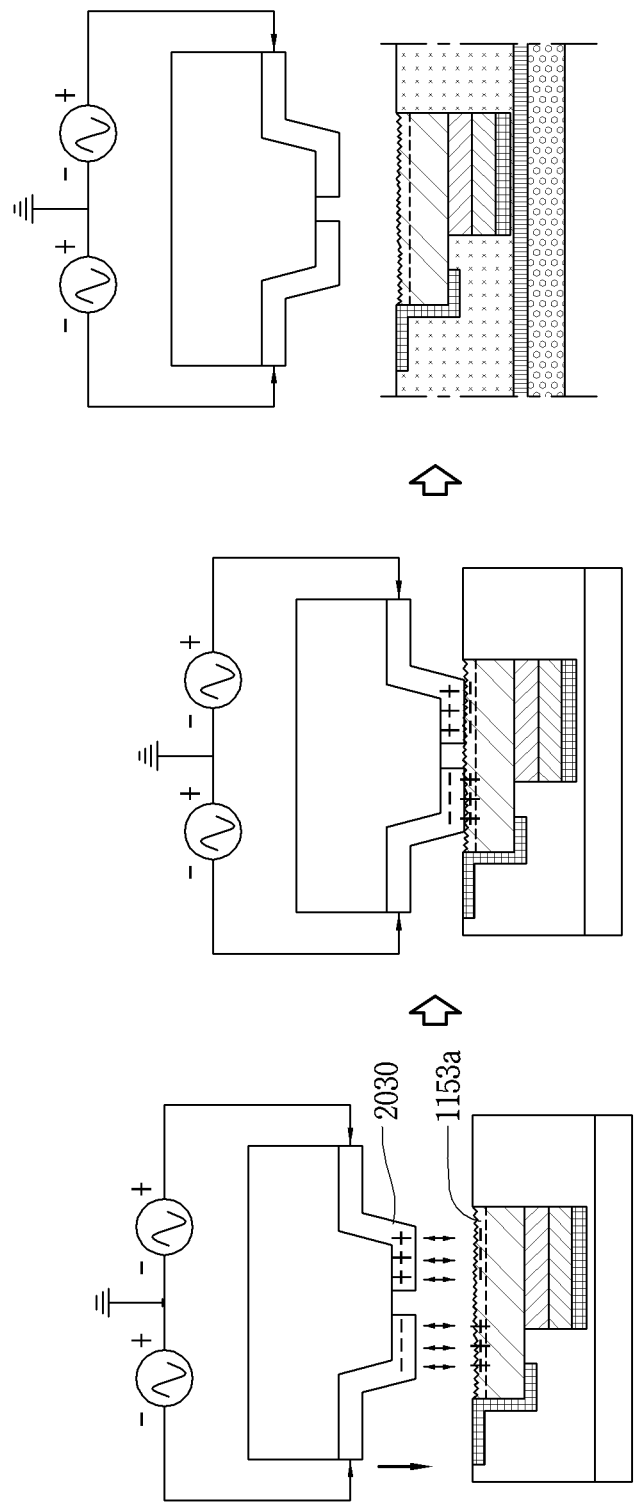
FIG. 14 is a conceptual view illustrating an operation of transferring a semiconductor light-emitting device by using the transfer head of FIG. 13A.

Hereinafter, a structure of a transfer head transferring a semiconductor light-emitting device of the present invention will be described in detail with reference to the accompanying drawings. FIGS. 13A and 13B are a cross-sectional view and a perspective view illustrating a transfer head transferring a semiconductor light-emitting device of the present invention. FIG. 14 is a conceptual view illustrating an operation of transferring a semiconductor light-emitting device by using the transfer head of FIG. 13A.

Referring to FIGS. 13A and 13B, a transfer head 2000 directly electrifies an undoped semiconductor layer 1153a. In more detail, the transfer head 2000 contacts a surface of the undoped semiconductor layer 1153a, and by applying a voltage, the transfer head 2000 induces electrification of the undoped semiconductor layer 1153a, and thus, a semiconductor light-emitting device 1050 is picked up by using a generated electrostatic force.

For example, the transfer head 2000 includes a base substrate 2010, a protrusion 2020, and an electrode unit 2030.

The base substrate 2010 may include, for example, various materials such as ceramic and a polymer. Also, a wiring (not shown) for connecting the transfer head 2000 to an electric device controlling the transfer head 2000 may be included in the base substrate 2010.

According to illustration, the protrusion 2020 protrudes from the base substrate 2010.

In more detail, the protrusion 2020 has a mesa structure including an upper surface 2021 and sidewalls 2022 and may be formed of a material which is the same as or different from that of the base substrate 2010. The mesa structure is a micro-structure and has a size (a width or a height) of 100 μm or less. Also, the protrusion 2020 protrudes in a direction deviating from the base substrate 2010 to provide a contact point for picking up a specific semiconductor light-emitting device in a pickup process.

Moreover, the protrusion 2020 may be formed by removing a portion of the base substrate 2010 through etching for example and may be provided as one body with the base substrate 2010. As another example, the protrusion 2020 may be attached or grown on an upper portion of the base substrate 2010 and may be patterned. The protrusion 2020 may be a patterned oxide layer such as silicon dioxide formed on a semiconductor substrate such as silicon.

In this case, the base substrate 2010 may be formed to have light transmissivity. For example, the base substrate 2010 may be formed of glass, a light-transmitting ceramic material, or the like. In more detail, the base substrate may be formed of a glass material including soda lime having a transmittance of 90% to 99.9%. Since the base substrate 2010 has light transmissivity, the protrusion 2020 may be formed of the same material having light transmissivity or a different material having light transmissivity.

The electrode unit 2030 may include a head electrode 2031 and electrode leads 2032.

The head electrode 2031 is disposed on the protrusion 2020 so that an electrostatic force is generated by electrifying the undoped semiconductor layer 1153a of a semiconductor light-emitting device. In this case, although not shown in the drawing, a passivation layer including silicon oxide or oxide aluminum may be formed between the protrusion 2020 and the head electrode 2031.

According to illustration, a conductive layer may be attached on the protrusion 2020 or the passivation layer and may be patterned for forming the head electrode 2031. Furthermore, in the conductive layer, the electrode leads 2032 may be formed along with the head electrode 2031. The electrode leads 2032 may connect with the head electrode 2031 along an upper surface 2021 and a sidewall 2022 of the protrusion 2020. The head electrode 2031 and the electrode leads 2032 may be formed to have light transmissivity. For example, each of the head electrode 2031 and the electrode leads 2032 is a transparent electrode having a width or a height of 100 μm or less and may include a conductive transparent electrode material such as InSnO or ZnO. As another example, each of the head electrode 2031 and the electrode leads 2032 may be formed of a combination of the transparent electrode material and a conductive material such as Au, Ti, Pt, Ni, Cu, Ag, and/or the like. In this case, each of the head electrode 2031 and the electrode leads 2032 may have semi-transmissivity.

In the present embodiment, the head electrode 2031 is exposed to the outside so as to contact the undoped semiconductor layer 1153a of the semiconductor light-emitting device. In more detail, the head electrode 2031 includes an exposure surface which overlaps a top farthest away from the base substrate 2010 at the protrusion 2020 and is exposed to the outside at the top. The exposure surface may directly contact the undoped semiconductor layer 1153a of the semiconductor light-emitting device in order to pick up the semiconductor light-emitting device and may be an upper surface 2021 of the transfer head.

In this case, each of the base substrate 2010 and the electrode unit 2030 is formed to have light transmissivity, and thus, passes through the base substrate 2010 and the electrode unit 2030 sequentially, whereby at least a portion of the semiconductor light-emitting device can be seen. Accordingly, a field of upper view can be secured when aligning the transfer head and the semiconductor light-emitting device.

The head electrode 2031 is provided as one pair on the protrusion 2020, and thus, the electrode leads 2032 may be provided as one pair. However, the present invention is not limited thereto, and the head electrode may be formed as a single electrode.

As a more detailed example, a first head electrode 2031a and a second head electrode 2031b may be disposed on the protrusion 2020 and may be spaced apart from each other. A first electrode lead 2032a and a second electrode lead 2032b may connect with an electrode disposed on the upper surface 2021 along the sidewall 2022 of the protrusion. Also, an alternating current (AC) voltage source which applied a voltage to the first head electrode 2031a and the second head electrode 2031b may be controlled so that a positive voltage is applied to the second head electrode 2031b at a time when a negative voltage is applied to the first head electrode 2031, and vice versa.

In this case, since the first head electrode 2031a and the second head electrode 2031b are at least formed to have light transmissivity, the first head electrode 2031a and the second head electrode 2031b may sequentially pass through the base substrate, the protrusion, the first head electrode 2031a, and the second head electrode 2031b, and thus, the semiconductor light-emitting device may be photographed. Therefore, the precise control of alignment is possible.

Hereinafter, a detailed operating method of transferring a semiconductor light-emitting device by using the transfer head will be described.

Referring to FIG. 14, in the detailed operating method, a transfer head is adjacent to a semiconductor light-emitting device which is to be gripped, and is aligned. Subsequently, the transfer head contacts the head electrode 2031 and the undoped semiconductor layer 1153a of the semiconductor light-emitting device.

In order for the transfer head and the semiconductor light-emitting device to be aligned, each of a base substrate and an electrode unit has light transmissivity. In this case, alignment of the head electrode and the semiconductor light-emitting device may be precisely controlled by using a camera from an upper portion of the transfer head. In more detail, since the base substrate, the protrusion, the first head electrode 2031a, and the second head electrode 2031b have light transmissivity, and thus, a field of upper view can be secured for alignment.

Subsequently, by applying a voltage causing an electrostatic force, the semiconductor light-emitting device is attached on the head electrode, and then, the semiconductor light-emitting device is picked up. Finally, the transfer head is moved to a place to which the transfer head is to be moved, and then, after a reverse bias is applied, by stopping a bias, the semiconductor light-emitting device is lowered, and then, only a head is raised.

According to the structure of the transfer head described above, a semiconductor light-emitting device may be picked up by directly electrifying the semiconductor light-emitting device including an undoped semiconductor layer based on the Johnsen rahbek type.

Hereinafter, a method of manufacturing a display device including the semiconductor light-emitting device described above with reference to FIG. 12 by using the transfer head described above with reference to FIG. 13A will be described.

FIGS. 15A, 15B, 15C, 15D, 15E, 15F, and 15G are cross-sectional views illustrating a method of manufacturing a display device using a semiconductor light-emitting device by using the transfer head of FIG. 13A.

Figure 15A:
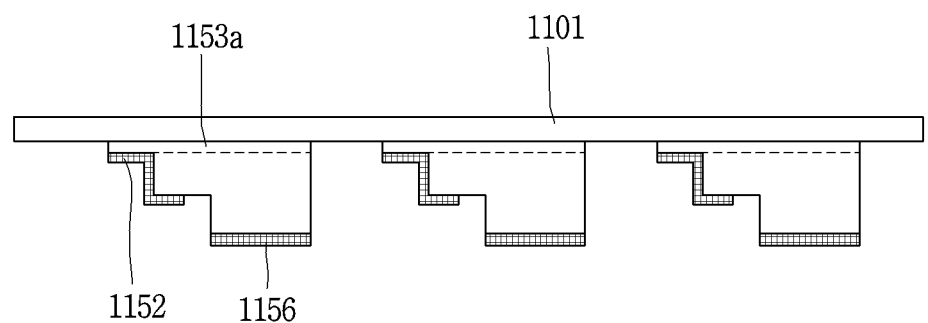
FIGS. 15A, 15B, 15C, 15D, 15E, 15F, and 15G are cross-sectional views illustrating a method of manufacturing a display device using a semiconductor light-emitting device by using the transfer head of FIG. 13A.

First, according to the manufacturing method, an operation of coupling a plurality of semiconductor light-emitting devices to a substrate is performed. For example, a first conductive semiconductor layer, an active layer, and a second conductive semiconductor layer grow on a growth substrate, each of semiconductor light-emitting devices is formed through etching, and a first conductive electrode 1156 and a second conductive electrode 1152 are formed (FIG. 15A).

A growth substrate 1101 (a wafer) may be formed of a material (for example, one of sapphire ($Al_2O_3$), GaN, ZnO, and AlO) having light-transmitting properties, but is not limited thereto. Also, the growth substrate 1101 may be formed of a material (a carrier wafer) suitable for growing a semiconductor material. The growth substrate 1101 may be formed of a material which is good in thermal conductivity, and may use a conductive substrate or an insulating substrate, and for example, may use a SiC substrate having thermal conductivity higher than a sapphire ($Al_2O_3$) substrate or at least one of Si, GaAs, GaP, InP, and $Ga_2O_3$.

The first conductive electrode 1156 and the first conductive semiconductor layer may respectively be a p-type electrode and a p-type semiconductor layer, and the second conductive electrode 1152 and the second conductive semiconductor layer may respectively be an n-type electrode and an n-type semiconductor layer. However, the present invention is not limited thereto, and a first conductive type may be an n-type and a second conductive type may be a p-type.

In this case, as described above, an undoped semiconductor layer 1153a is formed on the second conductive semiconductor layer, and at least a portion of the second conductive electrode 1152 protrudes from a side surface of the undoped semiconductor layer 1153a. Therefore, the semiconductor light-emitting device may be a flip chip type LED where an n-type semiconductor layer is stacked on the undoped semiconductor layer. Also, an n-type electrode connected to the n-type semiconductor layer extends from one surface of the n-type semiconductor layer to a side surface of the undoped semiconductor layer and protrudes from a side surface of the undoped semiconductor layer. In this case, grooves may be formed in a surface of the undoped semiconductor layer facing a head electrode of the transfer head.

Figure 15B:
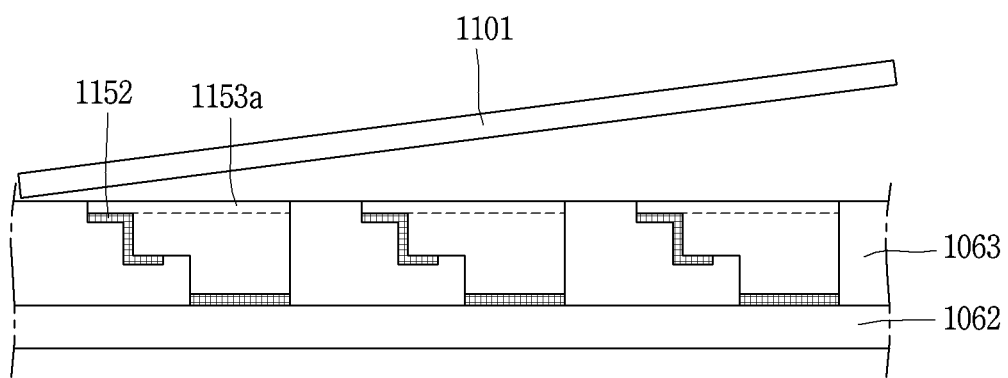

Subsequently, the flip chip type light-emitting device is temporarily coupled to a carrier substrate, and the growth substrate is removed (FIG. 15B).

For example, the growth substrate may be removed by using an LLO process or a CLO process. Particularly, in the LLO process, the undoped semiconductor layer 1153a reduces or prevents damage, caused by a laser, of the second conductive electrode 1152 protruding to the side surface.

However, the present invention is not limited thereto, and the undoped semiconductor layer may be replaced by another type of absorption layer which absorbs a UV laser. The absorption layer may be a buffer layer, may be formed in a low temperature atmosphere, and may be formed of a material for reducing a lattice constant difference between a semiconductor layer and the growth substrate. For example, the absorption layer may include a material such as GaN, InN, AlN, AlInN, InGaN, AlGaN, or InAlGaN.

As illustrated, the carrier substrate 1062 may include an adhesive layer 1063, and the semiconductor light-emitting device may be transferred from the growth substrate 1101 to the adhesive layer 1063.

As another example, the carrier substrate 1062 may be formed of an adhesive sheet formed of a material having viscosity like polydimethylsiloxane (PDMS). Therefore, the carrier substrate 1062 may be referred to as a PDMS substrate. Due to an adhesive force of PDMS, semiconductor light-emitting devices 1050 move to the carrier substrate 1062 after the growth substrate is removed.

Figure 15C:
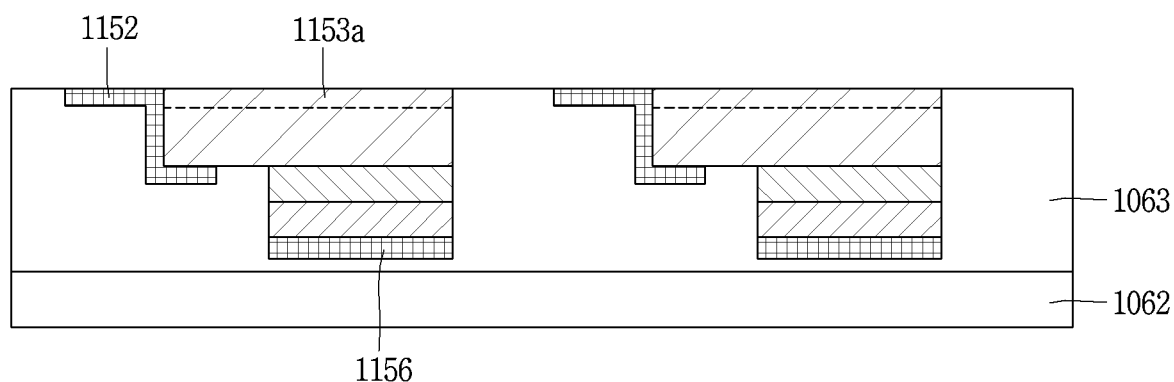

Subsequently, a portion of the undoped semiconductor layer 1153a covering the second conductive electrode 1152 is removed through etching (FIG. 15C). In this case, a portion of the undoped semiconductor layer 1153a still overlaps the second conductive semiconductor layer.

Figure 15D:
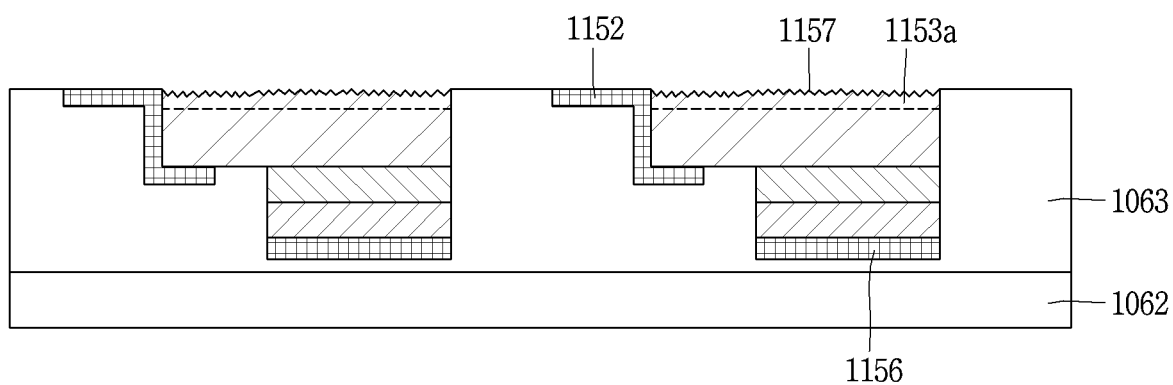

Subsequently, as in FIG. 15D, an operation of forming a groove in the undoped semiconductor layer through etching is performed. For example, grooves 1157 may be etched in order for a text to be textured in the one surface farthest away from the first conductive electrode 1156. As a groove is etched in the undoped semiconductor layer 1153a, texturing may be performed on a surface of the semiconductor light-emitting device.

Subsequently, an operation of transferring the semiconductor light-emitting devices from the carrier substrate 1062 to a base substrate 1070 of a display device is performed.

Figure 15E:
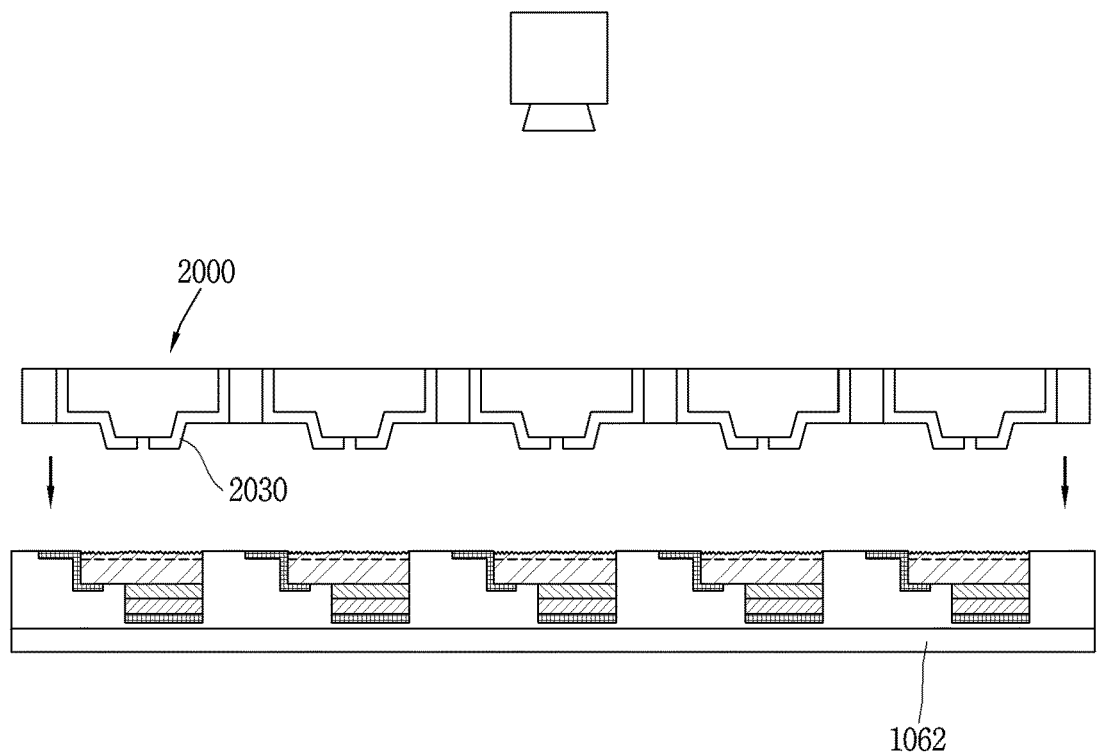

Referring to FIG. 15E, in the transfer operation, a transfer head including an electrode unit is first located to face a semiconductor light-emitting device including an undoped semiconductor layer disposed on a carrier substrate.

Subsequently, the electrode unit of the transfer head is adjacent to the undoped semiconductor layer of the semiconductor light-emitting device, and an exposure surface of the electrode unit contacts the undoped semiconductor layer.

In an operation where the electrode unit is adjacent to the undoped semiconductor layer, a base substrate and the electrode unit may each have light transmissivity in order for the transfer head and the semiconductor light-emitting device to be aligned. As described above, as a detailed example, the base substrate, the protrusion, the first head electrode 2031a, and the second head electrode 2031b may have light transmissivity, and thus, a field of upper view can be secured for alignment.

The transfer head is described with respect to the transfer head described above with reference to FIGS. 13A and 13B, but may be a below-described transfer head of another embodiment. In the present embodiment, the transfer head may be a multi transfer head where the transfer head described above with reference to FIGS. 13A and 13B is arranged in plurality.

For example, the electrode unit may include a plurality of electrodes which are sequentially disposed at predetermined intervals on one surface of the base substrate. Particularly, the transfer head may be arranged in a matrix type so as to correspond to arrangement of the semiconductor light-emitting devices on the carrier substrate.

Figure 15F:
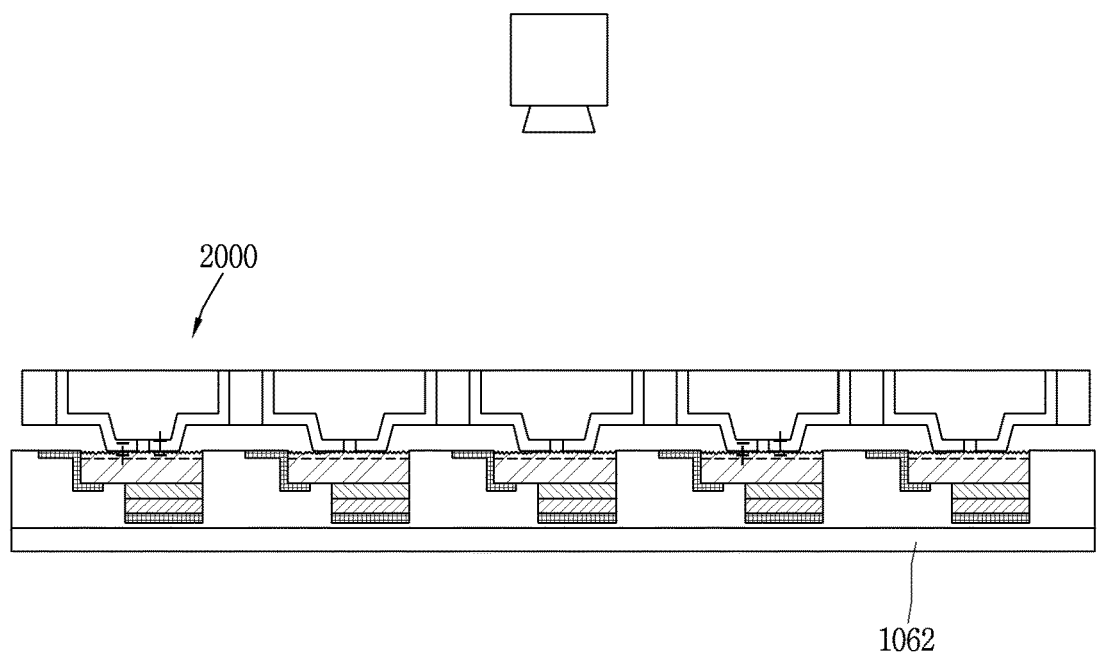

Subsequently, as in FIG. 15F, an operation of applying a voltage to the head electrode 2031 in order for an adhesive force to be applied to the undoped semiconductor layer with an electrostatic force is performed. In this case, the voltage is selectively applied, and thus, the electrostatic force may be applied to only some of the semiconductor light-emitting devices arranged on the carrier substrate 1062. In this manner, the semiconductor light-emitting devices are sequentially arranged on the carrier substrate 1062, and some of the semiconductor light-emitting devices arranged on the carrier substrate 1062 may be selected and picked up.

Figure 15G:
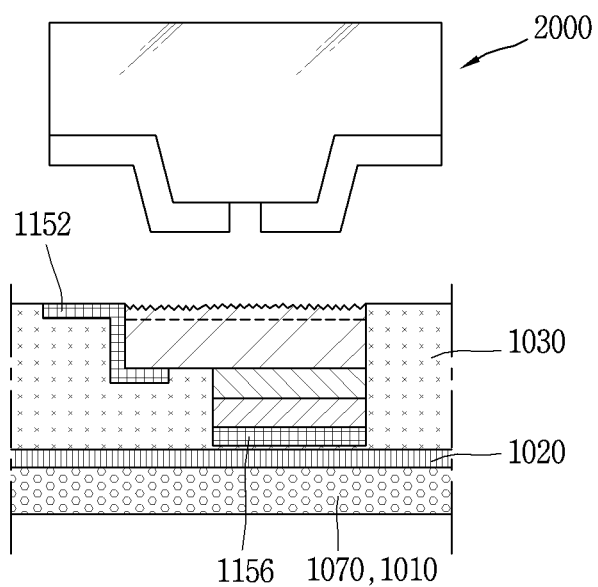

Subsequently, as in FIG. 15G, an operation of picking up the semiconductor light-emitting device to transfer the semiconductor light-emitting device to the transfer head 2000 is performed, and the semiconductor light-emitting devices are selectively picked up and transferred to the base substrate 1070 of a display device.

Subsequently, as in FIG. 15H, the semiconductor light-emitting device is located on the base substrate 1070, and then, the transfer head 2000 stops the application of the voltage to remove the electrostatic force and returns to an original position.

In this case, the semiconductor light-emitting device is at least one of a plurality of semiconductor light-emitting devices, and the semiconductor light-emitting devices may be released on a substrate to form red, green, and blue subpixels.

The base substrate 1070 may be a wiring substrate 1010 on which a wiring electrode is formed, and the semiconductor light-emitting device may be mounted on the base substrate 1070 by using a conductive adhesive layer 1030.

In this case, the wiring electrode may be the above-described first electrode 1020, and the base substrate 1070 may be formed of a flexible material for implementing a flexible display device.

The semiconductor light-emitting devices may be transferred to the base substrate 1070, and then, by applying heat or a catalyst to the conductive adhesive layer 1030, the semiconductor light-emitting devices and the conductive adhesive layer 1030 may be thermally compressed.

However, in the present embodiment, the conductive adhesive layer may be replaced by an adhesive layer. For example, if the first electrode 1020 is not located on a substrate 1010 and is provided as one body with a conductive electrode of a semiconductor light-emitting device, the adhesive layer does not need conductivity.

Subsequently, a second electrode 1040 (see FIG. 11A) may be formed in a direction intersecting the first electrode to connect with the second conductive electrode 1152. The second electrode 1040 is an upper wiring connecting the second conductive electrode 1152 which protrudes, and is directly connected to the second conductive electrode 1152. In this case, the second electrode 1040 may be formed through deposition or the like. Furthermore, an operation of forming a phosphor layer 1080 (see FIG. 10) on one surface of each of a plurality of semiconductor light-emitting devices 1050 may be performed.

Hereinabove, a method of manufacturing a display device of the present invention will be described. A structure of the transfer head of the present invention may be modified into various forms, and various embodiments will be described below.

Figure 16:
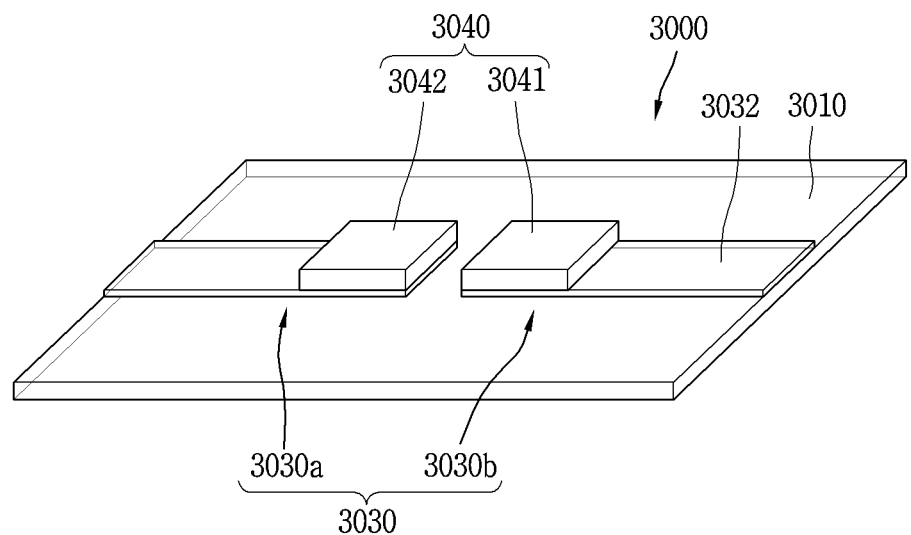
FIGS. 16 and 17 are a cross-sectional view and a perspective view illustrating another embodiment of a transfer head transferring a semiconductor light-emitting device of the present invention.
Figure 17:
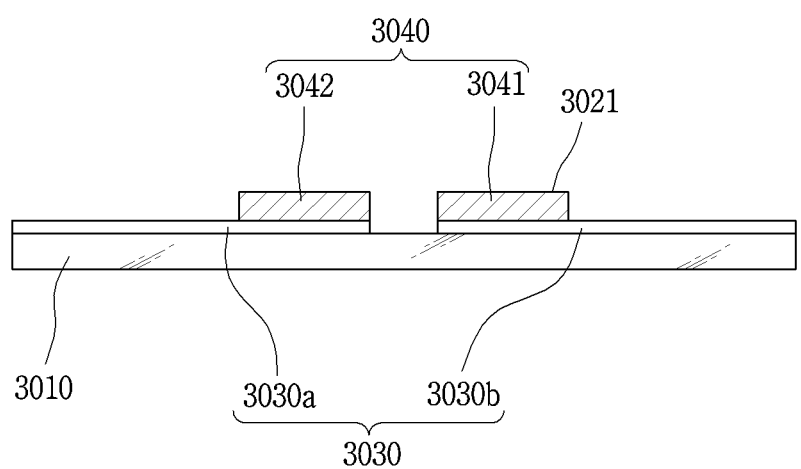

FIGS. 16 and 17 are a cross-sectional view and a perspective view illustrating another embodiment of a transfer head transferring a semiconductor light-emitting device of the present invention.

In the present embodiments, a case where a new structure is applied to the transfer head described above with reference to FIGS. 13A and 13B is described. Therefore, in the present embodiment, elements which are the same as or similar to the elements described above with reference to FIGS. 13A and 13B are referred to by like reference numerals, and the above descriptions are applied to descriptions of the elements.

Referring to the drawings, a transfer head 3000 includes a base substrate 3010, an electrode unit 3030, and a metal block unit 3040.

The base substrate 3010 may be formed to have light transmissivity. For example, the base substrate 3010 may be formed of glass, a light-transmitting ceramic material, or the like. In more detail, the base substrate 3010 may be formed of a glass material including soda lime having a transmittance of 90% to 99.9%. Also, a wiring (not shown) for connecting the transfer head 3000 to an electric device controlling the transfer head 3000 may be included in the base substrate 3010.

Moreover, at least one surface of the base substrate 3010 may be formed as a plane. For example, the base substrate 3010 may be formed as a plate.

According to illustration, the electrode unit 3030 may be disposed on a plane of the base substrate 3010. The electrode unit 3030 may be formed to have light transmissivity.

For example, the electrode unit 3030 may include electrode leads 3032 without a head electrode, and the electrode leads 3032 may be formed to have light transmissivity. For example, each of the electrode leads 3032 is a transparent electrode having a height (a thickness) of 0.1 μm to 2 μm and may include a conductive transparent electrode material such as InSnO or ZnO. A material such as ITO may be deposited to have a thickness of 2 μm or less, and by forming an electrode pattern through etching or laser irradiation, the electrode leads 3032 may be implemented.

As another example, the electrode leads 2032 may be formed of a combination of the transparent electrode material and a conductive material such as Au, Ti, Pt, Ni, Cu, Ag, and/or the like. In this case, the electrode leads 2032 may have semi-transmissivity.

According to illustration, the metal block unit 3040 is disposed in one end of the electrode unit 3030. The metal block unit 3040 may protrude from an end of the electrode unit 3030 in a direction (a thickness direction) passing through one surface of the base substrate 3010. In more detail, the metal block unit 3040 protrudes in a direction deviating from the base substrate 3010 to provide a contact point for picking up a specific semiconductor light-emitting device in a pickup process. A via hole electrically connected to the electrode unit may be formed in the base substrate. Due to such a via hole structure, a bias may be applied to the electrode unit.

The metal block unit 3040 may be formed of metal having light non-transmissivity and may include a first metal block 3041 and a second metal block 3042. As a detailed example, the electrode unit 3030 may include a first electrode 3030a and a second electrode 3030b spaced apart from each other. The first metal block 3041 may be disposed in an end of the first electrode 3030a, and the second metal block 3042 may be disposed in an end of the second electrode 3030b.

The first metal block 3041 and the second metal block 3042 may each have a tetragonal block form where width× height is 50×50 μm and a thickness is 1 μm to 5 μm. Also, an interval between the first metal block 3041 and the second metal block 3042 may be 5 μm to 20 μm.

According to illustration, the first metal block 3041 and the second metal block 3042 are exposed to the outside to contact the undoped semiconductor layer 1153a of the semiconductor light-emitting device. In more detail, each of the first metal block 3041 and the second metal block 3042 includes an upper surface 3021 or an exposure surface exposed to the outside at the top. The exposure surface may directly contact the undoped semiconductor layer 1153a of the semiconductor light-emitting device in order to pick up the semiconductor light-emitting device.

According to the above-described structure, the transfer head implements a high electrostatic force by directly electrifying an undoped semiconductor layer based on a Johnsen rahbek type, and moreover, transfers a semiconductor light-emitting device through precise control.

Moreover, even though the first metal block 3041 and the second metal block 3042 are formed of metal having light non-transmissivity, since the base substrate is a transparent substrate and the electrode unit is a transparent metal electrode, a field of upper view can be secured when aligning the transfer head and the semiconductor light-emitting device. According to such a transparent metal block structure, accurate alignment may be performed through a transparent substrate, and a vision system can be simplified. Therefore, a time taken in manufacturing a display device including the semiconductor light-emitting device can be shortened.

The transfer head of the present embodiment may be modified into various forms.

Figure 18A:
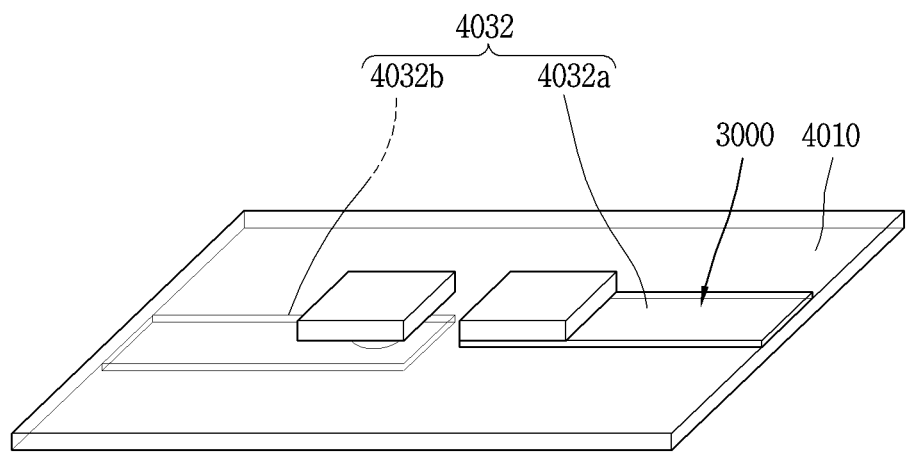
FIGS. 18A and 18B are cross-sectional views illustrating modification examples of the transfer head of FIG. 16.

Referring to FIG. 18A, in the present embodiment, an electrode unit 4030 includes electrode leads 4032 without a head electrode, and the electrode leads 4032 may be disposed on both surfaces of a base substrate 4010. For example, the electrode leads 4032 may include a first electrode lead 4032a and a second electrode lead 4032b spaced apart from each other. One of the first electrode lead 4032a and the second electrode lead 4032b may be disposed on a top of the base substrate 4010, and the other may be disposed on a bottom of the base substrate 4010.

Moreover, in the present embodiment, some of the electrode leads 4032 may be formed to have light transmissivity. For example, one of the first electrode lead 4032a and the second electrode lead 4032b may be formed as a transparent electrode having a height (a thickness) of 0.1 μm to 2 μm, and the other may be formed as an opaque electrode.

The opaque electrode may be formed of, for example, a conductive material such as metal, a metal alloy, a refractory metal, or a refractory metal alloy. For example, the opaque electrode may be formed of a material such as titanium, platinum, silver, or chromium and may be an electrode having a height (a thickness) of 100 μm or less.

Figure 18B:
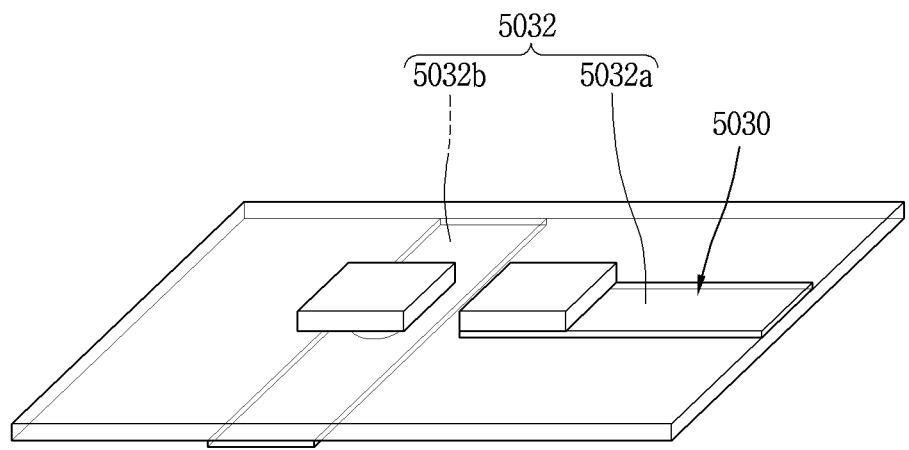

As another example, referring to FIG. 18B, the electrode unit 5030 may include electrode leads 5032 without a head electrode, and the electrode leads 5032 may be arranged in a direction intersecting each other. For example, the electrode leads 5032 includes a first electrode lead 5032a and a second electrode lead 5032b spaced apart from each other, and the first electrode lead 5032a and the second electrode lead 5032b are disposed vertical to each other. In this case, at least one of the first electrode lead 5032a and the second electrode lead 5032b may be formed as a transparent electrode.

In the present embodiment, since the first electrode lead 5032a and the second electrode lead 5032b are vertically arranged, an advantage where a field of upper view is secured at various angles can be obtained.

The present invention proposes a transfer system capable of large-area transfer in a simple structure. The transfer system includes a transfer head and a carrier substrate and will be described below in more detail with reference to the drawings.

Figure 19A:
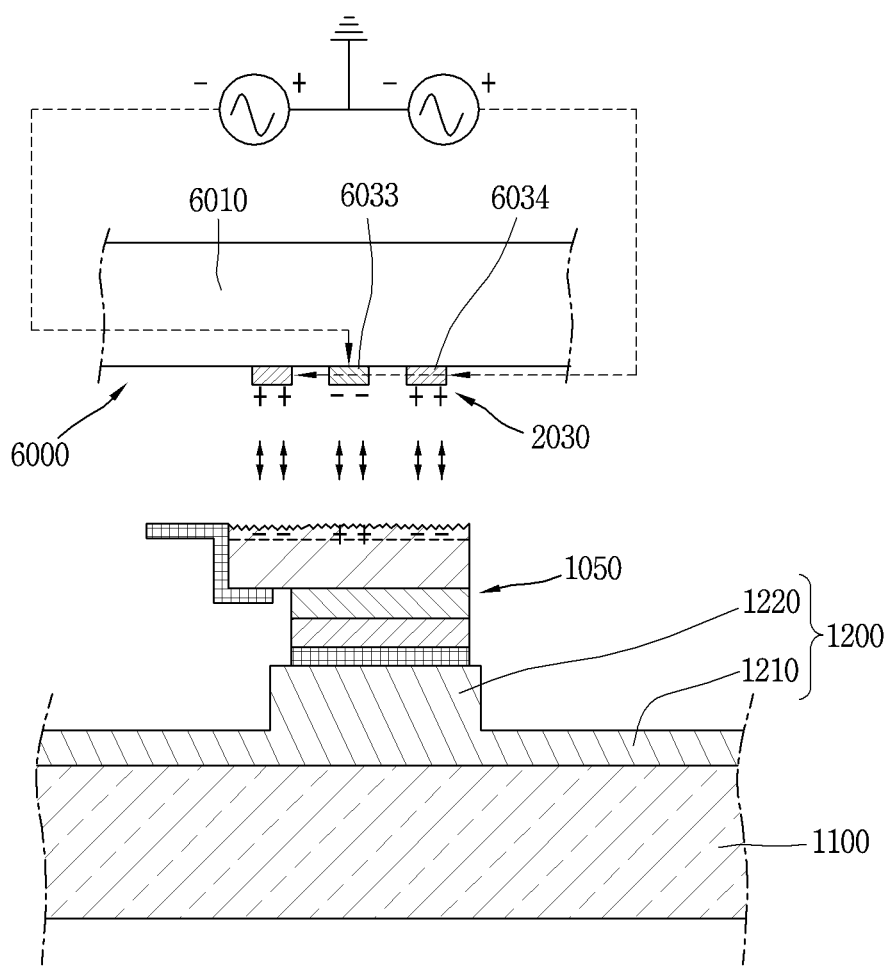
FIGS. 19A and 19B are a cross-sectional view and a perspective view illustrating a transfer head transferring a semiconductor light-emitting device of the present invention.
Figure 19B:
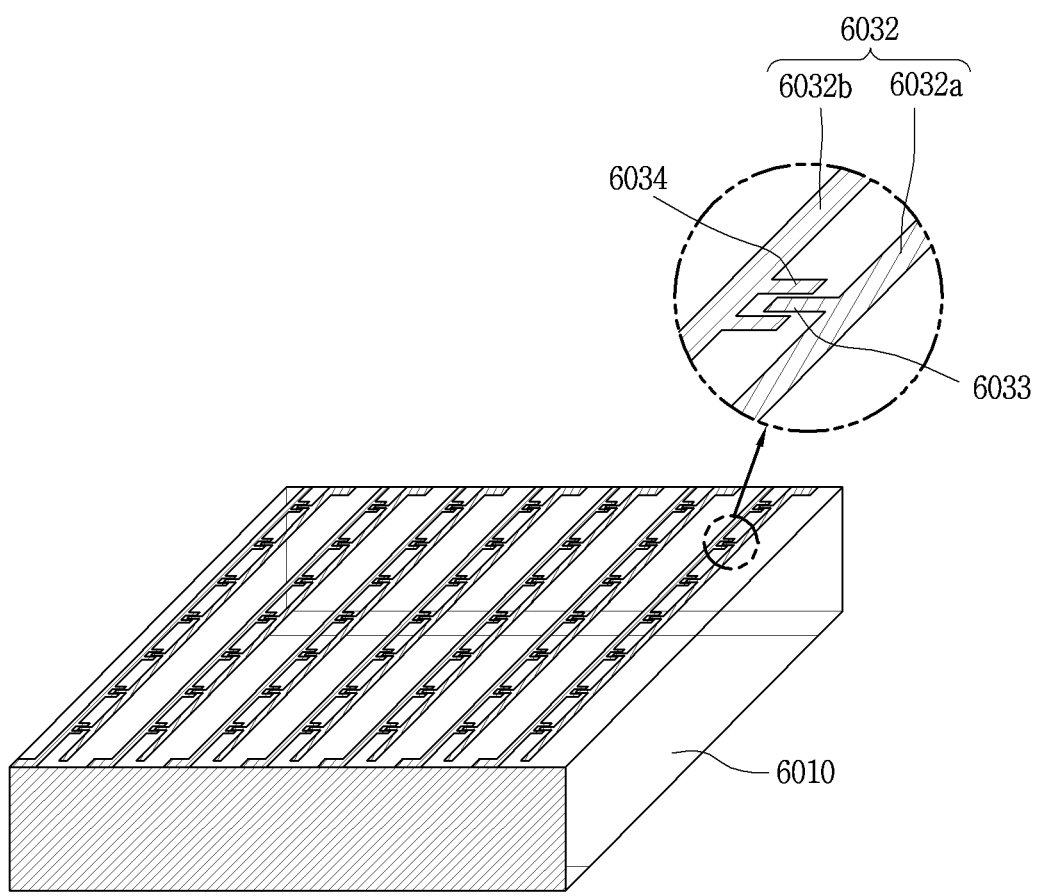
Figure 20:
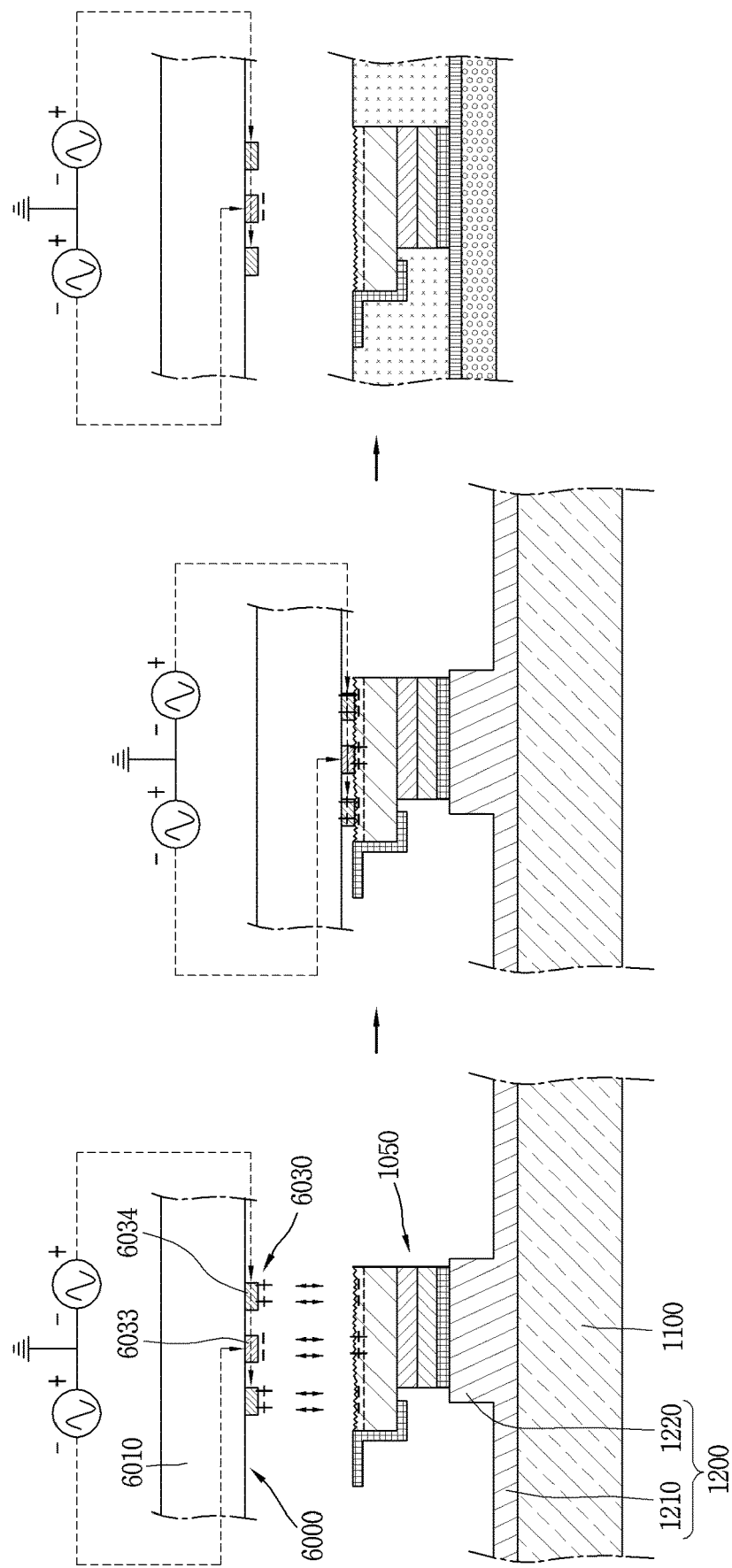
FIG. 20 is a conceptual view illustrating an operation of transferring a semiconductor light-emitting device by using the transfer head of FIG. 19A.

Hereinafter, a structure of a transfer head transferring a semiconductor light-emitting device of the present embodiment will be described in detail with reference to the accompanying drawings. FIGS. 19A and 19B are a cross-sectional view and a perspective view illustrating a transfer head transferring a semiconductor light-emitting device of the present invention, and FIG. 20 is a conceptual view illustrating an operation of transferring a semiconductor light-emitting device by using the transfer head of FIG. 19A.

Referring to FIGS. 19A and 19B, a transfer head 6000 directly electrifies an undoped semiconductor layer 1153a. In more detail, the transfer head 6000 contacts a surface of the undoped semiconductor layer 1153a, and by applying a voltage, the transfer head 6000 induces electrification of the undoped semiconductor layer 1153*a*, and thus, a semiconductor light-emitting device 1050 is picked up by using a generated electrostatic force.

For example, the transfer head 6000 includes a base substrate 6010 and an electrode unit 6030.

The base substrate 6010 may include, for example, various materials such as ceramic and a polymer. Also, a wiring (not shown) for connecting the transfer head 6000 to an electric device controlling the transfer head 6000 may be included in the base substrate 6010.

Moreover, at least one surface of the base substrate 6010 may be formed as a plane. For example, the base substrate 6010 may be formed as a plate, and thus, both surfaces may each be a plane.

The base substrate 6010 may be formed to have light transmissivity. For example, the base substrate 6010 may be formed of glass, a light-transmitting ceramic material, or the like. In more detail, the base substrate 6010 may be formed of a glass material including soda lime having a transmittance of 90% to 99.9%.

According to illustration, the electrode unit 6030 may be disposed on one surface of the base substrate 6010. The electrode unit 6030 may be disposed on a plane of the base substrate so that an electrostatic force is generated by electrifying the undoped semiconductor layer of a semiconductor light-emitting device.

The electrode unit 6030 may include electrode leads 6032, and the electrode leads 6032 may be formed as a plurality of lines on the plane of the base substrate. For example, the electrode leads 6032 includes a first electrode lead 6032*a* and a second electrode lead 6032*b* which are disposed in parallel.

The first electrode lead 6032*a* and the second electrode lead 6032*b* may each be a metal thin film including at least one of Au, Ti, Pt, Ni, Cu, and Ag, or may be a transparent thin film including at least one of InSnO and ZnO. In this case, a height (a thickness) of the metal thin film may be 100 μm or less, and a height (a thickness) of the transparent thin film may be 0.1 μm to 2 μm. In the transparent thin film, a material such as ITO may be deposited to have a thickness of 2 μm or less, and by forming an electrode pattern through etching or laser irradiation, the electrode leads 6032 may be implemented. As another example, the electrode leads 6032 may be formed of a combination of the transparent electrode material and a conductive material such as Au, Ti, Pt, Ni, Cu, Ag, and/or the like. In this case, each of the electrode leads 6032 may have semi-transmissivity.

According to illustration, the first electrode lead 6032*a* and the second electrode lead 6032*b* extend in one direction on the plane and are sequentially disposed in another direction vertical to the one direction. In more detail, the first electrode lead 6032*a* and the second electrode lead 6032*b* may be alternately disposed at specific intervals in the other direction.

Moreover, at least one of the first electrode lead 6032*a* and the second electrode lead 6032*b* may extend to a side surface of the base substrate. For example, the first electrode lead 6032*a* may extend to an opposite surface of the plane via the side surface and may be electrically connected to a power supply. Also, the second electrode lead 6032*b* may extend to the opposite surface via the side surface and may be electrically connected to the power supply.

According to illustration, a plurality of protrusion electrodes 6033 and 6034 may be formed for providing a contact point for picking up a specific semiconductor light-emitting device. For example, the plurality of protrusion electrodes 6033 and 6034 may be respectively formed in the first electrode lead 6032*a* and the second electrode lead 6032*b* so as to selectively pick up a plurality of semiconductor light-emitting devices with an electrostatic force.

In more detail, a plurality of first protrusion electrodes 6033 are sequentially disposed at predetermined intervals in the first electrode lead 6032*a*, and a plurality of second protrusion electrodes 6034 are sequentially disposed at predetermined intervals in the second electrode lead 6032*b*. The plurality of first protrusion electrodes 6033 are included in the first electrode lead 6032*a* and are sequentially disposed at specific intervals. Also, the plurality of second protrusion electrodes 6034 are included in the second electrode lead 6032*b* and are sequentially disposed at specific intervals. In this case, in the first electrode lead 6032*a*, the first protrusion electrodes 6033 protrude toward the second electrode lead 6032*b*, and in the second electrode lead 6032*b*, the second protrusion electrodes 6034 protrude toward the first electrode lead 6032*a*.

Here, the first protrusion electrodes 6033 and the second protrusion electrodes 6034 may be formed of the same material as the first electrode lead 6032*a* and the second electrode lead 6032*b* and may be formed to have a pattern integrated with the first electrode lead 6032*a* and the second electrode lead 6032*b*.

In the present embodiment, the first protrusion electrodes 6033 and the second protrusion electrodes 6034 are exposed to the outside to contact the undoped semiconductor layer 1153*a* of the semiconductor light-emitting device. In more detail, the first protrusion electrodes 6033 and the second protrusion electrodes 6034 include an exposure surface exposed to the outside at a plane of the base substrate 6010. The exposure surface may directly contact the undoped semiconductor layer 1153*a* of the semiconductor light-emitting device in order to pick up the semiconductor light-emitting device and may be an upper surface of the transfer head.

According to illustration, at least one of the first protrusion electrodes 6033 and at least one of the second protrusion electrodes 6034 are provided as one pair to generate an electrostatic force between a corresponding protrusion electrode and a semiconductor light-emitting device. An AC voltage source which applies a voltage to the pair of first protrusion electrode and second protrusion electrode applies a positive voltage to the second protrusion electrode at a time when a negative voltage is applied to the first protrusion electrode, thereby generating the electrostatic force. In this case, the transfer head may be controlled in order for a voltage to be applied in reverse.

In this case, since each of the base substrate 6010 and the electrode unit 6030 is formed to have light transmissivity, the semiconductor light-emitting device sequentially passes through the base substrate 6010 and the electrode unit 6030, and thus, at least a portion of the base substrate 6010 and the electrode unit 6030 can be shown. Accordingly, a field of upper view can be secured when aligning the transfer head and the semiconductor light-emitting device.

Hereinafter, a detailed operating method of transferring a semiconductor light-emitting device by using the transfer head will be described.

Referring to FIGS. 19A and 20, in the detailed operating method, a transfer head is adjacent to a semiconductor light-emitting device which is to be gripped, and is aligned. Subsequently, the transfer head contacts a plurality of protrusion electrodes and the undoped semiconductor layer 1153*a* of the semiconductor light-emitting device.

At this time, the semiconductor light-emitting device may be disposed on a carrier substrate 1100. According to illustration, a positioning member 1200 on which the semiconductor light-emitting device is positioned may be mounted on one surface of carrier substrate 1100. In this case, the carrier substrate 1100 may be formed of a material such as Si, glass, ceramic, or the like, and the positioning member may be formed of at least one of PDMS, silicon, and acrylic.

The positioning member 1200 includes a base part 1210 and a positioning projection 1220.

The base part 1210 is a part overlapping one surface of the carrier substrate and may be formed of a material different from the carrier substrate. The positioning projections 1220 protrude from the base part and are sequentially disposed at predetermined intervals. The semiconductor light-emitting device is temporarily positioned on the positioning projection 1220.

Subsequently, by applying a voltage causing an electrostatic force, the semiconductor light-emitting device is attached on the head electrode, and then, the semiconductor light-emitting device is picked up. Finally, the transfer head is moved to a place to which the transfer head is to be moved, and then, after a reverse bias is applied, by stopping a bias, the semiconductor light-emitting device is lowered, and then, only a head is raised.

According to the structure of the transfer head described above, a semiconductor light-emitting device may be picked up by directly electrifying the semiconductor light-emitting device including an undoped semiconductor layer based on the Johnsen rahbek type.

Hereinafter, a method of manufacturing a display device including the semiconductor light-emitting device described above with reference to FIG. 12 by using the transfer head described above with reference to FIG. 19A will be described.

FIGS. 21A, 21B, 21C, 21D, 21E, 21F, 21G, 21H, and 21I are cross-sectional views illustrating a method of manufacturing a display device using a semiconductor light-emitting device by using the transfer head of FIG. 19A.

Figure 21A:
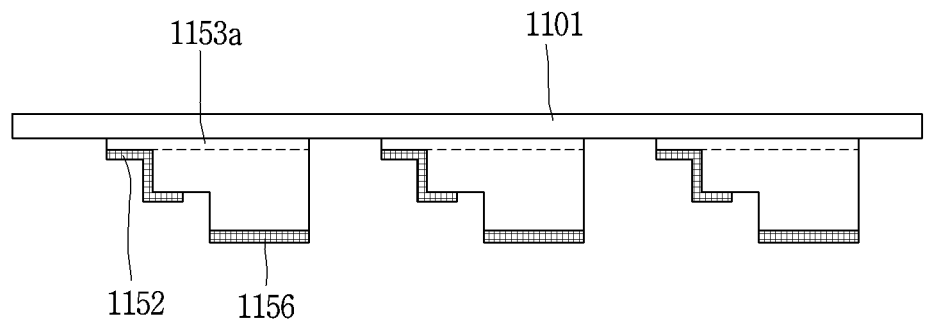
FIGS. 21A, 21B, 21C, 21D, 21E, 21F, 21G, 21H, and 21I are cross-sectional views illustrating a method of manufacturing a display device using a semiconductor light-emitting device by using the transfer head of FIG. 19A.

First, according to the manufacturing method, an operation of coupling a plurality of semiconductor light-emitting devices to a substrate is performed. For example, a first conductive semiconductor layer, an active layer, and a second conductive semiconductor layer grow on a growth substrate, each of semiconductor light-emitting devices is formed through etching, and a first conductive electrode 1156 and a second conductive electrode 1152 are formed (FIG. 21A).

A growth substrate 1101 (a wafer) may be formed of a material (for example, one of sapphire (Al$_2$O$_3$), GaN, ZnO, and AlO) having light-transmitting properties, but is not limited thereto. Also, the growth substrate 1101 may be formed of a material (a carrier wafer) suitable for growing a semiconductor material. The growth substrate 1101 may be formed of a material which is good in thermal conductivity, and may use a conductive substrate or an insulating substrate, and for example, may use a SiC substrate having thermal conductivity higher than a sapphire (Al$_2$O$_3$) substrate or at least one of Si, GaAs, GaP, InP, and Ga$_2$O$_3$.

The first conductive electrode 1156 and the first conductive semiconductor layer may respectively be a p-type electrode and a p-type semiconductor layer, and the second conductive electrode 1152 and the second conductive semiconductor layer may respectively be an n-type electrode and an n-type semiconductor layer. However, the present invention is not limited thereto, and a first conductive type may be an n-type and a second conductive type may be a p-type.

In this case, as described above, an undoped semiconductor layer 1153a is formed on the second conductive semiconductor layer, and at least a portion of the second conductive electrode 1152 protrudes from a side surface of the undoped semiconductor layer 1153a. Therefore, the semiconductor light-emitting device may be a flip chip type LED where an n-type semiconductor layer is stacked on the undoped semiconductor layer. Also, an n-type electrode connected to the n-type semiconductor layer extends from one surface of the n-type semiconductor layer to a side surface of the undoped semiconductor layer and protrudes from a side surface of the undoped semiconductor layer. In this case, grooves may be formed in a surface of the undoped semiconductor layer facing a head electrode of the transfer head.

Figure 21B:
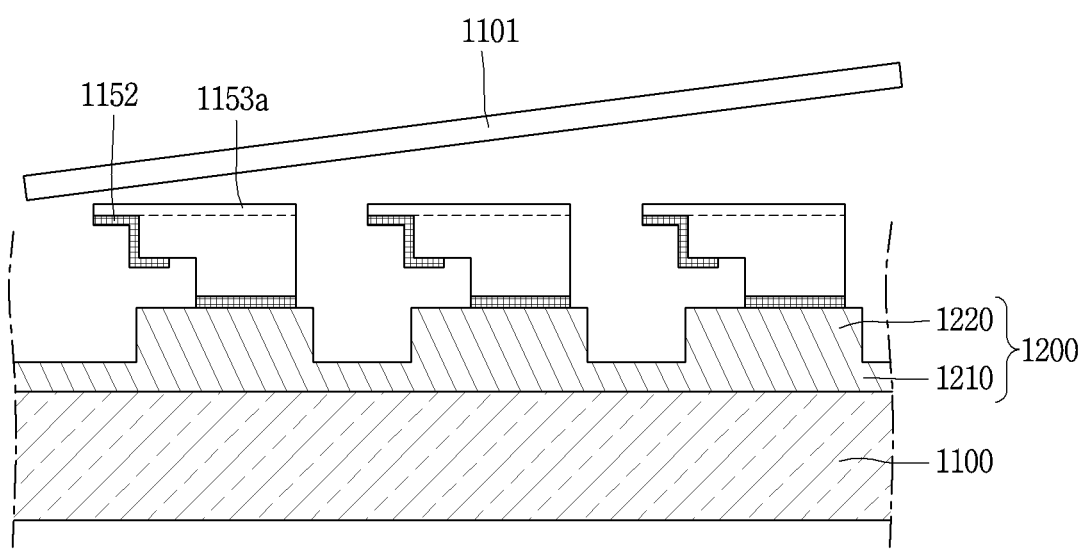

Subsequently, the flip chip type light-emitting device is temporarily coupled to a carrier substrate, and the growth substrate is removed (FIG. 21B).

For example, the growth substrate may be removed by using an LLO process or a CLO process. Particularly, in the LLO process, the undoped semiconductor layer 1153a reduces or prevents damage, caused by a laser, of the second conductive electrode 1152 protruding to the side surface.

However, the present invention is not limited thereto, and the undoped semiconductor layer may be replaced by another type of absorption layer which absorbs a UV laser. The absorption layer may be a buffer layer, may be formed in a low temperature atmosphere, and may be formed of a material for reducing a lattice constant difference between a semiconductor layer and the growth substrate. For example, the absorption layer may include a material such as GaN, InN, AlN, AlInN, InGaN, AlGaN, or InAlGaN.

As illustrated, the carrier substrate 1100 may include a positioning member 1200, and the semiconductor light-emitting device may be transferred from the growth substrate 1101 to the positioning member 1200.

As another example, the positioning member 1200 may be formed of an adhesive sheet formed of a material having viscosity like polydimethylsiloxane (PDMS). Therefore, the carrier substrate 1100 may be referred to as a PDMS substrate. Due to an adhesive force of PDMS, semiconductor light-emitting devices 1050 move to the carrier substrate 1100 after the growth substrate is removed.

Figure 21C:
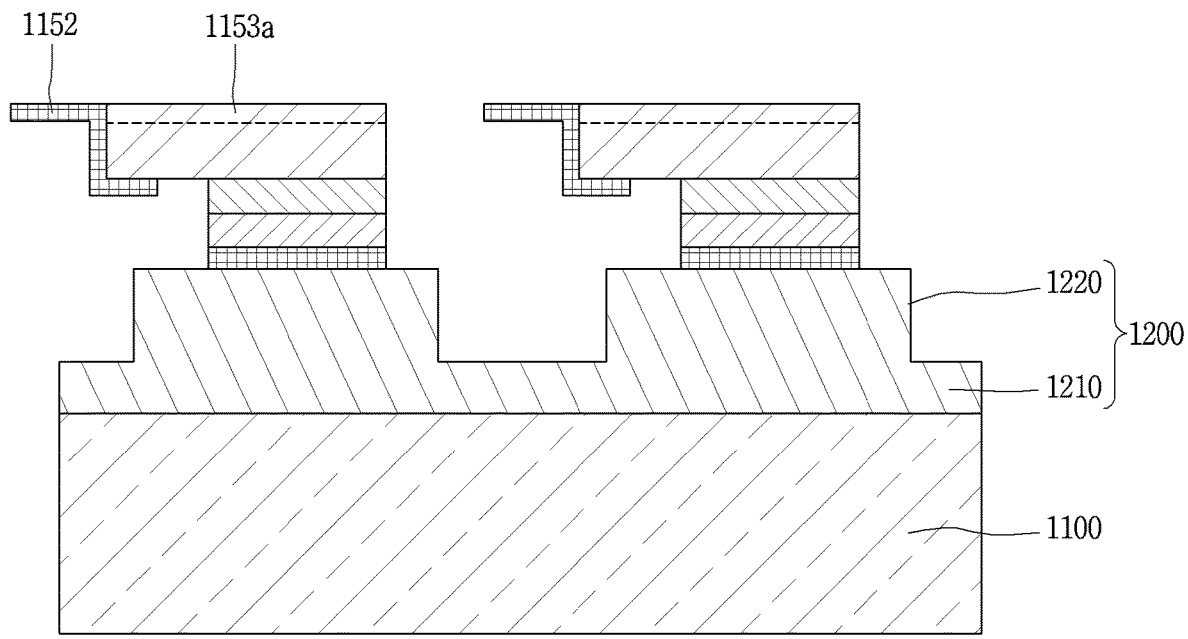

Subsequently, a portion of the undoped semiconductor layer 1153a covering the second conductive electrode 1152 is removed through etching (FIG. 21C). In this case, a portion of the undoped semiconductor layer 1153a still overlaps the second conductive semiconductor layer.

Figure 21D:
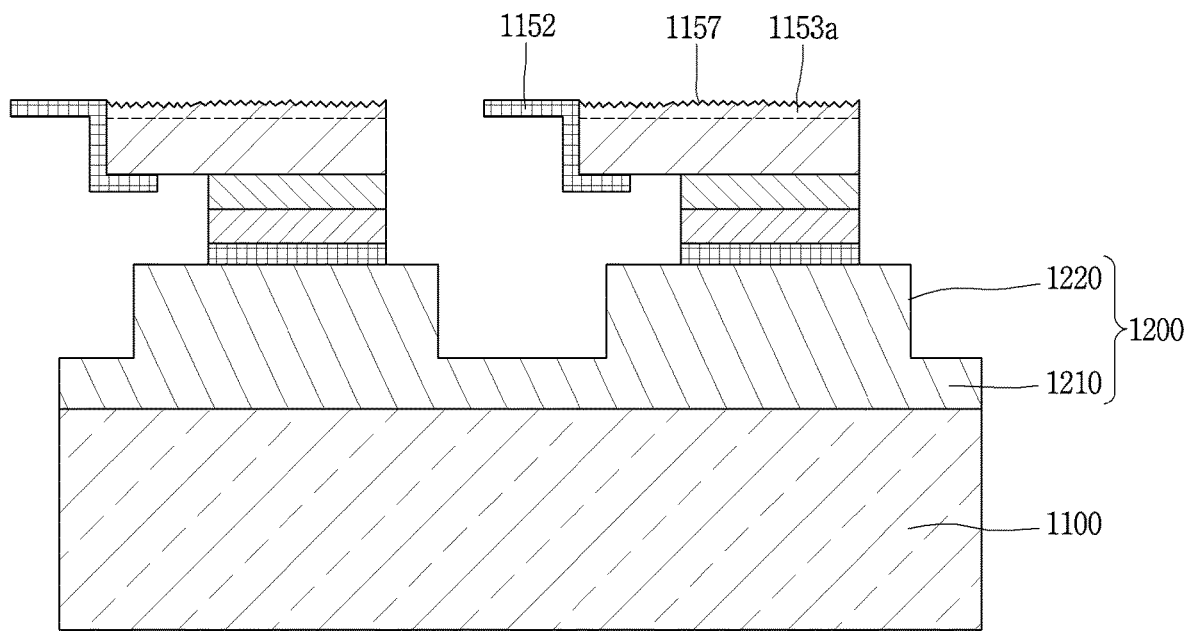

Subsequently, as in FIG. 21D, an operation of forming a groove in the undoped semiconductor layer through etching is performed. For example, grooves 1157 may be etched in order for a text to be textured in the one surface farthest away from the first conductive electrode 1156. As a groove is etched in the undoped semiconductor layer 1153a, texturing may be performed on a surface of the semiconductor light-emitting device.

Subsequently, an operation of transferring the semiconductor light-emitting devices from the carrier substrate 1100 to a wiring substrate 1010 of a display device is performed.

Figure 21E:
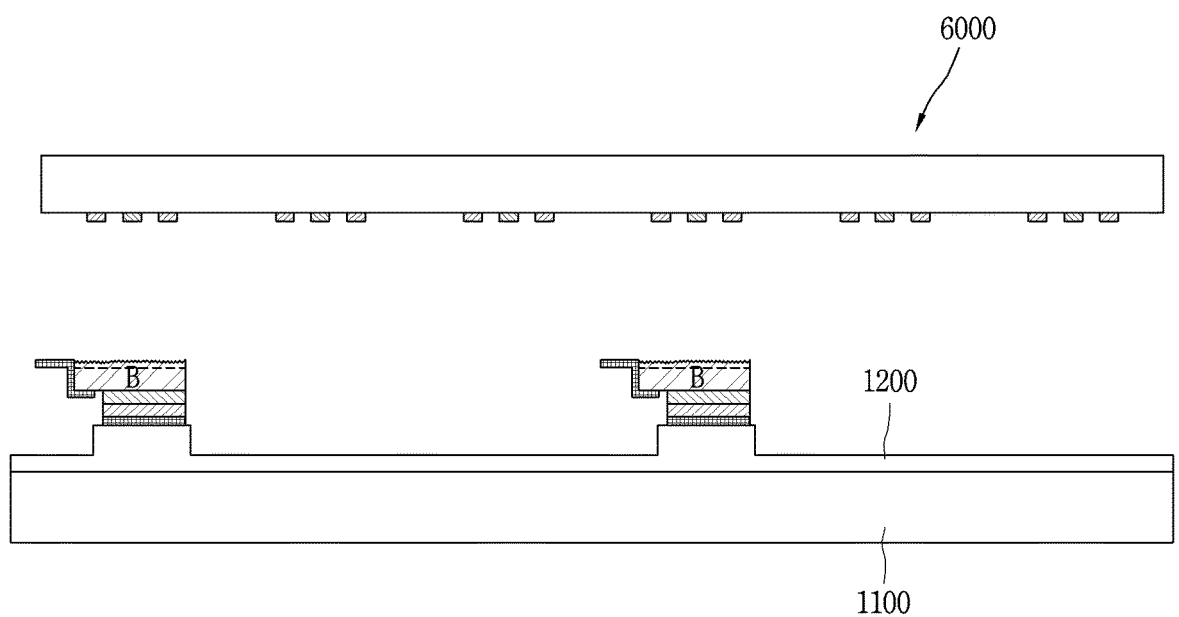

Referring to FIG. 21E, in the transfer operation, a transfer head including an electrode unit is first located to face a semiconductor light-emitting device including an undoped semiconductor layer disposed on a carrier substrate.

Subsequently, the electrode unit of the transfer head is adjacent to the undoped semiconductor layer of the semiconductor light-emitting device, and an exposure surface of the electrode unit contacts the undoped semiconductor layer.

In an operation where the electrode unit is adjacent to the undoped semiconductor layer, protrusion electrodes of the transfer head and the semiconductor light-emitting device are aligned.

The transfer head is described with respect to the transfer head described above with reference to FIGS. 19A and 19B, but may be a below-described transfer head of another embodiment.

Subsequently, an operation of applying a voltage to the protrusion electrode in order for an adhesive force to be applied to the undoped semiconductor layer with an electrostatic force is performed. In this case, the voltage is selectively applied, and thus, the electrostatic force may be applied to only some of the semiconductor light-emitting devices arranged on the carrier substrate 1100. In this manner, the semiconductor light-emitting devices are sequentially arranged on the carrier substrate 1100, and some of the semiconductor light-emitting devices arranged on the carrier substrate 1100 may be selected and picked up.

Figure 21F:
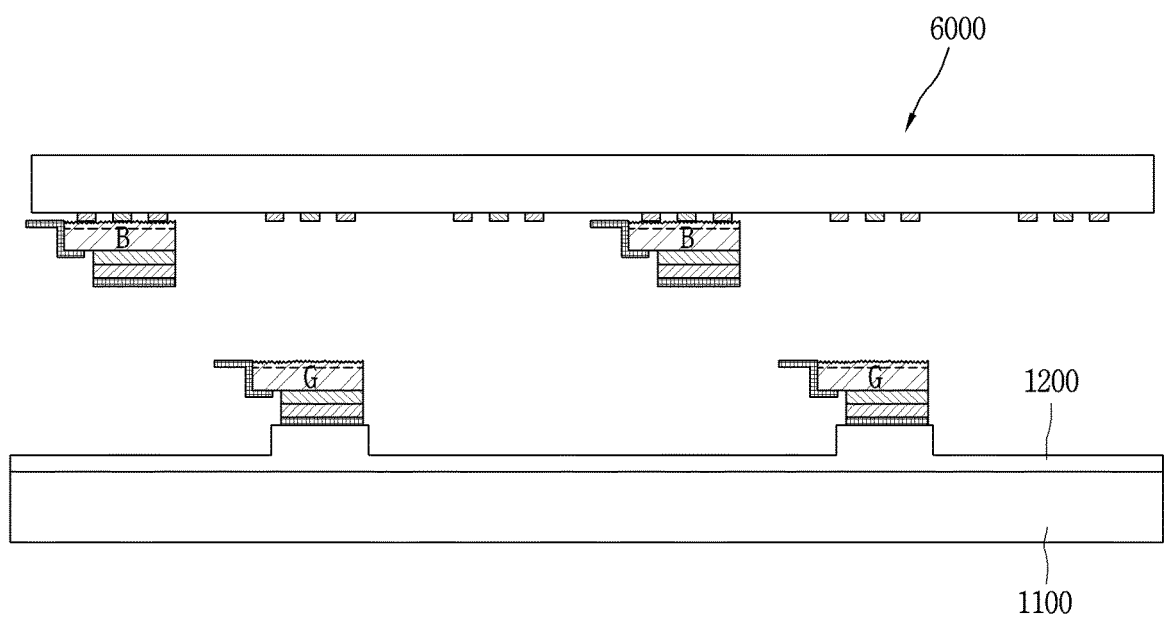
Figure 21G:
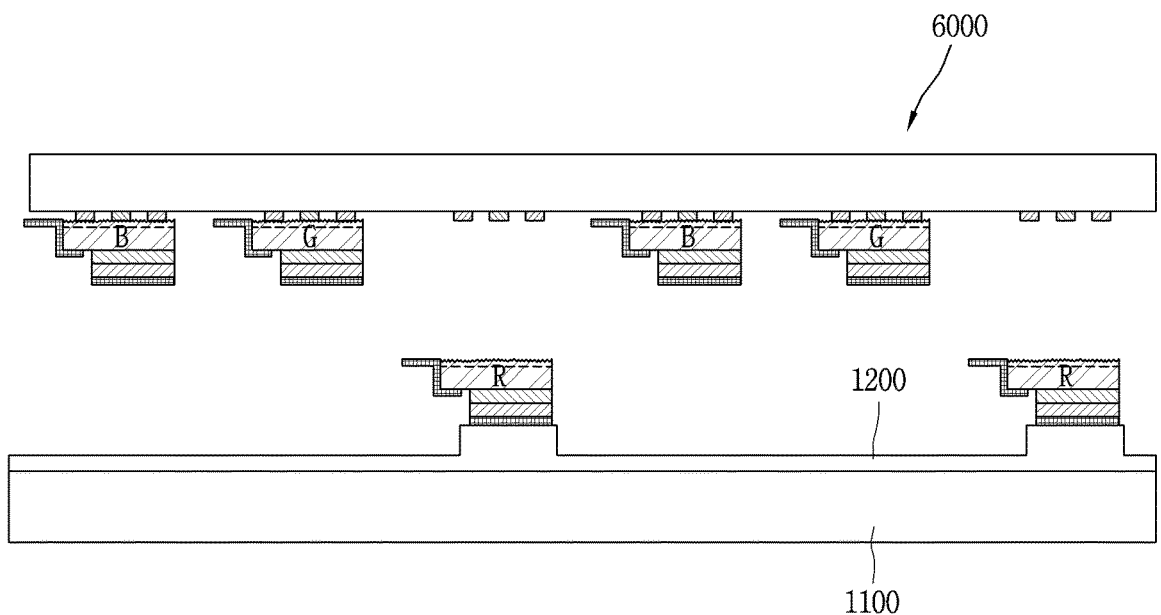

Subsequently, as in FIGS. 21F and 21G, a semiconductor light-emitting device having a different color may be picked up by using the above-described method. For example, after a blue semiconductor light-emitting device is picked up, a green semiconductor light-emitting device may be additionally picked up in a process of FIG. 21F, and a red semiconductor light-emitting device may be additionally picked up in a process of FIG. 21G.

Therefore, blue, green, and red semiconductor light-emitting devices may configure one pixel and may be picked up to the transfer head.

Figure 21H:
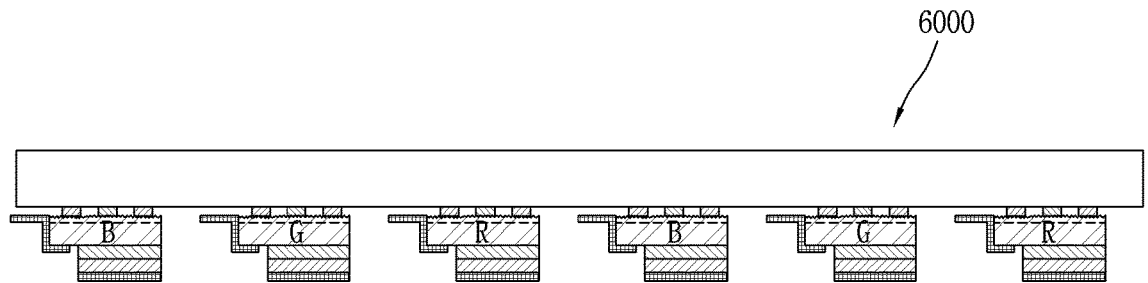

Subsequently, as in FIG. 21H, an operation of transferring the semiconductor light-emitting device to transfer the semiconductor light-emitting device to the transfer head 6000 is performed, and the semiconductor light-emitting devices are selectively picked up and transferred to the base substrate 1070 of a display device.

Figure 21I:
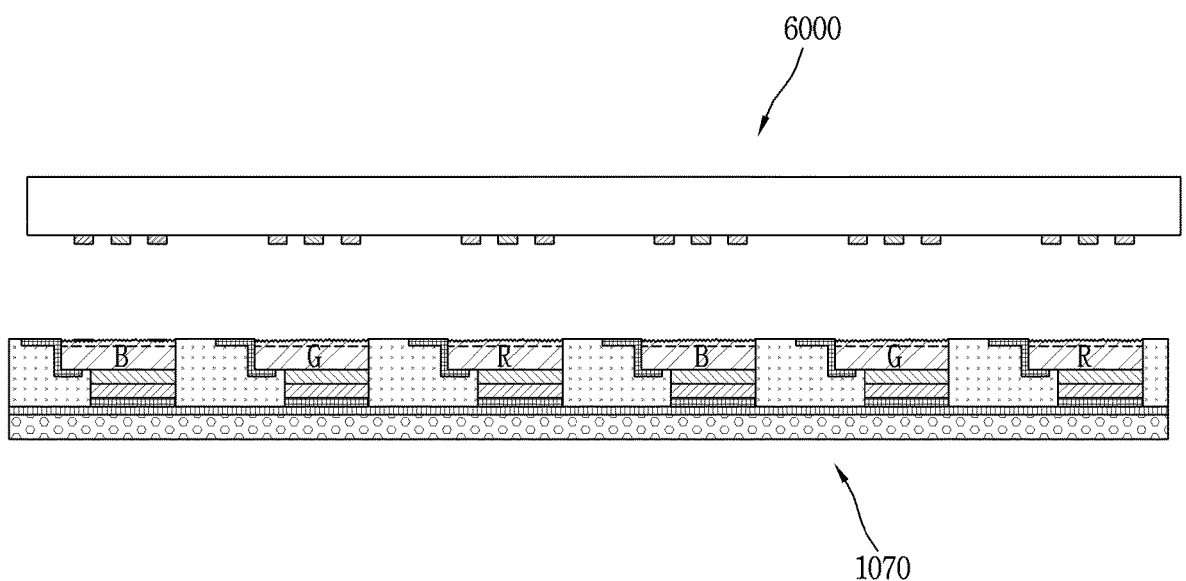

Subsequently, as in FIG. 21I, the semiconductor light-emitting device is located on the base substrate 1070, and then, the transfer head 6000 stops the application of the voltage to remove the electrostatic force and returns to an original position.

In this case, the semiconductor light-emitting device is at least one of a plurality of semiconductor light-emitting devices, and the semiconductor light-emitting devices may be released on a substrate to form red, green, and blue subpixels.

The base substrate 1070 may be a wiring substrate 1010 on which a wiring electrode is formed, and the semiconductor light-emitting device may be mounted on the base substrate 1070 by using a conductive adhesive layer 1030.

In this case, the wiring electrode may be the above-described first electrode 1020, and the base substrate 1070 may be formed of a flexible material for implementing a flexible display device.

The semiconductor light-emitting devices may be transferred to the base substrate 1070, and then, by applying heat or a catalyst to the conductive adhesive layer 1030, the semiconductor light-emitting devices and the conductive adhesive layer 1030 may be thermally compressed.

However, in the present embodiment, the conductive adhesive layer may be replaced by an adhesive layer. For example, if the first electrode 1020 is not located on a substrate 1010 and is provided as one body with a conductive electrode of a semiconductor light-emitting device, the adhesive layer does not need conductivity.

Subsequently, a second electrode 1040 (see FIG. 11A) may be formed in a direction intersecting the first electrode to connect with the second conductive electrode 1152. The second electrode 1040 is an upper wiring connecting the second conductive electrode 1152 which protrudes, and is directly connected to the second conductive electrode 1152.

In this case, the second electrode 1040 may be formed through deposition or the like. Furthermore, an operation of forming a phosphor layer 1080 (see FIG. 10) on one surface of each of a plurality of semiconductor light-emitting devices 1050 may be performed.

Hereinabove, a method of manufacturing a display device of the present invention will be described. A structure of the transfer head of the present invention may be modified into various forms, and various embodiments will be described below.

Figure 22:
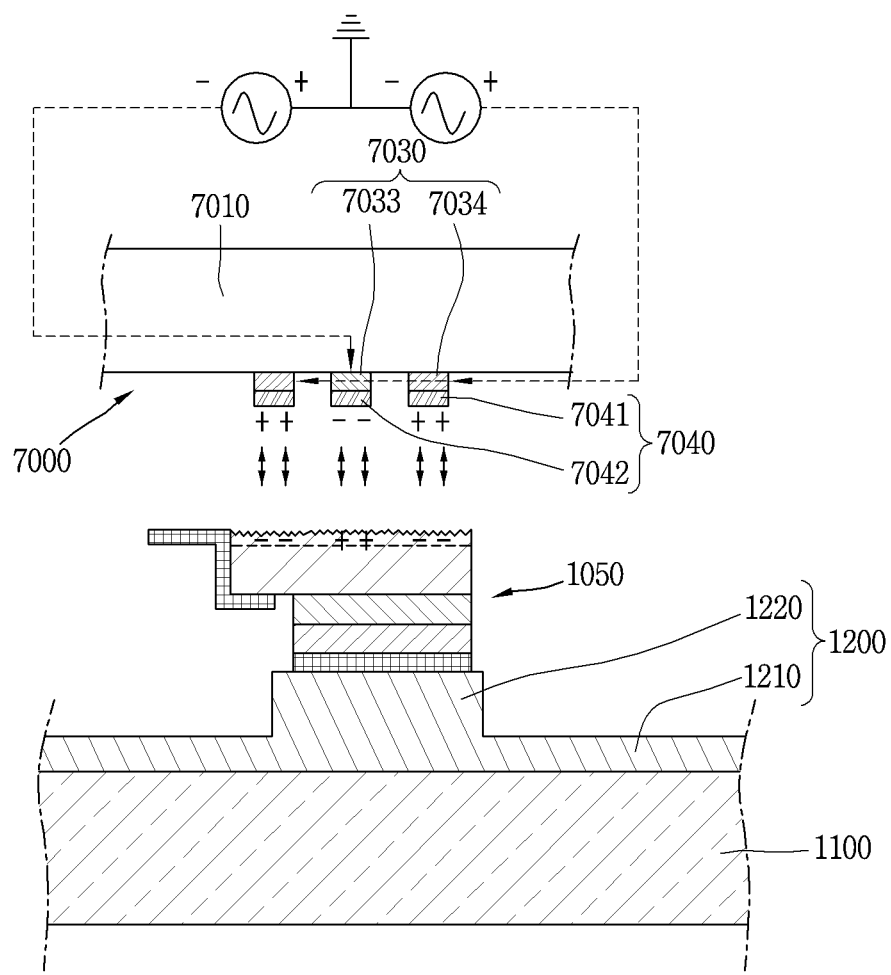
FIGS. 22 and 23 are a cross-sectional view and a perspective view illustrating another embodiment of a transfer head transferring a semiconductor light-emitting device of the present invention.
Figure 23:
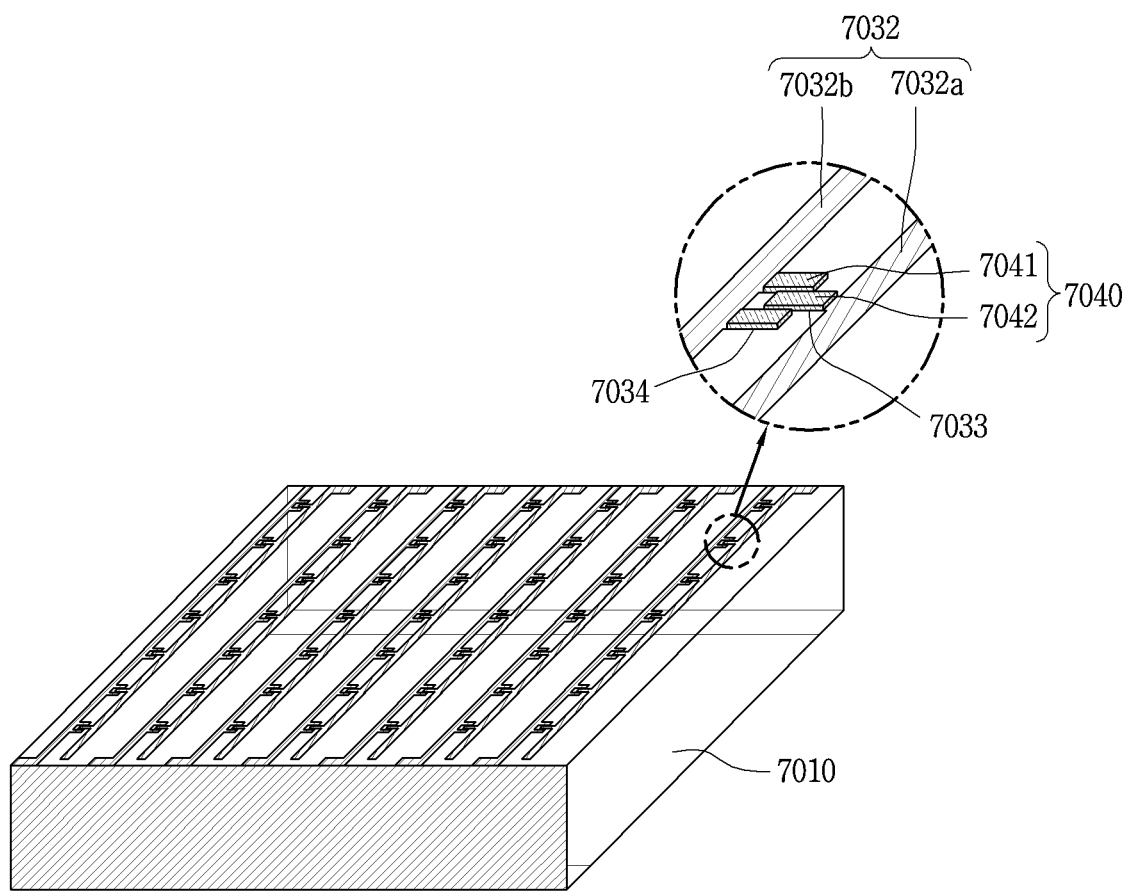

FIGS. 22 and 23 are a cross-sectional view and a perspective view illustrating another embodiment of a transfer head transferring a semiconductor light-emitting device of the present invention.

In the present embodiments, a case where a new structure is applied to the transfer head described above with reference to FIGS. 19A and 19B is described. Therefore, in the present embodiment, elements which are the same as or similar to the elements described above with reference to FIGS. 19A and 19B are referred to by like reference numerals, and the above descriptions are applied to descriptions of the elements.

Referring to the drawings, a transfer head 7000 includes a base substrate 7010, an electrode unit 7030, and a metal block unit 7040.

In this case, the base substrate 7010 may have the same structure as the base substrate described above with reference to FIGS. 19A and 19B, and the electrode unit 7030 may have the same structure as the electrode unit described above with reference to FIGS. 19A and 19B. Thus, the above descriptions are applied to descriptions of the elements.

In the present embodiment, a metal block unit 7040 may be coupled to each of first protrusion electrodes 7033 and second protrusion electrodes 7034.

The metal block unit 7040 may include a first metal block 7041 coupled to the first protrusion electrodes 7033 and a second metal block 7042 coupled to the second protrusion electrodes 7034. The first metal block 7041 and the second metal block 7042 may protrude from an end of the protrusion electrodes in a direction (a thickness direction) passing through one surface of the base substrate 7010.

In more detail, the metal block protrudes in a direction deviating from the base substrate 7010 to provide a contact point for picking up a specific semiconductor light-emitting device in a pickup process. The metal block may be formed of metal having light non-transmissivity.

The first metal block 7041 and the second metal block 7042 may each have a tetragonal block form where width× height is 50×50 µm and a thickness is 1 µm to 5 µm. According to illustration, the first metal block 7041 and the second metal block 7042 are exposed to the outside to contact the undoped semiconductor layer 1153a of the semiconductor light-emitting device. In more detail, each of the first metal block 7041 and the second metal block 7042 includes an upper surface or an exposure surface exposed to the outside at the top. The exposure surface may directly contact the undoped semiconductor layer 1153a of the semiconductor light-emitting device in order to pick up the semiconductor light-emitting device.

According to the above-described structure, the transfer head implements a high electrostatic force by directly electrifying an undoped semiconductor layer based on a Johnsen rahbek type, and moreover, transfers a semiconductor light-emitting device in a simple structure, based on a large area.

The present invention provides a mechanism which can align horizontality and step heights of pickup heads and a donor substrate may be aligned without using a sensor and a transfer mechanism. Therefore, there is an advantage where a large degree of freedom is individually provided to a plurality of pickup heads. Hereinafter, such a mechanism will be described.

Figure 24:
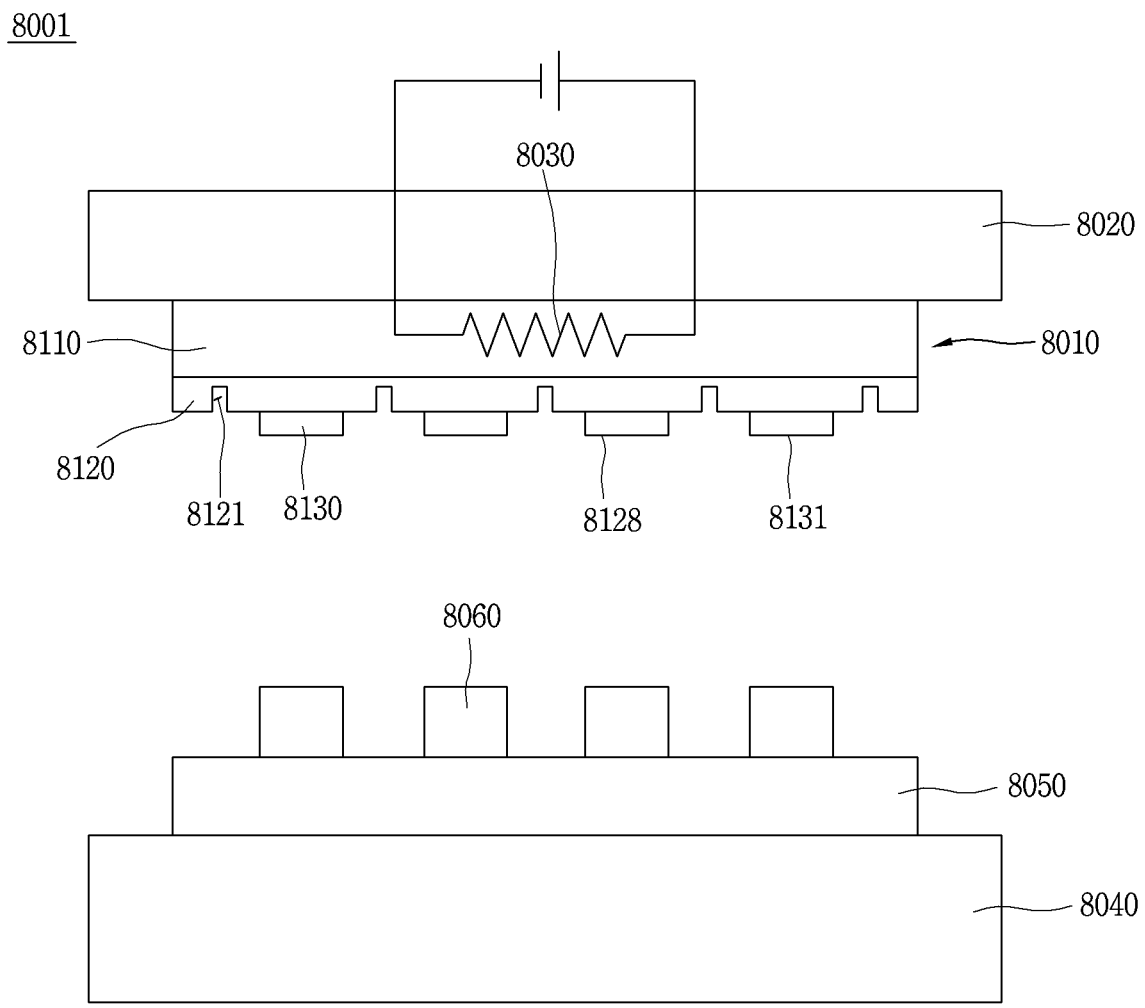
FIGS. 24 and 25 are a cross-sectional view and a plan view illustrating a micro-device transfer apparatus according to another embodiment of the present invention.
Figure 25:
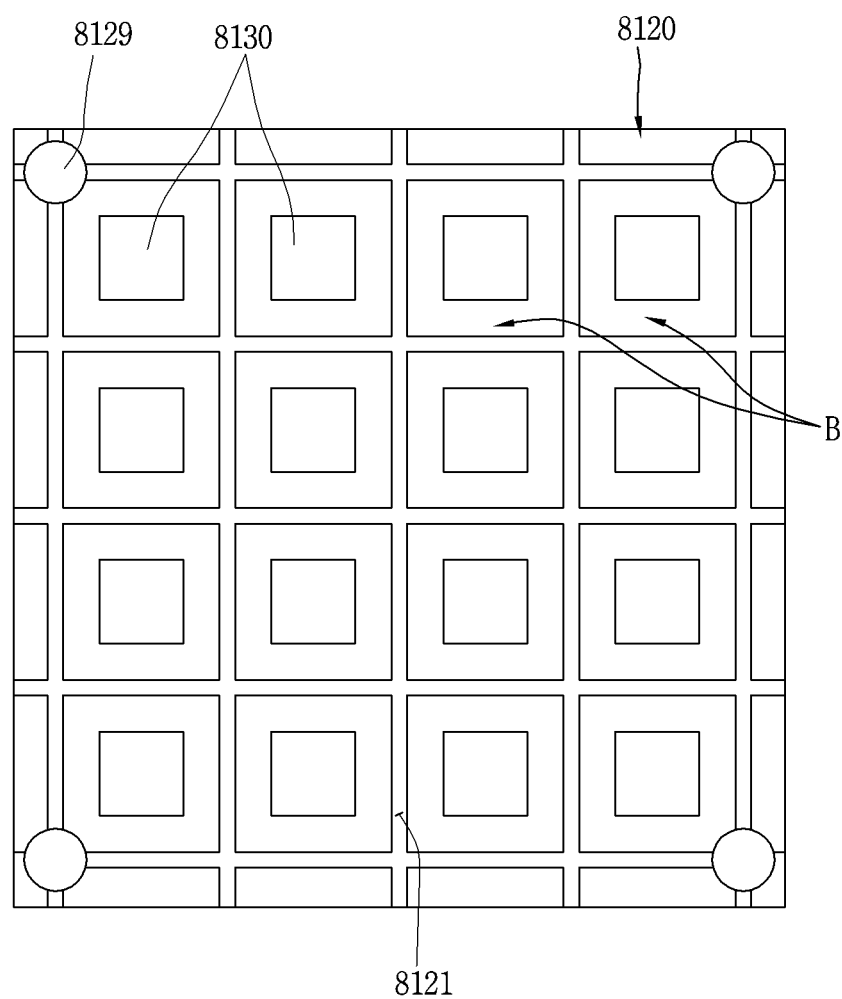

FIGS. 24 and 25 are a cross-sectional view and a plan view illustrating a micro-device transfer apparatus according to another embodiment of the present invention.

Referring to FIGS. 24 and 25, a micro-device transfer apparatus 8001 according to the present embodiment includes a transfer head 8010 of a micro-device 8060 and picks up and transfers a number of micro-devices 8060 by using the transfer head 8010 of the micro-device 8060. The micro-device may be the above-described semiconductor light-emitting device, and in more detail, may be a micro-LED.

Moreover, the micro-device transfer apparatus 8001 of the present embodiment includes a head transfer unit 8020, which fixes and transfers a transfer head 8010 of the micro-device 8060, and a substrate holder 8040 where a donor substrate on which the micro-device 8060 is disposed or a receiver substrate 8070 to which the micro-device 8060 is to be transferred is positioned.

In the specification, an up direction denotes an X-axis direction in a space coordinate system, and a down direction denotes a Y-axis direction in the space coordinate system. A horizontal surface denotes a Y-Z axis plane. A vertical direction is a direction including the up and down directions.

The donor substrate 8050 or the receiver substrate 8070, which supports the micro-device 8060, is positioned on a substrate holder 8040. The substrate holder 8040 may further include a heating element (not shown) for decoupling and coupling of the micro-device 8060.

The substrate holder 8040 includes a positioning surface by which the donor substrate 8050 or the receiver substrate 8070 is supported, and such one surface is flatly formed. Two the substrate holders 8040 may be installed. Therefore, one of the two substrate holders 8040 may support the donor substrate 8050, and the other may support the receiver substrate 8070.

The substrate holder 8040 may be moved on the Y-Z plane by at least two driving mechanisms (not shown) having a degree of freedom. The substrate holder 8040 moves on a horizontal surface and is aligned with the transfer head 8010 of the micro-device 8060.

In FIG. 24, it is illustrated that the donor substrate 8050 is supported by the substrate holder 8040, and a plurality of the micro-devices 8060 which are to be picked up by the transfer head 8010 of the micro-device 8060 is disposed on the donor substrate 8050.

The head transfer unit 8020 includes a mount surface (a lower surface in FIG. 24), and the transfer head 8010 of the micro-device 8060 is mounted on the mount surface. The mount surface of the head transfer unit 8020 is substantially flatly formed. The head transfer unit 8020 transfers the transfer head 8010 of the micro-device 8060.

In detail, the head transfer unit 8020 may be moved to the transfer head 8010 of the micro-device 8060 by at least six driving mechanisms (not shown) having a degree of freedom. In more detail, the head transfer unit 8020 reciprocates in X-axis, Y-axis, and Z-axis directions and rotates with the X-axis, Y-axis, and Z-axis directions as an axial direction. The transfer head 8010 of the micro-device 8060 is accurately disposed and aligned on the micro-device 8060 by a degree of freedom of the head transfer unit 8020.

Moreover, the head transfer unit 8020 may adjust a distance between the head transfer unit 8020 and the substrate holder 8040 and horizontality between the head transfer unit 8020 and the mount surface of the substrate holder 8040, based on input values input from various sensors. Each of the sensors provides a control feedback which helps adjustment of the substrate holder 8040.

Moreover, the transfer head 8010 of the micro-device 8060 may include a fixing means (not shown) which fixes a substrate 8110 and the donor substrate 8050. For example, the fixing means may include a vacuum sucker.

The transfer head 8010 of the micro-device 8060 picks up the micro-device 8060 disposed on the donor substrate 8050 supported by the substrate holder 8040 and transfers the micro-device 8060 to the receiver substrate 8070.

For example, the transfer head 8010 of the micro-device 8060 includes a plurality of pickup heads 8130 which pick up a plurality of the micro-devices 8060, a head holder 8120 which supports the plurality of pickup heads 8130, and the substrate 8110 which supports the head holder 8120.

The substrate 8110 provides the head holder 8120 with structural supporting. In the substrate 8110, a material having a support force and rigidity is selected. The substrate 8110 may be formed of various materials such as silicon, ceramic, and a polymer. In detail, the substrate 8110 is formed of a material which is different from or the same as that of the head holder 8120. The substrate 8110 has hardness which is greater than that of the head holder 8120. Here, a hardness of an arbitrary object is defined as a level of a resistance force to deformation of the object when the object is pressed by another object. Preferably, the substrate 8110 is formed of a rigid material.

A support surface (a lower surface) by which the head holder 8120 is supported is provided on one surface of the substrate 8110 in a plate shape.

The plurality of pickup heads 8130 pick up the micro-devices 8060 with an adhesive force. The plurality of pickup heads 8130 each include an adhesive surface 8131 to which the micro-device 8060 is adhered. The plurality of pickup heads 8130 may have an adhesive force with the micro-device 8060 for picking up the micro-device 8060 from the donor substrate 8050.

For example, a bonding material having an adhesive force may be coated on the adhesive surface 8131 of each of the plurality of pickup heads 8130. The adhesive force of the coated material is released by heat applied an outer side thereof.

As another example, as illustrated in FIG. 24, the plurality of pickup heads 8130 may be adhered to the micro-device 8060 by static electricity. Therefore, the micro-device transfer apparatus 8001 of an embodiment may further include a static electricity voltage source. As the static electricity voltage source is turned on/off, adhesion between the pickup head 8130 and the micro-device 8060 is maintained or released.

The plurality of pickup heads 8130 are arranged at certain pitches on a horizontal surface. In detail, the pitches of the plurality of pickup heads 8130 correspond to pitches of the plurality of micro-device 8060. That is, the pitches of the plurality of pickup heads 8130 match the pitches of the plurality of micro-device 8060, or are an integer multiple of the pitches of the plurality of micro-device 8060. In more detail, the plurality of pickup heads 8130 may be disposed in a plurality of rows on the horizontal surface.

The plurality of pickup heads 8130 may have various materials. For example, the plurality of pickup heads 8130 may include one of silicon, glass, and an elastic material. The plurality of pickup heads 8130 may have an elastic force and may move to some extent.

Preferably, a hardness of each of the plurality of pickup heads 8130 may have hardness which is greater than that of the head holder 8120.

The head holder 8120 structurally supports the plurality of pickup heads 8130. The head holder 8120 is located between the plurality of pickup heads 8130 and the substrate 8110 and couples the plurality of pickup heads 8130 to the substrate 8110.

A shape of the head holder 8120 is deformed by movements of the plurality of pickup heads 8130, and thus, the head holder 8120 provides the plurality of pickup heads 8130 with a degree of freedom. In order to pick up the micro-device 8060 disposed on the donor substrate 8050, approximate horizontality between the adhesive surface 8131 of each of the plurality of pickup heads 8130 and the donor substrate 8050 is adjusted by movements of the substrate holder 8040 and the head transfer unit 8020. However, there may locally be a step height in the donor substrate 8050, and there a case where there is the step height between the donor substrate 8050 and a top of the micro-device 8060, or the donor substrate 8050 and the adhesive surface 8131 of each of the plurality of pickup heads 8130 is not locally horizontal. In this case, the head holder 8120 provides the plurality of pickup heads 8130 with a degree of freedom, thereby enabling a plurality of the micro-devices 8060 to be efficiently picked up.

In detail, a level of each of the adhesive surfaces 8131 of the plurality of pickup heads 8130 is individually changed by deformation of the head holder 8120. Here, the level of each of the adhesive surfaces 8131 of the plurality of pickup heads 8130 denotes a relative position in a vertical direction.

Moreover, a horizontal angle of each of the adhesive surfaces 8131 of the plurality of pickup heads 8130 is individually changed by deformation of the head holder 8120. Here, the horizontal angle of each of the adhesive surfaces 8131 of the plurality of pickup heads 8130 denotes a slope between a horizontal surface and each of the adhesive surfaces 8131 of the plurality of pickup heads 8130.

The head holder 8120 provides a space where the plurality of pickup heads 8130 are located. In detail, the head holder 8120 is a plate shape including a support surface 8128 supporting the plurality of pickup heads 8130 on the horizontal surface. It is preferable that the support surface 8128 of the head holder 8120 is flatly formed. The support surface 8128 of the head holder 8120 is disposed parallel with the horizontal surface before deformation. Each of the adhesive surfaces 8131 of the plurality of pickup heads 8130 is disposed and spaced apart from the support surface 8128 of the head holder 8120.

A shape of the head holder 8120 is deformed by an external force, and when the external force is released, the shape of the head holder 8120 is restored. The head holder 8120 has an elastic restoring force. In detail, the head holder 8120 has at least flexibility in a vertical direction.

For example, the head holder 8120 uses a material which is softer than that of the substrate 8110 and/or the plurality of pickup heads 8130. In detail, the head holder 8120 has hardness which is less than that of the substrate 8110 and/or each of the plurality of pickup heads 8130. In detail, the head holder 8120 is a resin material having an elastic force. Preferably, the head holder 8120 may be silicon (sylgard 184) having an elastic force.

Moreover, at least one of a hollow portion 8124, a hole, and a groove 8121 which facilitate a movement of the head holder 8120 may be provided in the head holder 8120. A degree of freedom of each of the plurality of pickup heads 8130 increases by the hollow portion 8124, the hole, and the groove 8121.

In detail, as illustrated in FIG. 24, the groove 8121 which is deformed when the shape of the head holder 8120 is deformed is provided in the head holder 8120.

The groove 8121 is formed by recessing the support surface 8128 of the head holder 8120. A depth of the groove 8121 is not limited, but it is preferable that the depth of the groove 8121 is 20% to 80% of a thickness of the head holder 8120. A width of the groove 8121 is proportional to a degree of freedom of each of the plurality of pickup heads 8130. The width of the groove 8121 is set based the degree of freedom of each of the plurality of pickup heads 8130. When the plurality of pickup heads 8130 move, the head holder 8120 is compressed by an external force and gets close to the groove 8121. Therefore, a change rate or flexibility in a vertical direction is enhanced by the groove 8121 provided in the head holder 8120.

The groove 8121 may be variously disposed. For example, the groove 8121 is provided in plurality, and the plurality of grooves 8121 are disposed in a dot shape on the support surface 8128 of the head holder 8120. The dot-shaped grooves are regularly arranged. Also, the dot-shaped grooves may be disposed in a line shape.

As another example, the support surface 8128 of the head holder 8120 is divided into a plurality of holder blocks B by the groove 8121. At least one pickup head 8130 is supported in the holder block B. Preferably, one to four pickup heads 8130 are supported in one holder block B. The support surface 8128 of the head holder 8120 is divided into the plurality of holder blocks B, and a small number of pickup heads 8130 are located in the holder block B, thereby enhancing a degree of individual freedom of the pickup head 8130.

Moreover, a position determination unit 8129 which determines a position of the donor substrate 8050 is provided in the head holder 8120.

Figure 27:
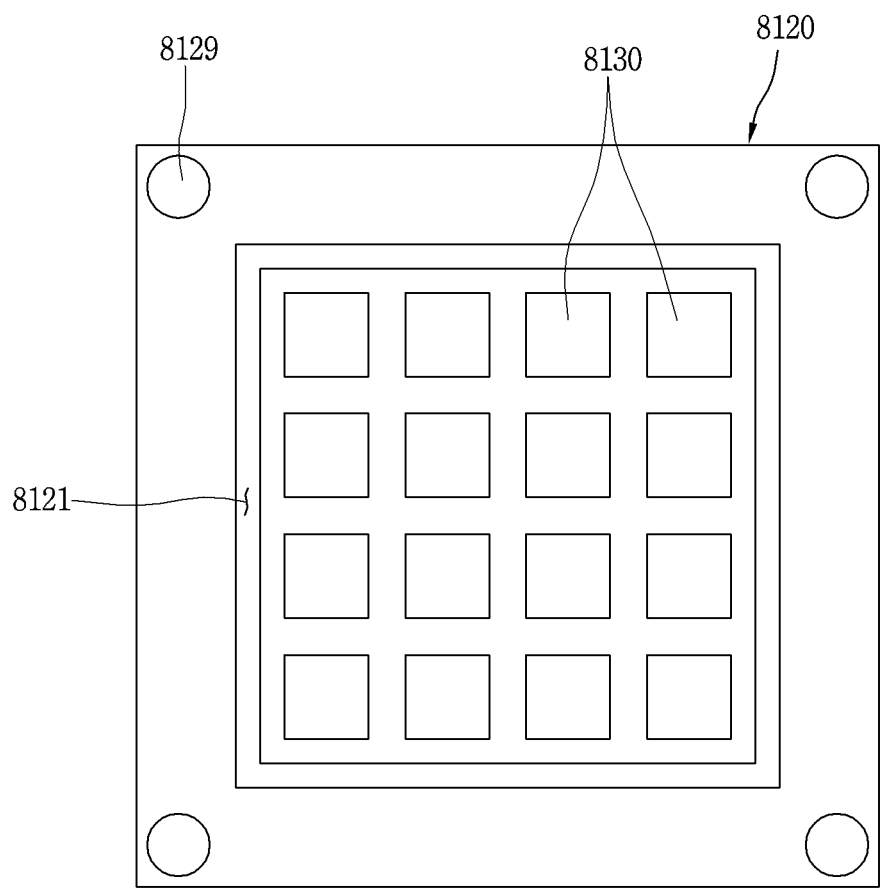

FIGS. 26 and 27 are a cross-sectional view and a plan view of a transfer head of a micro-device according to another embodiment of the present invention.

A transfer head 8010 of a micro-device 8060 according to the present embodiment has a difference in disposition of a groove 8121 in comparison with the embodiment of FIGS. 24 and 25.

Referring to FIGS. 26 and 27, the groove 8121 of the present embodiment has a line shape which forms a closed space on the support surface of 8128 of the head holder 8120. A plurality of pickup heads 8130 are located in the closed space formed by the groove 8121.

In the present embodiment, a degree of freedom of each of the plurality of pickup heads 8130 is lower than the embodiment of FIGS. 24 and 25, but there is an advantage where manufacturing is easy.

FIG. 28A is a cross-sectional view of a transfer head of a micro-device according to another embodiment of the present invention, and FIG. 28B is a plan view.

In the present embodiment, in comparison with the embodiment of FIGS. 24 and 25, the head holder 8120 includes a through hole 8122 instead of the groove 8121, for enhancing flexibility.

Referring to FIG. 28, a head holder 8120 of a third embodiment includes a through hole 8122 for enhancing flexibility. The through hole 8122 is formed in a support surface 8128 of the head holder 8120. In detail, the through hole 8122 is formed to pass through the head holder 8120 in a direction intersecting the support surface 8128 of the head holder 8120.

For example, as illustrated in FIG. 28, the through hole 8122 is provided in plurality, and the plurality of through holes 8122 are disposed in a line shape in the support surface 8128 of the head holder 8120. The line-shaped through holes 8122 are arranged at certain pitches. The line-shaped through holes 8122 may have a matrix type intersecting one another.

Preferably, the head holder 8120 includes a plurality of holder blocks B which are disposed on a horizontal surface and are spaced apart from each other. The plurality of holder blocks B may be defined by the line-shaped through hole 8122.

At least one pickup head 8130 is supported in the holder block B. Preferably, one to four pickup heads 8130 are supported in one holder block B. The head holder 8120 is divided into the plurality of holder blocks B, and a small number of pickup heads 8130 are located in the holder block B, thereby enhancing a degree of individual freedom of the pickup head 8130.

FIG. 29 is a cross-sectional view of a transfer head of a micro-device according to another embodiment of the present invention.

Referring to FIG. 29, in comparison with the embodiment of FIG. 28, a head holder 8120 of the present embodiment has a difference in shape of a through hole 8123.

The through hole 8123 of the present embodiment is provided in plurality, and the plurality of through holes 8123 are disposed in a dot shape on a support surface 8128 of the head holder 8120. The through hole 8123 passes through the head holder 8120 in a direction intersecting the support surface. The dot-shaped through holes 8123 are regularly arranged. Also, the dot-shaped through holes 8123 may be disposed in a line shape. A shape of each of the dot-shaped through holes 8123 is deformed by external pressure and provides flexibility to the head holder 8120.

Figure 30:
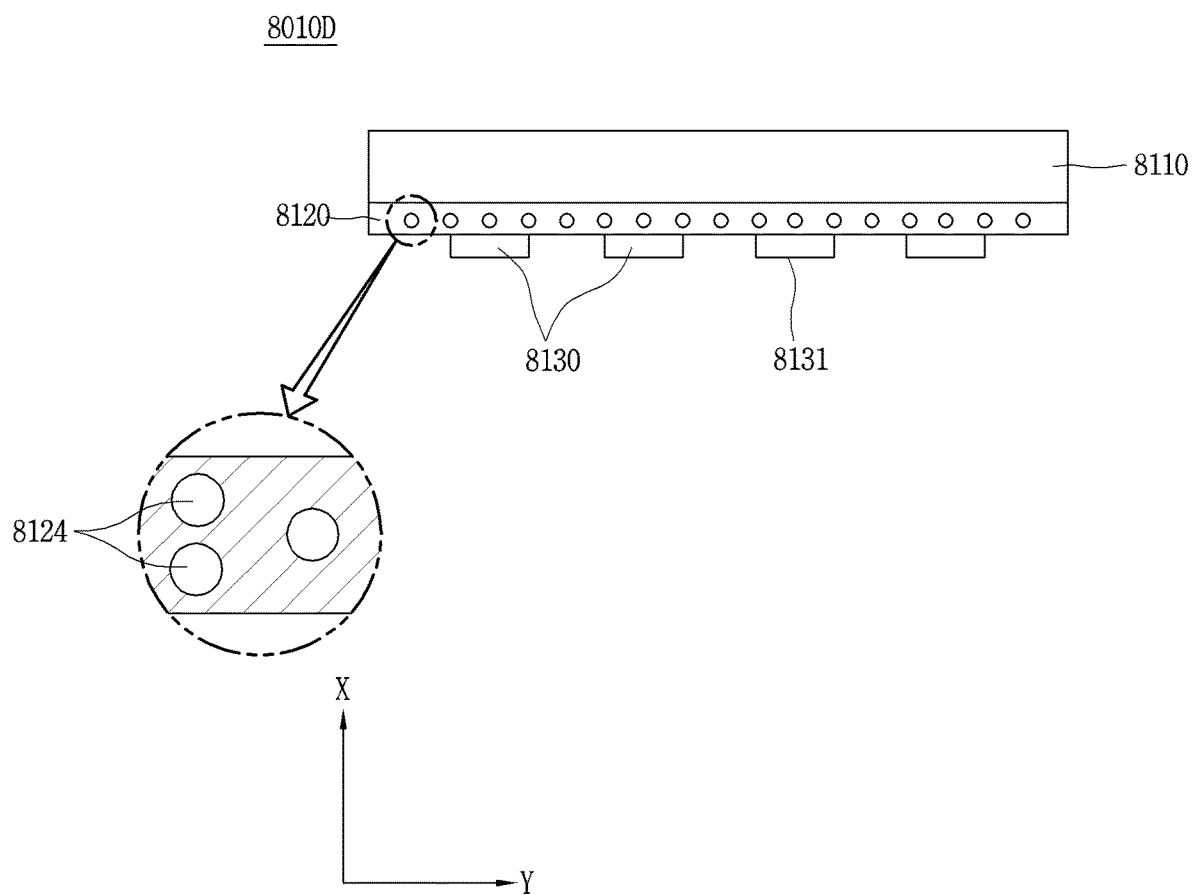
FIG. 30 is a cross-sectional view of a transfer head of a micro-device according to another embodiment of the present invention.

FIG. 30 is a cross-sectional view of a transfer head of a micro-device according to another embodiment of the present invention.

Referring to FIG. 30, in comparison with the embodiment of FIGS. 24 and 25, a head holder 8120 of the present embodiment includes a plurality of hollow portions 8124 instead of the groove 8121.

The hollow portions 8124 are located in the head holder 8120. The hollow portions 8124 are regularly or irregularly disposed in the head holder 8120. When a shape of the head holder 8120 is deformed, the hollow portion 8124 is deformed and provides flexibility to the head holder 8120. Accordingly, a degree of freedom of each of a plurality of the pickup heads 8130 increases.

A size of the hollow portion 8124 is not limited. It is preferable that a diameter of the hollow portion 8124 is 10% to 40% of a thickness of the head holder 8120. This is because if a size of the hollow portion 8124 is too large, a rigidity of the head holder 8120 is reduced, and if the size of the hollow portion 8124 is too small, sufficient flexibility cannot be provided to the head holder 8120.

Figure 31:
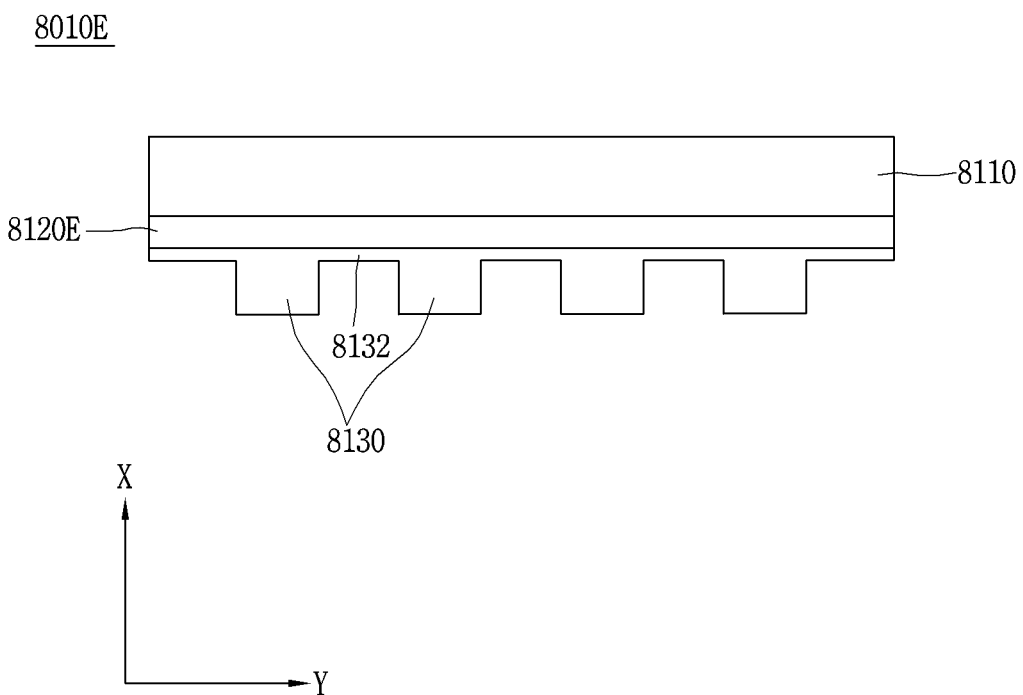
FIG. 31 is a cross-sectional view of a transfer head of a micro-device according to another embodiment of the present invention.

FIG. 31 is a cross-sectional view of a transfer head of a micro-device according to another embodiment of the present invention.

Referring to FIG. 31, in comparison with the embodiment of FIGS. 24 and 25, the present embodiment has a difference where a groove 8121 is omitted in a head holder 8120, and the head holder 8120 further includes a head base 8132.

The head base 8132 provides a space where a plurality of pickup heads 8130 are located. In detail, the head base 8132 is a plate shape including a support surface supporting the plurality of pickup heads 8130 on a horizontal surface. It is preferable that the support surface of the head base 8132 is flatly formed. The support surface of the head base 8132 is disposed parallel with the horizontal surface before deformation. A mount surface of each of the plurality of pickup heads 8130 is disposed and spaced apart from the support surface of the head base 8132. The head base 8132 is disposed between the head holder 8120 and the pickup heads 8130. The head base 8132 is supported by the head holder 8120.

A shape of the head base 8132 is deformed by an external force, and when the external force is released, the shape of the head base 8132 is restored. The head base 8132 has an elastic restoring force. In detail, the head base 8132 has at least flexibility in a vertical direction.

For example, the head base 8132 uses a material which is softer than that of a substrate 8110 and/or the plurality of pickup heads 8130. In detail, the head base 8132 has hardness which is less than that of the substrate 8110. The head base 8132 has hardness which is less than that of each of the plurality of pickup heads 8130. In detail, the head base 8132 is a resin material having an elastic force. Preferably, the head base 8132 may be silicon (sylgard 184) having an elastic force. In this case, the head holder 8120 has hardness which is higher than that of head base 8132, or may have the same hardness.

A thickness of the head base 8132 is not limited. Preferably, the thickness of the head base 8132 is 100 μm to 300 μm. The head base 8132 may be provided as one body with the head holder 8120 or independently from the head holder 8120.

FIG. 32 is a flowchart illustrating a state where a micro-device transfer apparatus of the present invention operates.

Referring to FIG. 32A, a donor substrate 8050 on which a plurality of micro-devices 8060 are arranged is supported by a substrate holder 8040. A head transfer unit 8020 and the substrate holder 8040 are adjusted based on input values input from various sensors so that a top of the donor substrate 8050 is substantially parallel with a support surface 8128 of a head holder 8120. However, a local portion of the donor substrate 8050 is not parallel with a support surface 8128 of the head holder 8120, or a local step height may be on a top of each of the micro-devices 8060.

Figure 32B:
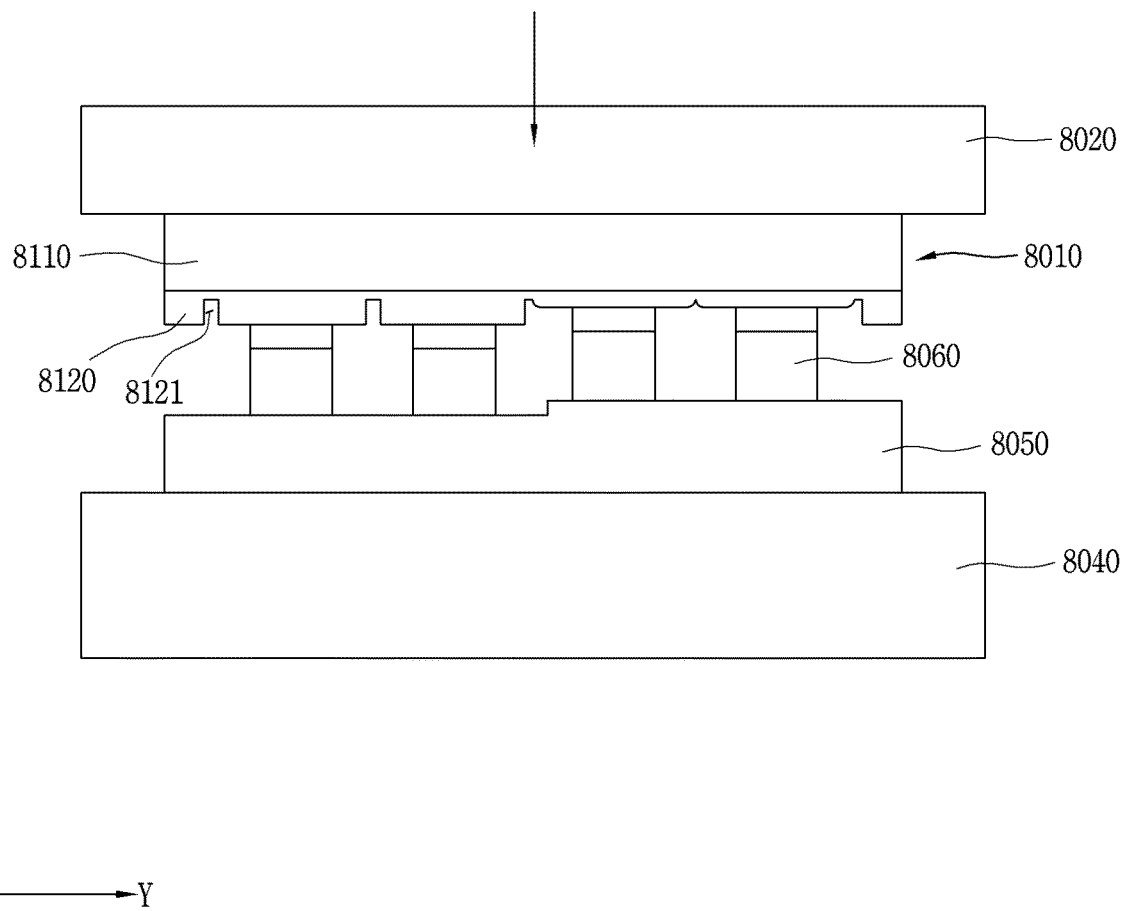

Referring to FIG. 32B, a transfer head 8010 is downward moved by the head transfer unit 8020, and the micro-devices 8060 are adhered to an adhesive surface 8131 of each of the pickup heads 8130. In this case, a pickup head 8130 which picks up a micro-device 8060 protruding more upward than another micro-device 8060 is automatically leveled by deformation of a head holder 8120 (a holder block B).

Figure 32C:
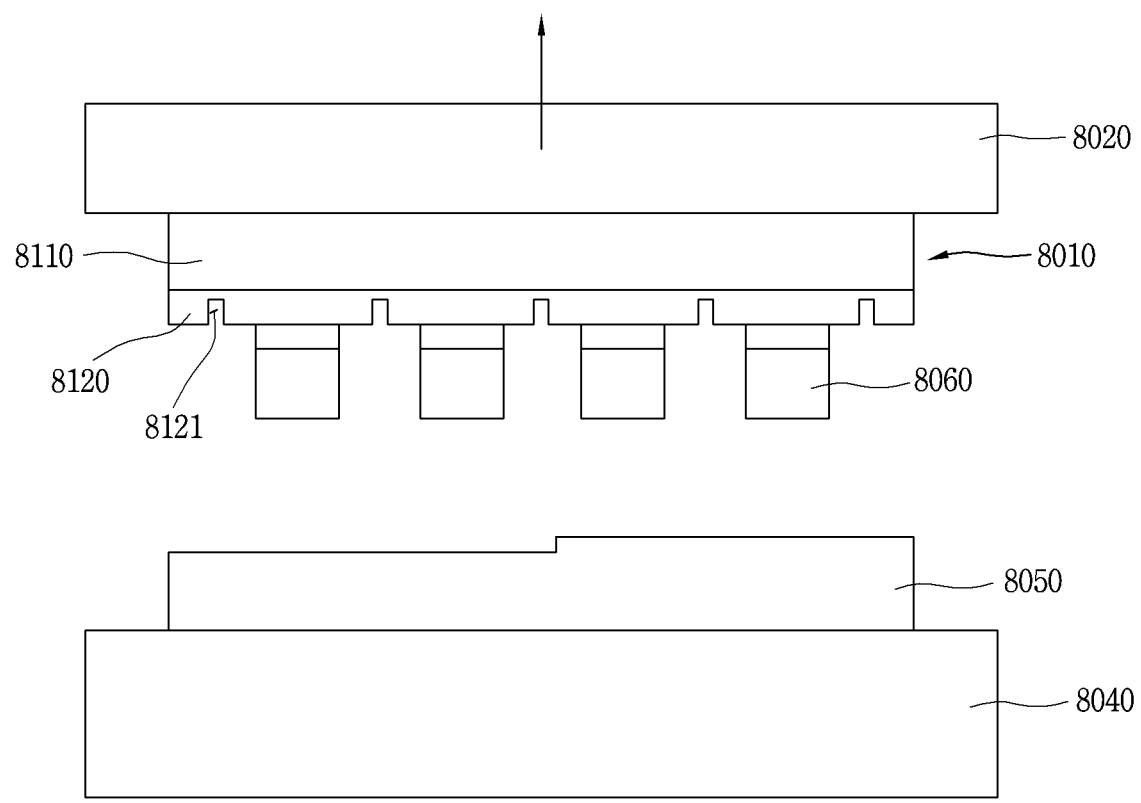

Referring to FIG. 32C, the transfer head 8010 is upward moved, and the micro-devices 8060 deviate from the donor substrate 8050.

Referring to FIG. 32D, a receiver substrate 8070 is supported on the substrate holder 8040, and the head transfer unit 8020 and the substrate holder 8040 move to adjust horizontality. The transfer head 8010 is downward moved by the head transfer unit 8020.

Figure 32E:
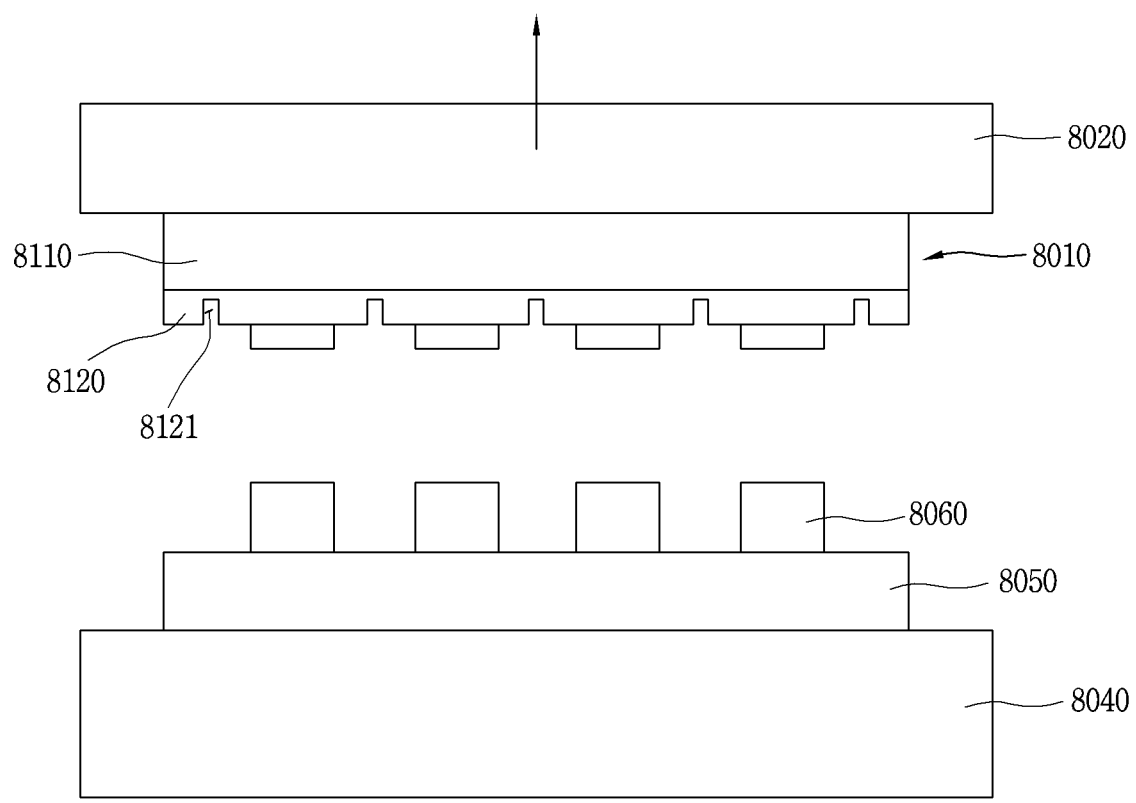

Referring to FIG. 32E, the micro-device 8060 is positioned on the receiver substrate 8070, and then, an adhesive force of the pickup head 8130 is released. By applying a thermal factor and a chemical factor to the receiver substrate 8070, the micro-device 8060 is adhered to the receiver substrate 8070.

Accordingly, a plurality of micro-LEDs can be quickly and accurately arranged on a large-area receiver substrate 8070.

Figure 34:
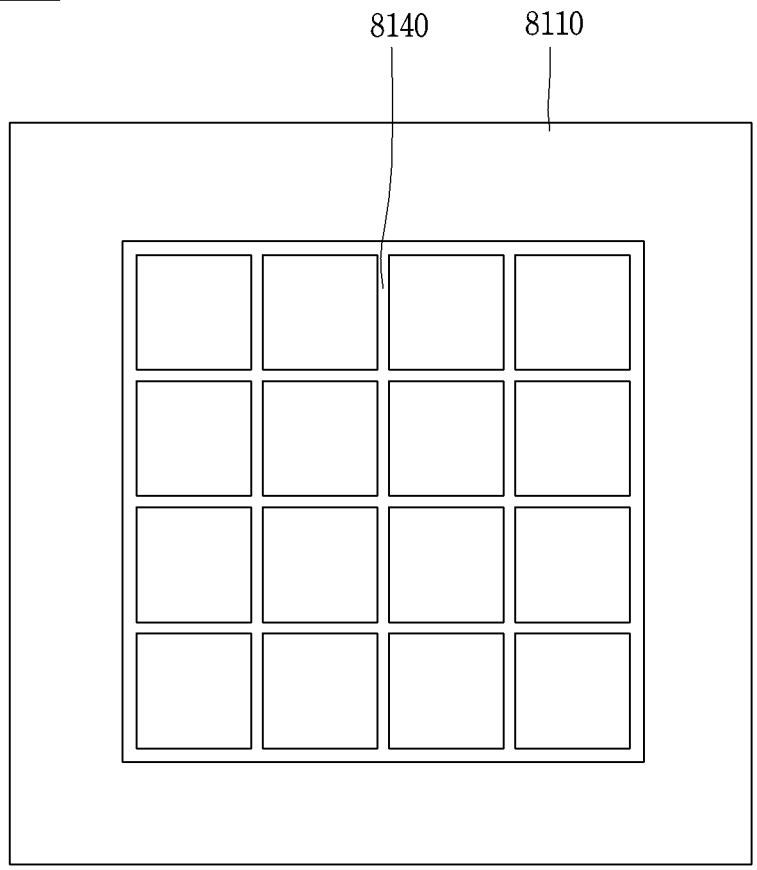

FIGS. 33 and 34 are a cross-sectional view and a plan view of a transfer head of a micro-device according to another embodiment of the present invention.

Referring to FIG. 33, in comparison with the embodiment of FIGS. 24 and 25, the present embodiment has a difference where a groove 8121 is omitted in a head holder 8220, and a spacer 8140 is further provided between the head holder 8220 and a substrate 8110.

In the present embodiment, the head holder 8220 is formed in a plat shape and supports a plurality of pickup heads 8130. In this case, a head holder 8220 of a seventh embodiment may use material which is higher than that of the head holder 8220 of the preceding embodiment. For example, the head holder 8220 of an embodiment uses a resin material having flexibility.

The spacer 8140 structurally supports the head holder 8220. The spacer 8140 is located between the head holder 8220 and the substrate 8110. The spacer 8140 is located in a portion of a space between the head holder 8220 and the substrate 8110.

A shape of the spacer 8140 is deformed by a movement of each of a plurality of pickup heads 8130, and thus, the spacer 8140 provides a degree of freedom to the head holder 8220. When the spacer 8140 is deformed, a slope and a curvature of the head holder 8220 are deformed, thereby providing a degree of freedom to the pickup head 8130.

In detail, a level of each of adhesive surfaces 8131 of the plurality of pickup heads 8130 is individually changed by deformation of the spacer 8140. Also, a horizontal angle of each of the adhesive surfaces 8131 of the plurality of pickup heads 8130 is individually changed by deformation of the spacer 8140.

For example, the spacer 8140 uses a material which is softer than that of a substrate 8110 and/or the head holder 8220. In detail, the spacer 8140 has hardness which is less than that of the substrate 8110. The spacer 8140 has hardness which is less than that of the head holder 8220. In detail, the spacer 8140 is a resin material having an elastic force. Preferably, the spacer 8140 may be silicon (sylgard 184) having an elastic force.

One side of the spacer 8140 is supported by the substrate 8110, and the other side of the spacer 8140 supports the head holder 8220. The spacer 8140 forms a gap between the head holder 8220 and the substrate 8110, and the spacer 8140 is disposed in a partial region of a space between the head holder 8220 and the substrate 8110.

In detail, the spacer 8140 is disposed on a support surface of the substrate 8110 and is spaced apart from the substrate 8110 by a certain pitch. The spacer 8140 may be variously disposed. For example, as illustrated in FIG. 34, the spacer 8140 is provided in plurality, and the plurality of spacers 8140 are disposed in a line shape in the support surface of the substrate 8110. The line-shaped spacers 8140 are arranged at certain pitches. The line-shaped spacers 8140 may have a matrix type intersecting one another.

Figure 36:
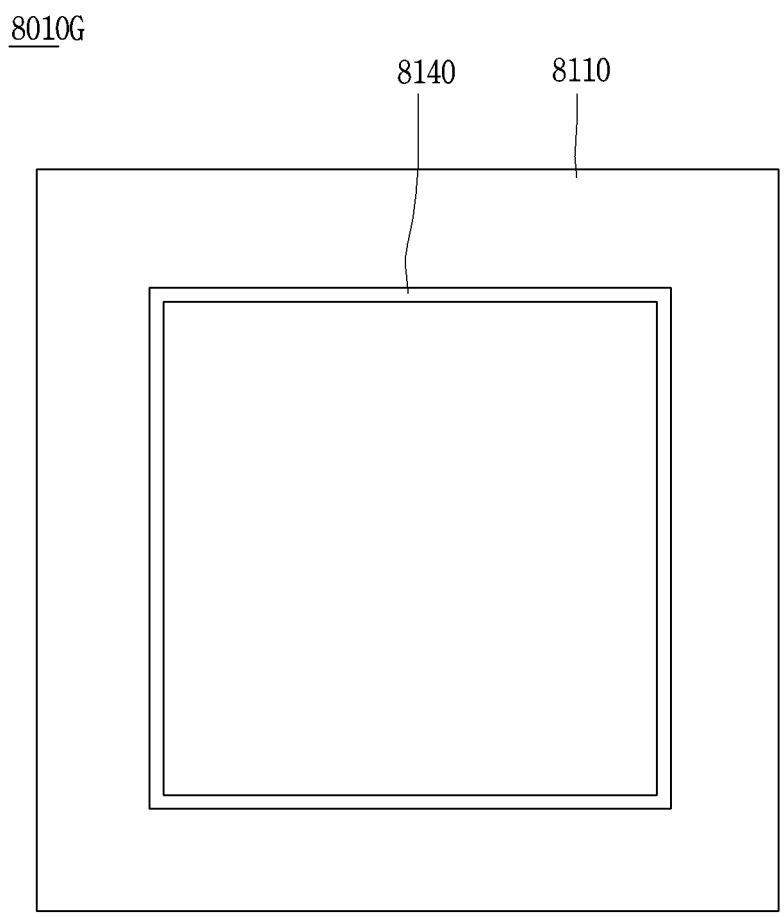

FIGS. 35 and 36 are a cross-sectional view and a plan view of a transfer head of a micro-device according to another embodiment of the present invention.

Referring to FIGS. 35 and 36, in comparison with the embodiment of FIGS. 33 and 34, the present embodiment has a difference in disposition of a spacer 8140.

The spacer 8140 of the present embodiment is disposed to surround a border of a head holder 8220. A plurality of pickup heads 8130 are disposed to overlap the inside of a space formed by the spacer 8140. Accordingly, in an embodiment, a higher degree of freedom can be provided to the pickup heads 8130.

Figure 37:
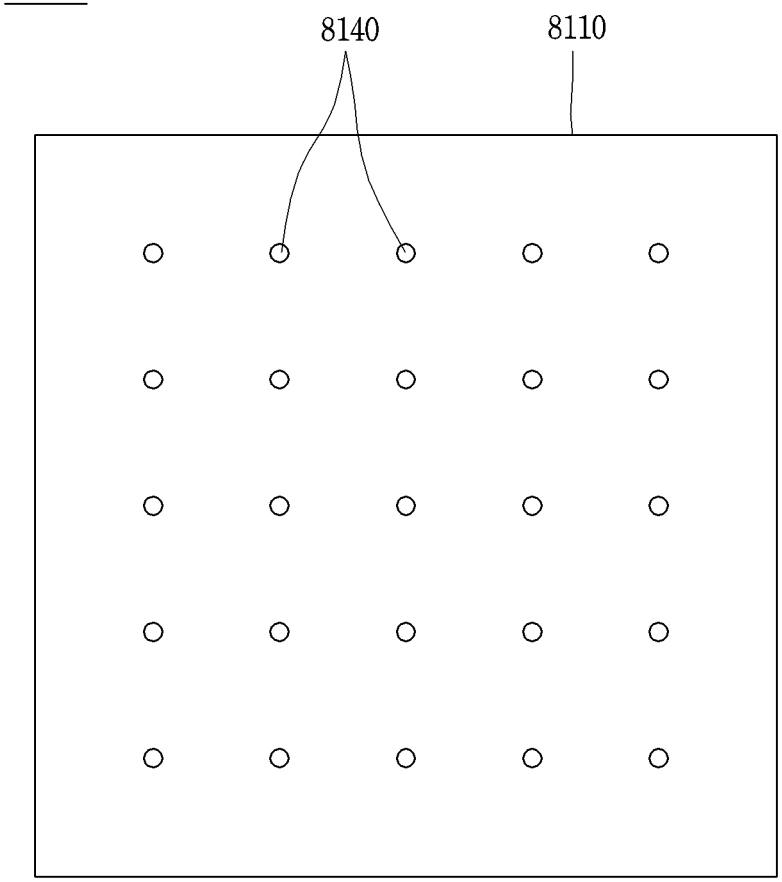
FIG. 37 is a plan view of a transfer head of a micro-device according to another embodiment of the present invention.

FIG. 37 is a plan view of a transfer head of a micro-device according to another embodiment of the present invention.

Referring to FIG. 37, in comparison with the embodiment of FIGS. 33 and 34, the present embodiment has a difference in disposition of a spacer 8140.

The spacer 8140 of the present embodiment is provided in plurality, and the plurality of spacers 8140 are disposed in a dot shape on a support surface of the substrate 8110. The dot-shaped spacers 8140 are regularly arranged. Also, the dot-shaped spacers 8140 may be disposed in a line shape or a matrix type.

FIG. 38 is a flowchart illustrating a state where a micro-device transfer apparatus of the present invention operates.

Figure 38A:
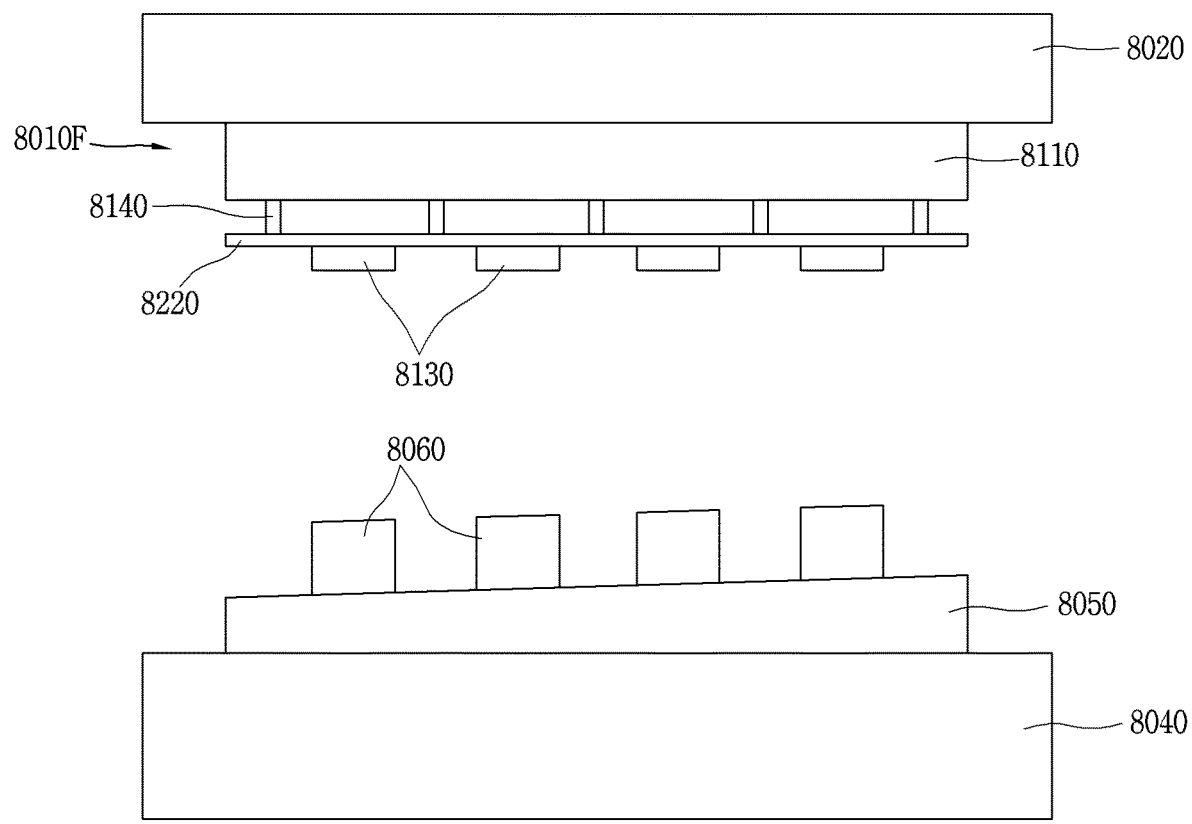
FIGS. 38A to 38C are flowcharts illustrating a state where a micro-device transfer apparatus of the present invention operates.

Referring to FIG. 38A, a donor substrate 8050 on which a plurality of micro-devices 8060 are arranged is supported by a substrate holder 8040. A head transfer unit 8020 and the substrate holder 8040 are adjusted based on input values input from various sensors so that a top of the donor substrate 8050 is substantially parallel with a support surface 8128 of a head holder 8120. However, a local portion of the donor substrate 8050 may not be parallel with a support surface 8128 of the head holder 8120.

Figure 38B:
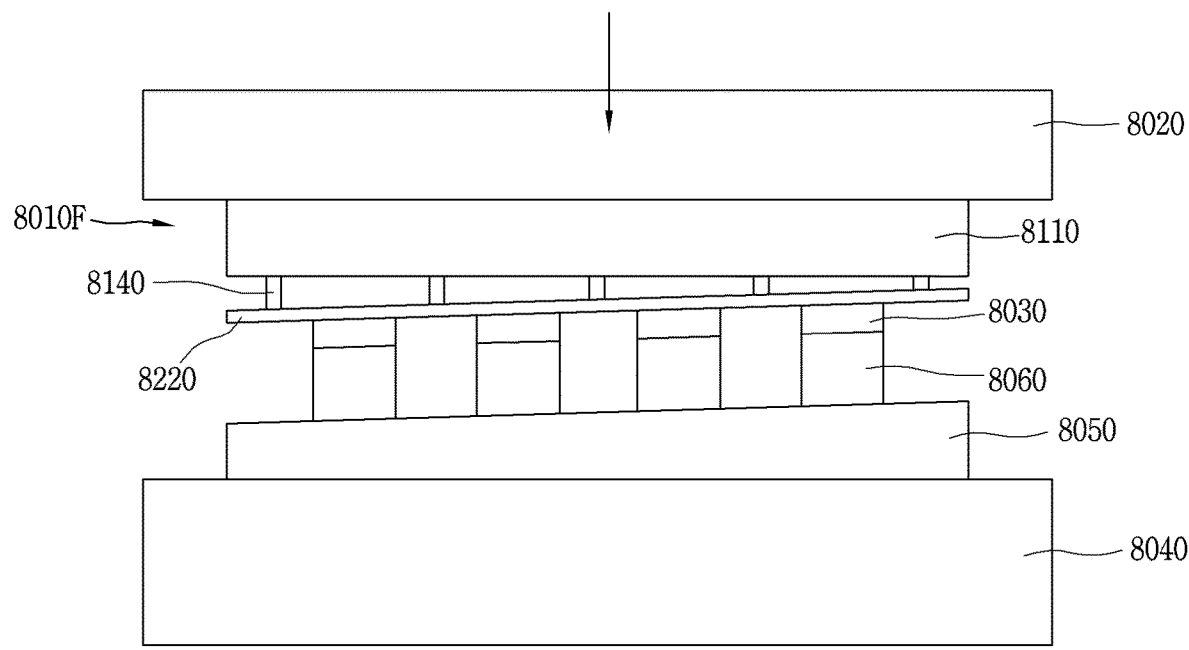

Referring to FIG. 38B, a transfer head 8010 is downward moved by the head transfer unit 8020, and the micro-devices 8060 are adhered to an adhesive surface 8131 of each of the pickup heads 8130. At this time, a spacer 8140 is deformed, and the head holder 8220 is inclined to correspond to a slope of the donor substrate 8050.

Figure 38C:
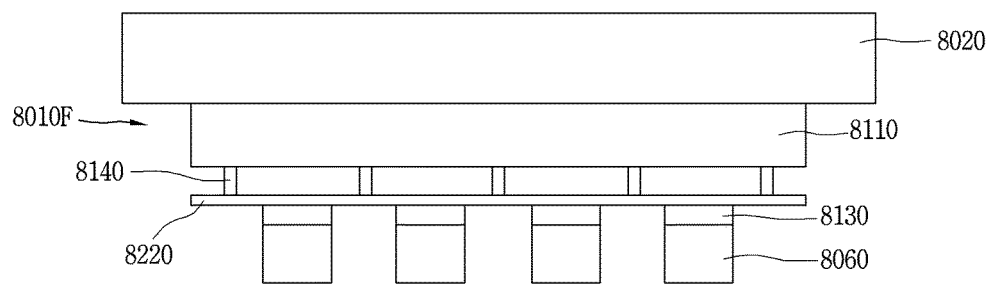

Referring to FIG. 38C, the transfer head 8010 is upward moved, and the micro-devices 8060 deviate from the donor substrate 8050. Subsequently, the micro-device 8060 is positioned on a receiver substrate 8070, and then, an adhesive force of the pickup head 8130 is released.

The display device using the semiconductor light-emitting device described above is not limited to the configuration and method of the embodiments described above, and all or some of the embodiments may be selectively combined and configured so that the embodiments are variously modified.

The invention claimed is:

1. A transfer head of a semiconductor light-emitting device, the transfer head comprising:
    a base substrate; and
    an electrode unit disposed on the base substrate to generate an electrostatic force by electrifying an undoped semiconductor layer of the semiconductor light-emitting device,
    wherein the base substrate and the electrode unit are each provided to have light transmissivity so that at least a portion of the semiconductor light-emitting device is visible by sequentially passing through the base substrate and the electrode unit.

2. The transfer head of claim 1, wherein a protrusion protrudes from one surface of the base substrate, and the electrode unit is disposed in the protrusion.

3. The transfer head of claim 1, wherein the electrode unit is externally exposed to contact the undoped semiconductor layer.

4. The transfer head of claim 1, further comprising a metal block unit disposed in one end of the electrode unit.

5. The transfer head of claim 4, wherein the electrode unit comprises a first electrode and a second electrode spaced apart from each other, and the metal block unit comprises a first metal block disposed in an end of the first electrode and a second metal block disposed in an end of the second electrode.

6. The transfer head of claim 5, wherein the first metal block and the second metal block are formed of metal having light non-transmissivity.

7. The transfer head of claim 4, wherein the electrode unit is disposed on one surface of the base substrate, and the metal block protrudes from an end of the electrode unit in a direction passing through one surface of the base substrate.

8. The transfer head of claim 1, wherein a via hole electrically connected to the electrode unit is provided in the base substrate.

9. The transfer head of claim 1, wherein the electrode unit comprises a plurality of electrodes sequentially disposed at predetermined intervals on one surface of the base substrate.

10. A method of transferring a semiconductor light-emitting device including an undoped semiconductor layer disposed on a carrier substrate, the method comprising:
bringing a transfer head, including a base substrate and an electrode unit disposed on the base substrate, in adjacency to an undoped semiconductor layer of the semiconductor light-emitting device;
applying a voltage to the electrode unit in order for an adhesive force to be applied to the undoped semiconductor layer with an electrostatic force; and picking up, by the transfer head, the semiconductor light-emitting device to transfer the semiconductor light-emitting device,
wherein in the bringing of the transfer head in adjacency to the undoped semiconductor layer, the base substrate and the electrode unit are each provided to have light transmissivity so that the transfer head and the semiconductor light-emitting device are aligned.

11. A transfer head of a semiconductor light-emitting device, the transfer head comprising:
a base substrate including a plane; and
an electrode unit disposed on the plane of the base substrate to generate an electrostatic force by electrifying an undoped semiconductor layer of the semiconductor light-emitting device, the electrode unit including a first electrode lead and a second electrode lead disposed in parallel,
wherein a plurality of protrusion electrodes are provided in each of the first electrode lead and the second electrode lead to selectively pick up a plurality of semiconductor light-emitting devices with the electrostatic force.

12. The transfer head of claim 11, wherein a plurality of first protrusion electrodes are sequentially arranged at predetermined intervals in the first electrode lead, and a plurality of second protrusion electrodes are sequentially arranged at predetermined intervals in the second electrode lead.

13. The transfer head of claim 12, wherein the first protrusion electrodes protrude from the first electrode lead to the second electrode lead, and the second protrusion electrodes protrude from the second electrode lead to the first electrode lead.

14. The transfer head of claim 13, wherein a metal block unit is coupled to the first protrusion electrodes and the second protrusion electrodes.

15. The transfer head of claim 11, wherein the first electrode lead and the second electrode lead each extend in one direction on the plane and are sequentially disposed in another direction vertical to the one direction.

16. The transfer head of claim 15, wherein at least one of the first electrode lead and the second electrode lead extends to a side surface of the base substrate.

17. The transfer head of claim 11, wherein each of the first electrode lead and the second electrode lead is a metal thin film including at least one of Au, Ti, Pt, Ni, Cu, and Ag, or is a transparent thin film including at least one of InSnO and ZnO.

18. The transfer head of claim 11, wherein the base substrate is formed of a light-transmitting material.

19. A transfer system for transferring a semiconductor light-emitting device disposed on a carrier substrate by using a transfer head, the transfer head comprising:
a base substrate including a plane; and
an electrode unit disposed on the plane of the base substrate to generate an electrostatic force by electrifying an undoped semiconductor layer of the semiconductor light-emitting device, the electrode unit including a first electrode lead and a second electrode lead disposed in parallel,
wherein a plurality of protrusion electrodes are provided in each of the first electrode lead and the second electrode lead to selectively pick up a plurality of semiconductor light-emitting devices with the electrostatic force.

20. The transfer system of claim 19, wherein a positioning member where the semiconductor light-emitting device is positioned is mounted on one surface of the carrier substrate.

21. The transfer system of claim 20, wherein the positioning member comprises: a base part overlapping the one surface of the carrier substrate; and a plurality of positioning projections protruding from the base part, the plurality of positioning projections being sequentially arranged at predetermined intervals.

* * * * *